United States Patent
George et al.

(10) Patent No.: US 10,381,227 B2
(45) Date of Patent: Aug. 13, 2019

(54) METHODS OF ATOMIC LAYER ETCHING (ALE) USING SEQUENTIAL, SELF-LIMITING THERMAL REACTIONS

(71) Applicant: THE REGENTS OF THE UNIVERSITY OF COLORADO, A BODY CORPORATE, Denver, CO (US)

(72) Inventors: Steven M. George, Boulder, CO (US); Younghee Lee, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 15/534,215

(22) PCT Filed: Dec. 18, 2015

(86) PCT No.: PCT/US2015/066789
§ 371 (c)(1),
(2) Date: Jun. 8, 2017

(87) PCT Pub. No.: WO2016/100873
PCT Pub. Date: Jun. 23, 2016

(65) Prior Publication Data
US 2017/0365478 A1    Dec. 21, 2017

Related U.S. Application Data

(60) Provisional application No. 62/093,595, filed on Dec. 18, 2014, provisional application No. 62/154,994, filed on Apr. 30, 2015.

(51) Int. Cl.
*H01L 21/28*    (2006.01)
*C23F 1/12*    (2006.01)
(Continued)

(52) U.S. Cl.
CPC .......... *H01L 21/28185* (2013.01); *C23F 1/12* (2013.01); *H01L 21/30621* (2013.01);
(Continued)

(58) Field of Classification Search
CPC ......... H01L 21/28185; H01L 21/32135; H01L 21/67069; H01L 21/67253; H01L 29/517
See application file for complete search history.

(56) References Cited

U.S. PATENT DOCUMENTS

| 5,368,687 A | 11/1994 | Sandhu et al. |
| 5,389,196 A | 2/1995 | Bloomstein et al. |

(Continued)

OTHER PUBLICATIONS

International Search Report dated Feb. 25, 2016 for PCT International Application No. PCT/US2015/066789.

*Primary Examiner* — Duy Vu N Deo
(74) *Attorney, Agent, or Firm* — Saul Ewing Arnstein & Lehr LLP; Kathryn Doyle; Domingos J. Silva

(57) ABSTRACT

The invention includes a method of promoting atomic layer etching (ALE) of a surface. In certain embodiments, the method comprises sequential reactions with a metal precursor and a halogen-containing gas. The invention provides a solid substrate obtained according to any of the methods of the invention. The invention further provides a porous substrate obtained according to any of the methods of the invention. The invention further provides a patterned solid substrate obtained according to any of the methods of the invention.

22 Claims, 24 Drawing Sheets

(51) Int. Cl.
  *H01L 21/306* (2006.01)
  *H01L 21/311* (2006.01)
  *H01L 21/465* (2006.01)
  *H01L 21/3213* (2006.01)
  *H01L 21/67* (2006.01)
  *H01L 29/51* (2006.01)

(52) U.S. Cl.
  CPC .. *H01L 21/31122* (2013.01); *H01L 21/32135* (2013.01); *H01L 21/465* (2013.01); *H01L 21/67069* (2013.01); *H01L 21/67253* (2013.01); *H01L 29/517* (2013.01)

(56) References Cited

U.S. PATENT DOCUMENTS

| | | | |
|---|---|---|---|
| 5,705,443 A | | 1/1998 | Stauf et al. |
| 5,814,238 A | * | 9/1998 | Ashby ............... H01L 21/32136 216/62 |
| 6,010,966 A | * | 1/2000 | Ionov ................ H01L 21/32136 252/79.1 |
| 7,357,138 B2 | | 4/2008 | Ji et al. |
| 7,781,340 B2 | | 8/2010 | Chen et al. |
| 2006/0003145 A1 | | 1/2006 | Hansen et al. |
| 2008/0023800 A1 | | 1/2008 | Holzig et al. |
| 2014/0273492 A1 | | 9/2014 | Anthis et al. |
| 2015/0162214 A1 | * | 6/2015 | Thompson ........ H01L 21/32051 438/669 |
| 2017/0018439 A1 | * | 1/2017 | Wang ................ H01L 21/3065 |

\* cited by examiner

Sn(acac)₂

HF-Pyridine (A)            (B)

METHODS OF ATOMIC LAYER ETCHING (ALE) USING SEQUENTIAL, SELF-LIMITING THERMAL REACTIONS

CROSS-REFERENCE TO RELATED APPLICATIONS

The present application is a 35 U.S.C. § 371 national phase application of International Application No. PCT/US2015/066789, filed Dec. 18, 2015, which claims priority under 35 U.S.C. § 119(e) to U.S. Provisional Patent Applications No. 62/093,595, filed Dec. 18, 2014, and No. 62/154,994, filed Apr. 30, 2015, all of which applications are incorporated herein by reference in their entireties.

STATEMENT REGARDING FEDERALLY SPONSORED RESEARCH OR DEVELOPMENT

This invention was made with government support under grant number CHE1306131 awarded by the National Science Foundation. The government has certain rights in the invention.

BACKGROUND OF THE INVENTION

A thin film corresponds to a layer of material deposited on a solid support or substrate, wherein the layer ranges in thickness from fractions of a nanometer (monolayer) to several micrometers. Thin films are employed, for example, in electronics (e.g., insulators, semiconductors, or conductors for integrated circuits), optical coatings (e.g., reflective, anti-reflective coatings, or self-cleaning glass) and packaging (e.g., aluminum-coated PET film).

Thin film deposition may be accomplished using a variety of gas phase chemical and/or physical vapor deposition techniques. Many of these deposition techniques are able to control layer thickness within a few tens of nanometers. Thin film deposition is also achieved by liquid phase and electrochemical techniques where the thickness of the final film is not well controlled. Examples include copper deposition by electroplating and sol gel deposition.

Gas phase deposition techniques fall into two broad categories, depending on whether the process is primarily chemical or physical. In a chemical deposition process, a precursor undergoes a chemical change at a solid surface, leaving a solid layer on the surface. In a chemical vapor deposition (CVD) process, a gas-phase precursor, often a halide or hydride of the element to be deposited, reacts with a substrate on the surface, leading to formation of the thin film on the surface. Atomic layer deposition (ALD) is a thin film growth technique based on sequential, self-limiting surface reactions (George, 2010, Chem Rev 110:111-131). ALD can deposit extremely conformal thin films with atomic layer control. ALD has developed rapidly over the last 10-15 years to meet many industrial needs such as the miniaturization of semiconductor devices. ALD can deposit a wide range of materials from metal oxides to metals (Miikkulainen, et al., 2013, J Appl Phys 113). ALD is typically accomplished using thermal chemistry. However, sometimes plasma ALD is employed to enhance the surface reactions.

In contrast, atomic layer etching (ALE) is a thin film removal technique based on sequential, self-limiting surface reactions (Agarwal & Kushner, 2009, J. Vacuum Sci & Tech A 27:37-50; Athavale & Economou, 1995, J Vacuum Sci & Tech A—Vacuum Surfaces and Films 13:966-971; Athavale & Economou, 1996, J Vacuum Sci Tech B 14:3702-3705). ALE can be viewed as the reverse of ALD. ALE should be able to remove thin films with atomic layer control. Compared with the large number of ALD processes, ALE processes have not been defined for as many materials. In addition, no thermal chemical processes have been demonstrated for ALE. ALE processes that have been reported have used excitation such as ion-enhanced or energetic noble gas atom-enhanced surface reactions. Most of the documented ALE processes have adsorbed a halogen on the surface of the material. Ion or noble gas atom bombardment is then used to desorb halogen compounds that etch the material.

Developing thermal self-limiting ALE reactions that are the reverse of ALD reactions is difficult. ALD reactions are typically exothermic reactions that are favorable thermochemical reactions. These thermal reactions are spontaneous with negative $\Delta G$ values (G is the Gibbs free energy). Performing ALD reactions in reverse should not be possible because of these thermodynamic considerations. The challenge for thermal ALE reactions is to find alternative, self-limiting, reactions with different reactants that are exothermic and display negative $\Delta G$ values to ensure a spontaneous reaction.

There is a need in the art for novel methods of performing atomic layer etching (ALE) on a surface. Such methods should be self-limiting and allow for atomic level precision. The present invention meets this need.

BRIEF SUMMARY OF THE INVENTION

The invention provides a solid substrate obtained according to any of the methods of the invention. The invention further provides a porous substrate obtained according to any of the methods of the invention. The invention further provides a patterned solid substrate obtained according to any of the methods of the invention. The invention further provides a solid substrate obtained according to any of the methods of the invention. The invention further provides a smoothened solid substrate obtained according to any of the methods of the invention. The invention further provides a substrate comprising an impurity, wherein at least a fraction of the impurity is removed from the substrate according to any of the methods of the invention. The invention further provides a solid substrate, wherein a 3D architectural feature is located on a surface of the solid substrate, wherein the feature is reduced according to any of the methods of the invention.

The invention provides a method of promoting atomic layer etching (ALE) on a solid substrate comprising a first metal compound. In certain embodiments, the method comprises (a) contacting the solid substrate with a gaseous second metal precursor, wherein the precursor comprises at least one selected from the group consisting of monodentate ligands, chelates and any combinations thereof, whereby a first metal precursor is formed. In other embodiments, the method comprises (b) contacting the solid substrate formed in step (a) with a halogen-containing gas, whereby first metal halide is formed. In yet other embodiments, the method further comprises (c) optionally repeating steps (a) and (b) one or more times. In yet other embodiments, the monodentate ligand comprises at least one selected from the group consisting of alkyl, hydride, carbonyl, halide, alkoxide, alkylamide, silylamide and any combinations thereof. In yet other embodiments, the chelate comprises at least one selected from the group consisting of β-diketonate, amidinate, acetamidinate, β-diketiminate, diamino alkoxide, metallocene and any combinations thereof.

In certain embodiments, the solid substrate is contained in a single system and is sequentially contacted with the gaseous compound of the second metal in step (a) and the halogen-containing gas in step (b). In other embodiments, the solid substrate is purged with an inert gas after step (a) and/or step (b). In yet other embodiments, the inert gas comprises $N_2$ or Ar. In yet other embodiments, step (a) and/or step (b) is/are run at a temperature that is equal to or greater than a value ranging from about 100° C. to about 450° C. In yet other embodiments, the gaseous compound of the second metal in step (a) and the halogen-containing gas in step (b) are contained in separate systems, and the solid substrate is physically moved from one system to the other.

In certain embodiments, the first metal compound comprises at least one selected from the group consisting of metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and any combinations thereof. In other embodiments, before step (a) takes place, the elemental metal is converted to the corresponding metal halide. In yet other embodiments, the solid substrate is first submitted to a chemical treatment that results in the formation, on at least a portion of the surface of the solid substrate, of a metal compound selected from the group consisting of a metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and any combinations thereof.

In certain embodiments, the first metal comprises at least one selected from the group consisting of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, Sn and any combinations thereof. In other embodiments, the first metal compound is deposited on an inert substrate. In yet other embodiments, the inert substrate comprises Si. In yet other embodiments, the inert substrate comprises a Si wafer.

In certain embodiments, the second metal comprises at least one selected from the group consisting of Sn, Ge, Al, B, Ga, In, Zn, Ni, Pb, Si, Hf, Zr, Ti and any combinations thereof.

In certain embodiments, the β-diketonate comprises at least one selected from the group consisting of acac (acetylacetonate), hfac (hexafluoroacetylacetonate), tfac (trifluoroacetylacetonate), ttmhd (tetramethylheptanedionate) and any combinations thereof.

In certain embodiments, the halogen-containing gas comprises a hydrogen halide. In other embodiments, the hydrogen halide comprises HF. In yet other embodiments, the hydrogen halide comprises HCl, HBr or HI.

In certain embodiments, the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$ and any combinations thereof. In other embodiments, the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$, $CF_4$, $CF_2Cl_2$, $CCl_4$, $CF_3Cl$, $C_2F_6$, $CHF_3$ and any combinations thereof, and wherein the halogen-containing gas is ionized in a plasma to produce at least one halogen radical and/or ion.

In certain embodiments, the solid substrate is pretreated by sequential contacting with a gaseous second metal precursor, and a halogen-containing gas. In other embodiments, the first metal compound is formed using atomic layer deposition. In yet other embodiments, each cycle of step (a) and step (b) is self-limiting. In yet other embodiments, each cycle of step (a) and step (b) allows for about the same etch rate and/or mass loss of the solid substrate. In yet other embodiments, the resulting etched solid substrate has about the same or lower surface roughness as the starting solid substrate. In yet other embodiments, the density of the etched solid substrate is about the same as of the starting solid substrate. In yet other embodiments, the refractive index of the etched solid substrate is about the same as of the initial solid substrate.

In certain embodiments, the solid substrate comprises at least one additional metal compound, and ALE of the first metal compound is selective over ALE of the at least one additional metal compound. In other embodiments, the ALE rate is controlled by the solid substrate temperature. In yet other embodiments, the ALE is performed using a spatial ALE technique.

The invention further provides a method of forming and/or enlarging pores in a porous substrate, wherein the porous substrate comprises a first metal compound. In certain embodiments, the method comprises (a) contacting the porous substrate with a gaseous second metal precursor, wherein the precursor comprises at least one selected from the group consisting of monodentate ligands, chelates and any combinations thereof, whereby a first metal precursor is formed. In other embodiments, the method comprises (b) contacting the porous substrate formed in step (a) with a halogen-containing gas, whereby first metal halide is formed. In yet other embodiments, the method comprises (c) optionally repeating steps (a) and (b) one or more times.

The invention further provides a method of patterning a solid substrate, wherein a portion of the surface of the solid substrate has an exposed first metal compound. In certain embodiments, the method comprises (a) contacting the solid substrate with a gaseous second metal precursor, wherein the precursor comprises at least one selected from the group consisting of monodentate ligands, chelates and any combinations thereof, whereby a first metal precursor is formed. In other embodiments, the method comprises (b) contacting the solid substrate formed in step (a) with a halogen-containing gas, whereby first metal halide is formed. In yet other embodiments, the method comprises (c) optionally repeating steps (a) and (b) one or more times.

In certain embodiments, the patterned solid substrate is obtained. In other embodiments, the surface of the starting solid substrate is at least partially masked, whereby only a portion of the surface of the solid substrate is exposed. In yet other embodiments, the surface of the starting solid substrate is at least partially masked with a photoresist. In yet other embodiments, the solid substrate is further patterned using a technique selected from the group consisting of monolayer self-assemblying, nano-imprint and stamping.

The invention further provides a method of selectively removing a portion of a solid substrate, wherein the solid substrate comprises a first metal compound. In certain embodiments, the method comprises (a) contacting the solid substrate with a gaseous metal precursor, wherein the precursor comprises at least one selected from the group consisting of monodentate ligands, chelates and any combinations thereof, whereby a first metal precursor is formed. In other embodiments, the method comprises (b) contacting the solid substrate formed in step (a) with a halogen-containing gas, whereby first metal halide is formed. In yet other embodiments, the method comprises (c) optionally repeating steps (a) and (b) one or more times.

In certain embodiments, the solid substrate comprises a carbon composite.

The invention further provides a method of smoothing the surface of a solid substrate, wherein the solid substrate comprises a first metal compound. In certain embodiments, the method comprises (a) contacting the solid substrate with a gaseous second metal precursor, wherein the precursor comprises at least one selected from the group consisting of monodentate ligands, chelates and any combinations thereof, whereby a first metal precursor is formed. In other embodiments, the method comprises (b) contacting the solid substrate formed in step (a) with a halogen-containing gas, whereby first metal halide is formed. In yet other embodiments, the method comprises (c) optionally repeating steps (a) and (b) one or more times.

The invention further provides a method of promoting chemical vapor etching (CVE) on a solid substrate comprising a first metal compound. In certain embodiments, the method comprises contacting the solid substrate concurrently with a gaseous second metal precursor and a halogen-containing gas, wherein the gaseous compound of the second metal comprises at least one selected from the group consisting of monodentate ligands, chelates and any combinations thereof. In other embodiments, the monodentate ligand comprises at least one selected from the group consisting of alkyl, hydride, carbonyl, halide, alkoxide, alkylamide, silylamide and any combinations thereof. In yet other embodiments, the chelate comprises at least one selected from the group consisting of β-diketonate, amidinate, acetamidinate, β-diketiminate, diamino alkoxide, metallocene and any combinations thereof.

In certain embodiments, the contacting step is run at a temperature that is equal to or greater than a value ranging from about 100° C. to about 450° C. In other embodiments, the first metal compound comprises at least one selected from the group consisting of metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and any combinations thereof. In yet other embodiments, the first metal comprises at least one selected from the group consisting of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, Sn and any combinations thereof.

The invention further provides a method of removing at least a fraction of an impurity from a solid substrate, wherein a portion of the surface of the solid substrate has an exposed first metal compound. In certain embodiments, the method comprises (a) contacting the solid substrate with a gaseous second metal precursor, wherein the precursor comprises at least one selected from the group consisting of monodentate ligands, chelates and any combinations thereof, whereby a first metal precursor is formed. In other embodiments, the method comprises (b) contacting the solid substrate formed in step (a) with a halogen-containing gas, whereby first metal halide is formed. In yet other embodiments, the method comprises (c) optionally repeating steps (a) and (b) one or more times.

The invention further provides a method of reducing the size of at least one 3D architecture feature on a surface of a solid substrate, wherein the surface of the solid substrate comprises a first metal compound. In certain embodiments, the method comprises (a) contacting the solid substrate with a gaseous second metal precursor, wherein the precursor comprises at least one selected from the group consisting of monodentate ligands, chelates and any combinations thereof, whereby a first metal precursor is formed. In other embodiments, the method comprises (b) contacting the solid substrate formed in step (a) with a halogen-containing gas, whereby first metal halide is formed. In yet other embodiments, the method comprises (c) optionally repeating steps (a) and (b) one or more times.

BRIEF DESCRIPTION OF THE FIGURES

For the purpose of illustrating the invention, there are depicted in the drawings certain embodiments of the invention. However, the invention is not limited to the precise arrangements and instrumentalities of the embodiments depicted in the drawings.

DETAILED DESCRIPTION OF THE INVENTION

Figure 1:
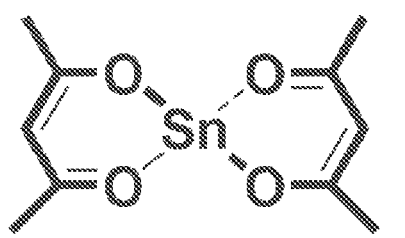
FIG. 1 is a schematic representation of $Sn(acac)_2$ and HF-pyridine precursors used for $Al_2O_3$ ALE.
Figure 1:
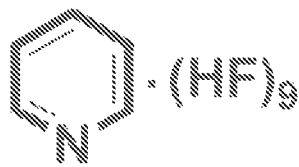

The present invention relates to the unexpected discovery of a novel method of promoting atomic layer etching (ALE) of a surface using sequential, self-limiting thermal reactions with a metal precursor (such as a metal monodentate complex and/or a metal chelate, such as but not limited to β-diketonate) and a halogen-containing gas. In certain embodiments, the sequential reactions are self-limiting. In other embodiments, the etch rates increase with temperature. In yet other embodiments, the etch rates are constant over several cycles. In yet other embodiments, the resulting etched surfaces are smooth.

As described herein in a non-limiting example, sequential exposures of Sn(acac)$_2$ and HF were employed for the thermal ALE of Al$_2$O$_3$. In another non-limiting example, sequential exposures of Sn(acac)$_2$ and HF were employed for the thermal ALE of HfO$_2$. In yet another non-limiting example, sequential exposures of Al(CH$_3$)$_3$ and HF were employed for the thermal ALE of Al$_2$O$_3$. In yet another non-limiting example, sequential exposures of Sn(acac)$_2$ and HF were employed for the thermal ALE of AlF$_3$. In yet another non-limiting example, sequential exposures of Al(CH$_3$)$_3$ and HF were employed for the thermal ALE of GaN. In yet another non-limiting example, sequential exposures of AlCl(CH$_3$)$_2$ and HF were employed for the thermal ALE of ZnS. In yet another non-limiting example, sequential exposures of either Al(CH$_3$)$_3$ and HF or AlCl(CH$_3$)$_2$ and HF were employed for the thermal ALE of ZnO. In yet another non-limiting example, sequential exposures of Ga[N(CH$_3$)$_2$]$_3$ and HF were employed for the thermal ALE of Ga$_2$O$_3$ and ZnO.

In certain embodiments, the overall etching reaction for Al$_2$O$_3$ using Sn(acac)$_2$ and HF is: Al$_2$O$_3$+6Sn(acac)$_2$+6HF→2 Al(acac)$_3$+6SnF(acac)+3H$_2$O. In this reaction, the Sn(acac)$_2$ reactant donates acac to the substrate to produce Al(acac)$_3$. The HF reactant allows SnF(acac) and H$_2$O to leave as reaction products. Al(acac)$_3$ is a stable β-diketonate with high volatility. In certain embodiments, the formation of a stable Sn—F bond facilitates the reaction. Similar reactions occur for HfO$_2$ ALE. Similar reactions also occur for Al$_2$O$_3$ ALE using TMA and HF as the reactants. Analogous reactions occur for GaN ALE using TMA and HF as the reactants. Similar reactions occur for ZnS ALE using AlCl(CH$_3$)$_2$ and HF as the reactants. Analogous reactions also occur for ZnO ALE using either Al(CH$_3$)$_3$ and HF or AlCl(CH$_3$)$_2$ and HF as the reactants. Analogous reactions also occur for Ga$_2$O$_3$ and ZnO ALE using Ga[N(CH$_3$)$_2$]$_3$ and HF as the reactants.

The thermal $Al_2O_3$ ALE reactions were examined using quartz crystal microbalance (QCM) studies. The $Al_2O_3$ film thicknesses were measured using x-ray reflectivity (XRR) and spectroscopic ellipsometry (SE) analysis. The vibrational spectra during the $Al_2O_3$ ALE reactions were obtained using Fourier transform infrared (FTIR) spectroscopy. These same techniques were also used to study the thermal $HfO_2$ ALE and $AlF_3$ ALE reactions. In certain embodiments, the QCM, XRR and SE measurements help evaluate whether the $Al_2O_3$ etching is linear versus the number of reaction cycles. In certain embodiments, the QCM measurements help evaluate whether the $Al_2O_3$ ALE is self-limiting versus the reactant exposure times. In certain embodiments, the FTIR analysis helps to identify the surface species during $Al_2O_3$ ALE. In other embodiments, similar measurements are used to analyze $HfO_2$ ALE, $AlF_3$ ALE, GaN ALE, ZnO ALE, ZnS ALE and $Ga_2O_3$ ALE. This new method for ALE based on sequential, self-limiting, thermal reactions broadens the strategies for ALE reactions beyond the previous methods of using halogen adsorption and ion or energetic atom bombardment.

DEFINITIONS

As used herein, each of the following terms has the meaning associated with it in this section.

As used herein, unless defined otherwise, all technical and scientific terms generally have the same meaning as commonly understood by one of ordinary skill in the art to which this invention belongs. Generally, the nomenclature used herein and the laboratory procedures in surface chemistry are those well-known and commonly employed in the art.

As used herein, the articles "a" and "an" refer to one or to more than one (i.e. to at least one) of the grammatical object of the article. By way of example, "an element" means one element or more than one element.

As used herein, the term "about" will be understood by persons of ordinary skill in the art and will vary to some extent on the context in which it is used. As used herein, "about" when referring to a measurable value such as an amount, a temporal duration, and the like, is meant to encompass variations of ±20%, ±10%, ±5%, ±1%, or ±0.1% from the specified value, as such variations are appropriate to perform the disclosed methods.

As used herein, the term "acac" refers to acetylacetonate.

As used herein, the term "ALD" refers to atomic layer deposition.

As used herein, the term "ALE" refers to atomic layer etching.

As used herein, the term "CVD" refers to chemical vapor deposition.

As used herein, the term "CVE" refers to chemical vapor etching.

As used herein, the term "DMAC" refers to dimethylaluminum chloride.

As used herein, the term "instructional material" includes a publication, a recording, a diagram, or any other medium of expression that may be used to communicate the usefulness of the compositions and/or methods of the invention. In certain embodiments, the instructional material may be part of a kit useful for generating a composition and/or performing the method of the invention. The instructional material of the kit may, for example, be affixed to a container that contains the compositions of the invention or be shipped together with a container that contains the compositions. Alternatively, the instructional material may be shipped separately from the container with the intention that the recipient uses the instructional material and the compositions cooperatively. For example, the instructional material is for use of a kit; instructions for use of the compositions; or instructions for use of the compositions.

As used herein, the term "FTIR" refers to Fourier Transform Infrared Spectroscopy.

As used herein, the term "metal chelate" refers to a compound formed between a metal and at least one chelating (or polydentate) ligand. In certain embodiments, the chelating ligand is at least one selected from the group consisting of β-diketonate, thio-β-diketonate, amidinate, acetamidinate, β-diketiminate and (substituted or non-substituted) cyclopentadienyl. In other embodiments, all the chelating ligands in the metal chelate complex are identical (e.g., all groups are β-diketonates). In other embodiments, at least two distinct chelating ligands are present in the chelate.

As used herein, the term "metal precursor" refers to a metal chelate, a metal monodentate complex and any combinations thereof.

As used herein, the term "metal monodentate complex" refers to a compound formed between a metal and at least one monodentate ligand. In certain embodiments, the monodentate ligand is at least one selected from the group consisting of alkyl, hydride, carbonyl (carbon monoxide), halide, alkoxide, alkylamide and silylamide. In other embodiments, all the monodentate ligands in the metal monodentate complex are identical (e.g., all alkyl groups are methyl). In other embodiments, at least two distinct monodentate ligands are present in the monodentate complex (e.g., the alkyl groups comprise methyl and ethyl).

As used herein, the term "MCPC" refers to mass change per cycle.

As used herein, the term "PID" refers to proportional-integral-derivative.

As used herein, the term "QCM" refers to quartz crystal microbalance.

As used herein, the term "SE" refers to spectroscopic ellipsometry.

As used herein, the term "TDMAG" refers to trisdimethylamido gallium.

As used herein, the term "TDMAH" refers to tetrakisdimethylamido hafnium.

As used herein, the term "TMA" refers to trimethylaluminum.

As used herein, the term "XRR" refers to X-ray reflectivity.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6, and so on, as well as individual numbers within that range, for example, 1, 2, 2.7, 3, 4, 5, 5.3, and 6. This applies regardless of the breadth of the range.

DISCLOSURE

The present invention relates to the unexpected discovery of a novel method of promoting atomic layer etching of a surface using sequential, self-limiting thermal reactions with a metal precursor (such as a metal monodentate complex or a metal chelate, such as but not limited to β-diketonate) and a gaseous halide source. In certain embodiments, the sequential reactions are self-limiting. In other embodiments, the etch rates increase with temperature. In yet other embodiments, the etch rates are constant over several cycles. In yet other embodiments, the resulting etched surfaces are smooth.

As demonstrated herein in a non-limiting example, atomic layer etching (ALE) of $Al_2O_3$ was performed using sequential, self-limiting thermal reactions with $Sn(acac)_2$ and HF as the reactants. Similar demonstrations were performed for $HfO_2$ ALE. The $Al_2O_3$ samples were $Al_2O_3$ atomic layer deposition (ALD) films grown using trimethylaluminum and $H_2O$; and the HF source was HF-pyridine. $Al_2O_3$ was etched linearly with atomic level precision versus number of reactant cycles. The $Al_2O_3$ ALE occurred at temperatures from 150-250° C.

Quartz crystal microbalance (QCM) studies revealed that the sequential $Sn(acac)_2$ and HF reactions were self-limiting versus reactant exposure. QCM measurements also determined that the MCPCs increased with temperature from $-4.1$ ng/(cm$^2$ cycle) at 150° C. to $-18.3$ ng/(cm$^2$ cycle) at 250° C. These mass changes per cycle (MCPC) correspond to etch rates of 0.14 Å/cycle at 150° C. to 0.61 Å/cycle at 250° C. based on the $Al_2O_3$ ALD film density of 3.0 g/cm$^3$. X-ray reflectivity (XRR) analysis confirmed the linear removal of $Al_2O_3$ and measured $Al_2O_3$ ALE etch rates of 0.27 Å/cycle at 200° C. The XRR measurements also demonstrated that the $Al_2O_3$ films did not roughen versus $Al_2O_3$ ALE. The Fourier transform infrared (FTIR) spectroscopy analysis identified acac and $AlF_3$ surface species during $Al_2O_3$ ALE.

Without wishing to be limited by any theory, the etching mechanism may yield $Al(acac)_3$, $SnF(acac)$ and $H_2O$ as the reaction products. In the proposed reaction mechanism, the $Sn(acac)_2$ reactant undergoes ligand-exchange and accepts fluorine to form $SnF(acac)$ and donates acac to the substrate to produce $Al(acac)_3$. The hydrogen atom in the HF reactant allows $H_2O$ to leave as a reaction product. The HF reactant also converts a layer of $Al_2O_3$ to $AlF_3$. Without wishing to be limited by any theory, the $AlF_3$ adlayer is an important reaction intermediate during $Al_2O_3$ ALE.

The presently described thermal ALE mechanism is applicable to various metal compounds, such as but not limited to metal oxides, nitrides, phosphides, sulfides and arsenides. For example, the reaction may be run with $Sn(acac)_2$ and HF as the reactants. $Sn(acac)_2$ reacts with fluorine to form $SnF(acac)$, driven at least in part by the Sn—F bond enthalpy (466.5 kJ/mole in the diatomic SnF molecule). The reaction of $Sn(acac)_2$ with fluorine to form $SnF(acac)$ enables $Sn(acac)_2$ to release an acac ligand to the surface. Metals form complexes with acac ligands with comparable stabilities (Morozova, et al., 2008, J. Phys. Chem. Solids 69:673-679). The hydrogen from HF can combine with oxygen, nitrogen, phosphorous or sulfur, respectively, from the metal oxide, metal nitride, metal phosphide, sulfide or arsenide, respectively, to form $H_2O$, $NH_3$, $PH_3$, $H_2S$ or $AsH_3$, respectively.

In certain embodiments, the amount of etching is defined by the amount of metal fluoride formed after the HF exposure and then removed by the β-diketonate exposure. In other embodiments, the metal fluoride is not volatile during the HF exposure, and the etching is self-limiting. In yet other embodiments, the reaction to form the metal fluoride is thermodynamically favorable.

ALE reactions for various metal oxides, metal nitrides, metal phosphides, metal sulfides and metal arsenides are illustrated in Table 1. The metal fluoride adlayer is an important reaction intermediate in these ALE reactions. With the exception of the metal sulfides, Table 1 illustrates that all of the formation reactions for the metal fluorides have negative $\Delta G$ values and are thus spontaneous. The ALE of many other metal oxides, metal nitrides, metal phosphides, metal sulfides and metal arsenides may be performed using $Sn(acac)_2$ and HF. In addition, the ALE of metal fluorides themselves may also be performed using $Sn(acac)_2$ and HF. The reaction efficiency may be dependent on the volatility of the metal acetylacetonate reaction product. For example, many metal oxides, in addition to $Al_2O_3$, may be etched by $Sn(acac)_2$ and HF reactants including $HfO_2$, $ZrO_2$, $Fe_2O_3$, $Co_2O_3$, $Cr_2O_3$, $Sc_2O_3$ and $Ga_2O_3$. These metal oxides all produce etch products, $M(acac)_3$ or $M(acac)_4$, with vapor pressures of ~1 Torr at 150° C.

The ALE of elemental metals is also possible using $Sn(acac)_2$ and HF. The ALE of elemental metals may be performed by oxidizing or nitriding the elemental metal to form a metal oxide or metal nitride, and then employing an ALE reaction for a metal oxide or metal nitride, respectively. The ALE of elemental metals may also be performed by phosphiding, sulfiding or arseniding the elemental metal to form a metal phosphide, metal sulfide or metal arsenide and then employing an ALE reaction for a metal phosphide, metal sulfide or metal arsenide, respectively.

In certain embodiments, the metal compound which is an elemental metal is directly fluorinated to form a metal fluoride. Subsequently, the metal fluoride can be removed using a metal precursor. In other embodiments, the metal precursor releases one of its ligands to the surface. In yet other embodiments, the ligands react with the metal of the metal fluoride to form a volatile metal compound. In a non-limiting example, Ni ALE is an example of elemental metal ALE. The surface of nickel can first be fluorinated to form $NiF_2$. This reaction is favorable based on the predicted thermochemistry:

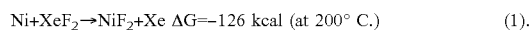

$$Ni+XeF_2 \rightarrow NiF_2+Xe \quad \Delta G=-126 \text{ kcal (at 200° C.)} \quad (1).$$

Subsequently, $Sn(acac)_2$ can serve as a metal precursor to accept fluorine from the $NiF_2$. The acac ligands from the $Sn(acac)_2$ can then react with the Ni to form $Ni(acac)_2$. The overall reaction is:

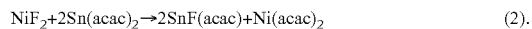

$$NiF_2+2Sn(acac)_2 \rightarrow 2SnF(acac)+Ni(acac)_2 \quad (2).$$

Elemental metals contemplated within the invention include, but are not limited to, Ni, Cr, Co, Cu, In, Fe, Pb, Ag, Sn, Ti and Zn. Additional elemental metals contemplated within the invention include, but are not limited to, metals that form volatile metal fluorides, such as Ir, Mo, Pt, Re, Rh, Ru, Ta and W, in which case the substrate temperature is kept at a temperature where the spontaneous desorption of the metal fluoride is prevented or minimized.

The invention further contemplates the ALE of metal silicides, metal borides and metal carbides. Like the other metal compounds discussed elsewhere herein, the metal silicides, metal borides and metal carbides can first be fluorinated using fluorine precursors such as HF or $NF_3$. The metal fluoride can then be removed by subsequent ligand-exchange reactions using a metal precursor such as $Sn(acac)_2$.

The sequential reactions for $Ni_2Si$ ALE are similar to the reactions for Ni ALE. The fluorination reactions with either HF or $NF_3$ are:

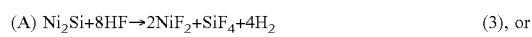

$$(A) \quad Ni_2Si+8HF \rightarrow 2NiF_2+SiF_4+4H_2 \quad (3), or$$

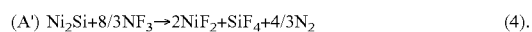

$$(A') \quad Ni_2Si+8/3NF_3 \rightarrow 2NiF_2+SiF_4+4/3N_2 \quad (4).$$

Fluorination of Ni$_2$Si by HF or NF$_3$ are both spontaneous with ΔG=−86 kcal or ΔG=−193 kcal, respectively, at 200° C. Sn(acac)$_2$ then undergoes a ligand-exchange reaction to produce Ni(acac)$_2$ reaction products as shown by the (B) reaction.

(B) NiF$_2$+2Sn(acac)$_2$→Ni(acac)$_2$+2SnF(acac)  (5).

The Ni(acac)$_2$ reaction product has a high volatility. Similar reactions could occur for metal borides and metal carbides. The reaction products for metal borides and metal carbides are metal fluorides and either BF$_3$ or CF$_4$, respectively.

The invention further contemplates the ALE of metal selenides and metal tellurides. Like the other metal compounds discussed elsewhere herein, the metal selenides and metal tellurides can first be fluorinated using fluorine precursors. The metal fluoride can then be removed by subsequent ligand-exchange reactions using a metal precursor. For example, F$_2$ could be used as the fluorine precursor and Sn(acac)$_2$ could be used as the metal precursor for CdSe ALE or CdTe ALE.

TABLE 1

Atomic Layer Etching Reactions for Various Materials (ΔG at 200° C.)

Metal Oxides

Overall: Al$_2$O$_3$ + 6 Sn(acac)$_2$ + 6HF → 2 Al(acac)$_3$ + 6 SnF(acac) + 3 H$_2$O
Fluoride Formation: Al$_2$O$_3$ + 6 HF → 2 AlF$_3$ + 3 H$_2$O ΔG = −58 kcal
Overall: HfO$_2$ + 4 Sn(acac)$_2$ + 4 HF → Hf(acac)$_4$ + 4 SnF(acac) + 2 H$_2$O
Fluoride Formation: HfO$_2$ + 4 HF → HfF$_4$ + 2 H$_2$O ΔG = −19 kcal Metal Nitrides Overall: GaN + 3 Sn(acac)$_2$ + 3HF → Ga(acac)$_3$ + 3 SnF(acac) + NH$_3$
Fluoride Formation: GaN + 3 HF → GaF$_3$ + NH$_3$ ΔG = −40 kcal
Overall: InN + 3 Sn(acac)$_2$ + 3HF → In(acac)$_3$ + 3 SnF(acac) + NH$_3$
Fluoride Formation: InN + → InF$_3$ + NH$_3$ ΔG = −66 kcal Metal Phosphides Overall: AlP + 3 Sn(acac)$_2$ + 3 HF → Al(acac)$_3$ + 3 SnF(acac) + PH$_3$
Fluoride Formation: AlP + 3 HF → AlF$_3$ + PH$_3$ ΔG = −91 kcal
Overall: InP + 3 Sn(acac)$_2$ + 3HF → In(acac)$_3$ + 3 SnF(acac) + PH$_3$
Fluoride Formation: InP + 3HF → InF$_3$ + PH$_3$ ΔG = −39 kcal Metal Sulfides Overall: ZnS + 2 Sn(acac)$_2$ + 2HF → Zn(acac)$_2$ + 2 SnF(acac) + H$_2$S
Fluoride Formation: ZnS + 2 HF → ZnF$_2$ + H$_2$S ΔG = +6 kcal
Overall: PbS + 2 Sn(acac)$_2$ + 2HF → Pb(acac)$_2$ + 2 SnF(acac) + H$_2$S
Fluoride Formation: PbS + 2 HF → PbF$_2$ + H$_2$S ΔG = +2 kcal Metal Arsenides Overall: GaAs + 3 Sn(acac)$_2$ + 3 HF → Ga(acac)$_3$ + 3 SnF(acac) + AsH$_3$
Fluoride Formation: GaAs + 3 HF → GaF$_3$ + AsH$_3$ ΔG = −21 kcal
Overall: InAs + 3 Sn(acac)$_2$ + 3HF → In(acac)$_3$ + 3 SnF(acac) + AsH$_3$
Fluoride Formation: InAs + 3 HF → InF$_3$ + AsH$_3$ ΔG = −30 kcal In certain embodiments, other Sn β-diketonates may also serve as etching reactants besides Sn(acac)$_2$. Many other β-diketone ligands on the Sn metal center are useful within the invention, such as hfac (hexafluoroacetylacetonate), tfac (trifluroacetylacetonate), and tmhd (tetramethylheptanedionate). Different β-diketone ligands can change the physical properties of the metal β-diketonate. For example, fluorine-substituted β-diketone ligands generally show higher vapor pressure.

In certain embodiments, other metal β-diketonates, in addition to Sn-based compounds, react with HF to yield β-diketone ligands that could then form the etch products. The possible advantage of using different metal β-diketonates may be their more favorable vapor pressure, thermal stability, reaction kinetics or thermochemistry. Different metals may also form β-diketonates with the metal in various oxidation states. β-diketonates with metals in higher oxidation numbers have a higher number of β-diketone ligands.

In certain embodiments, the metal precursor comprises a metal alkyl. In a non-limiting example, Al(CH$_3$)$_3$ (also known as trimethylaluminum or TMA—a Group III metal alkyl) is used as a metal alkyl for Al$_2$O$_3$ ALE. In other embodiments, TMA can be used as a metal precursor for Al$_2$O$_3$ ALD. In yet other embodiments, TMA can be used as a metal precursor for Al$_2$O$_3$ ALE. In yet other embodiments, ALD precursors for a particular material may also be used for the ALE of the same material.

In certain embodiments, other Group III metals, such as boron, gallium and indium are used as metal alkyls, such as but not limited to B(CH$_3$)$_3$, Ga(CH$_3$)$_3$ and In(CH$_3$)$_3$. In other embodiments, non-Group III metal alkyls, such as Zn(CH$_2$CH$_3$)$_2$, are useful within the methods of the invention.

In certain embodiments, the halogen-containing gas comprises a hydrogen halide. In other embodiments, the hydrogen halide comprises HF. In yet other embodiments, the halogen-containing gas comprises at least one selected from the group consisting of F$_2$, ClF$_3$, NF$_3$, SF$_6$, SF$_4$, XeF$_2$, Cl$_2$, Br$_2$, BCl$_3$ and I$_2$. In yet other embodiments, the hydrogen halide comprises HCl, HBr or HI. In yet other embodiments, the halogen-containing gas may be ionized in a plasma to produce halogen radicals or ions.

The thermochemical free energies for the reaction of non-limiting fluorine-containing gases with aluminum oxide are illustrated below:

Al$_2$O$_3$+6HF→2AlF$_3$+3H$_2$O  ΔG=−58 kcal

Al$_2$O$_3$+2ClF$_3$→2AlF$_3$+Cl$_2$O+O$_2$  ΔG=−223 kcal

Al$_2$O$_3$+3F$_2$→2AlF$_3$+3/2O$_2$  ΔG=−297 kcal

Al$_2$O$_3$+2NF$_3$→2AlF$_3$+NO+NO$_2$  ΔG=−230 kcal

Al$_2$O$_3$+SF$_6$→2AlF$_3$+SO$_3$  ΔG=−130 kcal

2Al$_2$O$_3$+3SF$_4$→4AlF$_3$+3SO$_2$  ΔG=−313 kcal

Al$_2$O$_3$+3XeF$_2$→2AlF$_3$+2Xe+3/2O$_2$  ΔG=−258 kcal

In certain embodiments, the ALE of metal oxides utilizes HCl or HBr instead of HF as a reactant. For example, the reaction of HCl with Sn(acac)$_2$ produces SnCl(acac). The Sn—Cl bond energy in the diatomic SnCl molecule is 414 kJ/mole, which is only slightly less than the bond energy of 466.5 kJ/mole in the diatomic SnF molecule. In certain embodiments, metal chlorides or bromides may be less stable compared with the corresponding metal fluorides. In other embodiments, HCl or HBr are used for the ALE of metal sulfides.

The absolute etch rate may also differ between various metal oxides during ALE with Sn(acac)$_2$ and HF as the reactants. The etch rate may be dependent upon the residual coverage of SnF(acac)* species on the metal oxide surface. Higher SnF(acac)* coverages may block surface sites and prevent the adsorption of Sn(acac)$_2$ or formation of the metal fluoride adlayer, reducing etching rates. In certain embodiments, the temperature dependence of the Al$_2$O$_3$ ALE may be attributed to the lower residual coverage of SnF(acac)* surface species at higher temperatures. Other ligands in addition to acac in the metal β-diketonate may also alter the residual coverage of species on the metal oxide surface and change the etch rate.

The methods of the invention allow for selective ALE, wherein one material is etched preferentially in the presence of at least one other material.

In certain embodiments, selective ALE can be achieved based on the choice of the particular reactants for ALE. For example, etching selectivity may occur in the fluorination process and/or the ligand exchange process with the metal precursor. In a non-limiting example, depending on the reaction kinetics and thermochemistry, the fluorine reactants selectively fluorinate a particular material over the remaining materials. In another non-limiting example, ALE selectivity is achieved in the ligand exchange process. When the metal precursor accepts a fluorine from the metal fluoride layer, the metal precursor donates a ligand to the metal in the metal fluoride, thus forming a reaction product. Depending on the nature of the ligand, the reaction products formed after ligand exchange have distinct stabilities and volatilities. Differences in stability and volatility of the reaction products may be used to achieve selective ALE.

Table 2 provides examples of various metal precursor families and the ligand-exchange process during their reaction with metal fluorides, $MF_x$. Selectivity could obtained depending on the stability and volatility of the metal reaction product derived from $MF_x$. For example, one may consider metal precursors for selectivity between AlN and $ZrO_2$. In certain embodiments, $Al(CH_3)_3$ removes $AlF_3$ during AlN ALE, because $Al(CH_3)_3$ or $AlF(CH_3)_2$ are stable and volatile metal reaction products. In other embodiments, $Al(CH_3)_3$ does not remove $ZrF_4$ to perform $ZrO_2$ ALE because $Zr(CH_3)_4$ or $ZrF(CH_3)_3$ are not stable metal reaction products. In yet other embodiments, $Ni(Cp)_2$ removes $ZrF_4$ during $ZrO_2$ ALE because $ZrF_2(Cp)_2$ is a stable and volatile metal reaction product. In yet other embodiments, $Ni(Cp)_2$ does not remove $AlF_3$ to perform AlN ALE because $AlCp_3$ or $AlF(Cp)_2$ are not stable reaction products.

TABLE 2

Metal Precursors for Reaction with Metal Fluoride and Metal Reaction Products

| Metal Precursor Family | Metal Precursor Example | Ligand-Exchange Process | Metal Reaction Product from $MF_x$ |
| --- | --- | --- | --- |
| β-diketonate | $Sn(acac)_2$ | Accept Fluorine Donate acac | $M(acac)_y$ or $MF_z(acac)_{y-z}$ |
| Alkyl | $Al(CH_3)_3$ | Accept Fluorine Donate —$CH_3$ | $M(CH_3)_y$ or $MF_z(CH_3)_{y-z}$ |
| Cyclopentadienyl | $Ni(Cp)_2$ | Accept Fluorine Donate Cp | $M(Cp)_y$ or $MF_z(CP)_{y-z}$ |
| Silylamide | $Zn(N(SiMe_3)_2)_2$ | Accept Fluorine Donate —$N(SiMe_3)_2$ | $M(N(SiMe_3)_2)_y$ or $MF_z(N(SiMe_3)_2)_{y-z}$ |
| Alkoxide | $Al(OCH_2CH_3)_3$ | Accept Fluorine Donate —$OCH_2CH_3$ | $M(OCH_2CH_3)_y$ or $MF_z(OCH_2CH3)_{y-1}$ |
| Amidinate (amd) | $Zn(amd)_2$ | Accept Fluorine Donate amd | $M(amd)_y$ or $MF(amd)_{y-z}$ |
| Alkylamide | $Ga(N(CH_3)_2)_3$ | Accept Fluorine Donate —$N(CH_3)_2$ | $M(N(CH_3)_2)_y$ or $MF_z(N(CH_3)_2)_{y-z}$ |
| Alkyl Chloride | $AlCl(CH_3)_2$ | Accept Fluorine Donate Cl or —$CH_3$ | $M(CH_3)_y$ or $MCl_x(CH_3)_y$ or $MCl_wF_z(CH_3)_{y-z-w}$ |

In certain embodiments, selective ALE is achieved by controlling the temperature of the process of the invention. For example, for $Al_2O_3$ ALE based on TMA and HF, one may grow $AlF_3$ by $AlF_3$ ALD or etch the initial $Al_2O_3$ substrate by $Al_2O_3$ ALE depending on temperature.

In certain embodiments, selective ALE is achieved using molecular adsorbates that bind to one material, and not another material. These molecular adsorbates act as surface blocking groups that will prevent the adsorption of the fluorine precursor or metal precursor. In other embodiments, these "molecular masks" allow for selective ALE. A wide range of ligands are contemplated as "molecular masks" within the invention. In certain embodiments, these ligands adsorb to the metal center of the material, and/or bind to the surface via Lewis acid or Lewis base sites on the material. As a non-limiting example, amines, such as $NH_3$ or pyridine, can adsorb to Lewis acid sites on the material and act as site-blocking species. As a non-limiting example, $BF_3$ can adsorb to Lewis base sides on the material and act as site-blocking species.

In certain embodiments, the thermal ALE approach is advantageous as compared with ALE based on halogen adsorption and ion or energetic neutral noble atom bombardment. The thermal ALE approach avoids any damage to the underlying substrate resulting from high energy ions or energetic neutrals (ions from plasmas cause performance degradation of high-k/metal gate stacks). ALE based on ion or neutral noble atom bombardment also requires line-of-sight to the substrate. This line-of-sight requirement is detrimental if conformality is required for the etching, and is also limited to the relatively small surface areas that are subjected to ion or neutral noble atom bombardment. The presently described thermal ALE approach is useful for etching high surface area and high aspect ratio structures.

Compositions

The invention provides a solid substrate obtained according to the methods of the invention. The invention further provides a cleaned substrate (i.e., a substrate from which impurities are at least partially removed) obtained according to the methods of the invention. The invention further provides a porous substrate obtained according to the methods of the invention. The invention further provides a 3D structure with reduced feature sizes obtained according to the methods of the invention. The invention further provides a patterned solid substrate obtained according to the methods of the invention. The invention further provides a smoothened solid substrate obtained according to the methods of the invention.

Methods

The invention provides a method of promoting atomic layer etching on a solid substrate comprising a first metal compound.

The invention further provides a method of cleaning a solid substrate, wherein a portion of the surface of the solid substrate has exposed first metal compound.

The invention further provides a method of patterning a solid substrate, wherein a portion of the surface of the solid substrate has exposed first metal compound.

The invention further provides a method of selectively removing a portion of a solid substrate, wherein the solid substrate comprises a first metal compound.

The invention further provides a method of smoothing the surface of a solid substrate, wherein the solid substrate comprises a first metal compound. Smoothing of surfaces is of interest in the semiconductor industry. Smoothing may be used to obtain damage-free layers. Sputtering can be used to remove some materials, but can leave a rough, damaged surface. ALE can be used to remove the damaged layer and smooth the surface to produce a "damage-free surface." Surface smoothing can also be used to obtain very high quality ultrathin films. For example, high quality ultrathin films can be produced by a "deposit/etch back" strategy by depositing a thicker film and then etching back to a thinner film. In a non-limiting embodiment, nucleation effects can lead to roughness in the ultrathin deposited film; once a continuous and pinhole-free thicker film is formed, ALE can etch this film back and obtain a smoother surface than would have been produced by growing to this ultrathin thickness.

In certain embodiments, the method comprises (a) contacting the solid substrate with a gaseous second metal precursor, wherein the precursor comprises at least one selected from the group consisting of monodentate ligands, chelates and any combinations thereof, whereby a first metal product is formed. In other embodiments, the method further comprises (b) contacting the solid substrate formed in step (a) with a halogen-containing gas, whereby first metal halide is formed as a product on the surface. In yet other embodiments, the method further comprises optionally repeating steps (a) and (b) one or more times.

The invention further provides a method of promoting chemical vapor etching (CVE) on a solid substrate comprising a first metal compound.

In certain embodiments, the method comprises contacting the solid substrate with a gaseous precursor of a second metal and a halogen-containing gas, wherein the precursor comprises at least one selected from the group consisting of monodentate ligands, chelates and any combinations thereof.

The invention further provides a method of forming and/or enlarging pores in a porous substrate, wherein the porous substrate comprises a first metal compound.

In certain embodiments, ALE can be used to reduce the feature size of 3D architectures. The gas phase, isotropic etching obtained using thermal ALE can reduce feature sizes and mass conformally with atomic level precision versus the number of ALE reaction cycles. Applications include reducing the width of FinFET channels in MOSFET structures and reducing the diameter and mass of nanowires and quantum dots.

In certain embodiments, the method comprises (a) contacting the porous substrate with a gaseous precursor of a second metal, whereby a first metal precursor is formed. In other embodiments, the method further comprises (b) contacting the porous substrate formed in step (a) with a halogen-containing gas, whereby first metal halide is formed. In yet other embodiments, the method further comprises optionally repeating steps (a) and (b) one or more times.

In certain embodiments, the monodentate ligand comprises at least one selected from the group consisting of alkyl, hydride, carbonyl, halide, alkoxide, alkylamide and silylamide.

In certain embodiments, the alkyl group comprises at least one selected from the group consisting of methyl, ethyl, n-propyl, and isopropyl.

In certain embodiments, the chelate comprises at least one selected from the group consisting of β-diketonate, amidinate, acetamidinate, β-diketiminate, diamino alkoxide (such as, but not limited to, 1-dimethylamino-2-methyl-2-propanolate or dmamp), and metallocene (such as, but not limited to, cyclopentadienyl or Cp).

In certain embodiments, the ligands on the metal precursor may be combinations of monodentate ligands, combinations of chelate ligands or combinations of monodentate and chelate ligands.

In certain embodiments, the solid substrate is contained in a single system and is sequentially contacted with the gaseous compound of the second metal in step (a) and the halogen-containing gas in step (b). In other embodiments, the solid substrate is purged with an inert gas after step (a) and/or step (b). In yet other embodiments, the inert gas comprises $N_2$ and/or Ar. In yet other embodiments, step (a) and/or step (b) is/are run at a temperature that is equal to or greater than a value ranging from about 100° C. to about 450° C.

In certain embodiments, the gaseous compound of the second metal in step (a) and the halogen-containing gas in step (b) are positioned at separate locations. The two reactants are separated in space rather than time (i.e., spatial ALE). The solid substrate is physically moved from one reactant location to another reactant location.

In certain embodiments, the first metal compound comprises at least one selected from the group consisting of metal oxide, metal nitride, metal phosphide, metal sulfide, metal arsenide, metal fluoride, metal silicide, metal boride, metal carbide, metal selenide, metal telluride, elemental metal, metal alloy, and hybrid organic-inorganic material (such as, but not limited to, metalcones, such as alucone, Lee et al., 2013, Adv. Funct. Mater. 23:532).

In certain embodiments, the solid substrate is first submitted to a chemical treatment that results in the formation, on at least a portion of the surface of the solid substrate, of a metal compound selected from the group consisting of a metal oxide, metal nitride, metal phosphide, metal sulfide, metal arsenide, metal fluoride, metal silicide, metal boride, metal carbide, metal selenide, metal telluride, elemental metal, metal alloy, and hybrid organic-inorganic material. In yet other embodiments, the first metal comprises at least one selected from the group consisting of Al, Hf, Zr, Fe, Ni, Co, Mn, Mg, Rh, Ru, Cr, Si, Ti, Sc, Ga, In, Zn, Pb, Ge, Ta, Cu, W, Mo, Pt, Cd and Sn.

In certain embodiments, the metal compound is an elemental metal that is directly fluorinated to form a metal fluoride.

In certain embodiments, the first metal compound is deposited on an inert substrate. In other embodiments, the inert substrate comprises Si. In yet other embodiments, the inert substrate comprises a Si wafer.

In certain embodiments, the second metal comprises at least one selected from the group consisting of Sn, Ge, Al, B, Ga, In, Zn, Ni, Pb, Si, Hf, Zr and Ti. In other embodiments, the β-diketonate comprises acac (acetylacetonate), hfac (hexafluoroacetylacetonate), tfac (trifluroacetylacetonate), and tmhd (tetramethylheptanedionate).

In certain embodiments, the halogen-containing gas comprises a hydrogen halide. In other embodiments, the hydrogen halide comprises HF. In yet other embodiments, the halogen-containing gas comprises at least one selected from the group consisting of $F_2$, $ClF_3$, $NF_3$, $SF_6$, $SF_4$, $XeF_2$, $Cl_2$, $Br_2$, $BCl_3$ and $I_2$. In yet other embodiments, the hydrogen halide comprises HCl, HBr or HI. In yet other embodiments, the halogen-containing gas may be ionized in a plasma to produce halogen radicals or ions.

In certain embodiments, the solid substrate is pretreated by sequential contacting with a gaseous compound of a second metal, and a halogen-containing gas. In other embodiments, the first metal compound is formed using atomic layer deposition. In yet other embodiments, each cycle of step (a) and step (b) is self-limiting. In yet other embodiments, each cycle of step (a) and step (b) allows for about the same etch rate and/or mass loss of the solid substrate. In yet other embodiments, the resulting etched solid substrate has about the same or lower surface roughness as the starting solid substrate. In yet other embodiments, the density of the etched solid substrate is about the same as of the starting solid substrate. In yet other embodiments, the refractive index of the etched solid substrate is about the same as of the initial solid substrate. In yet other embodiments, the solid substrate comprises a carbon composite.

In certain embodiments, the surface of the starting solid substrate is at least partially masked, whereby only a portion of the surface of the solid substrate is exposed. In other embodiments, the surface of the starting solid substrate is at least partially masked with a photoresist. In yet other embodiments, the solid substrate is further patterned using a technique selected from the group consisting of monolayer self-assemblying, nano-imprint and stamping.

Figure 28:
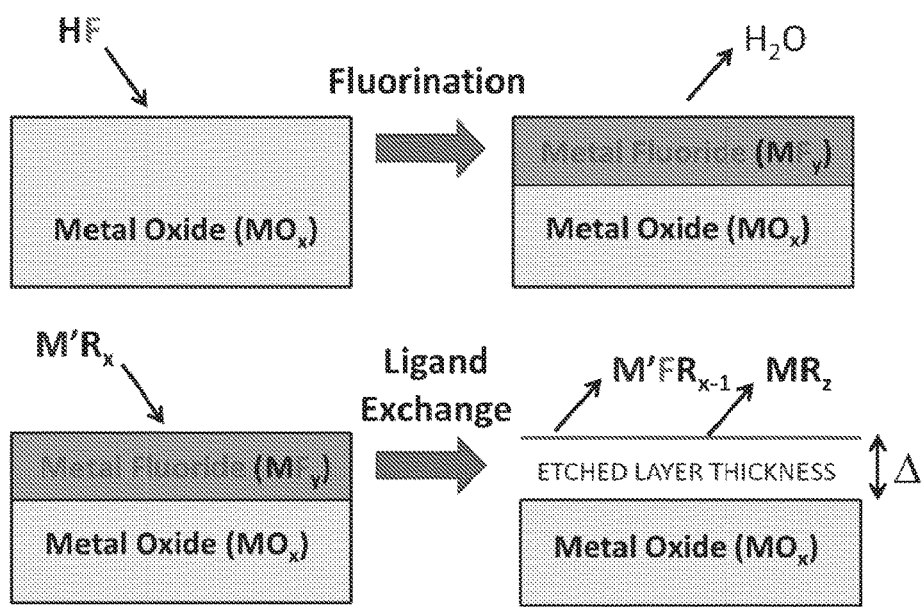
FIG. 28 is a schematic illustration of fluorination of a metal oxide surface using HF to form a metal fluoride layer and H$_2$O. Subsequently, a metal precursor removes the metal fluoride layer through a ligand exchange process.

A non-limiting illustration of a method of the invention is provided in FIG. 28. Without wishing to be limited by any theory, fluorination takes place, and then a possibly wide range of metal precursors can remove the metal fluoride layer through a ligand exchange process. In this process, the metal precursor accepts fluorine from the metal fluoride. The ligands on the metal precursor bind with the metal or metals in the metal fluoride to form volatile metal species.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomer and/or enantiomer of the compound described individual or in any combination. Although the description herein contains many embodiments, these should not be construed as limiting the scope of the invention but as merely providing illustrations of some of the presently preferred embodiments of the invention.

Those skilled in the art will recognize, or be able to ascertain using no more than routine experimentation, numerous equivalents to the specific procedures, embodiments, claims, and examples described herein. Such equivalents were considered to be within the scope of this invention and covered by the claims appended hereto. For example, it should be understood, that modifications in reaction conditions, including but not limited to reaction times, reaction temperature and pressure, reaction size/volume, and experimental reagents, such as solvents, catalysts, pressures, atmospheric conditions, e.g., nitrogen atmosphere, and reducing/oxidizing agents, with art-recognized alternatives and using no more than routine experimentation, are within the scope of the present application. In general the terms and phrases used herein have their art-recognized meaning, which can be found by reference to standard texts, journal references and contexts known to those skilled in the art. Any preceding definitions are provided to clarify their specific use in the context of the invention.

The following examples further illustrate aspects of the present invention. However, they are in no way a limitation of the teachings or disclosure of the present invention as set forth herein.

EXAMPLES

The invention is now described with reference to the following Examples. These Examples are provided for the purpose of illustration only, and the invention is not limited to these Examples, but rather encompasses all variations that are evident as a result of the teachings provided herein.

Materials and Methods
Viscous Flow Reactor Equipped for In Situ QCM Measurements The ALE reactions at 150-300° C. were performed in a viscous flow ALD reactor (Elam, et al., 2002, Rev Sci Instrum 73:2981-2987). A proportional-integral-derivative (PID) temperature controller (2604, Eurotherm) stabilized the temperature in the reactor to within ±0.04° C. A capacitance manometer (Baratron 121A, MKS) measured the pressure in the reactor. The ALD reactor was equipped with an in situ quartz crystal microbalance (QCM) (Elam, et al., 2002, Rev Sci Instrum 73:2981-2987). The RC-cut quartz crystal (Riha, et al., 2012, Rev Sci Instrum 83) (gold coated and polished, 6 MHz, Colnatec) was placed in a sensor head (BSH-150, Inficon) and then sealed with high temperature epoxy (Epo-Tek H21D, Epoxy technology). All in situ QCM measurements were recorded by a thin film deposition monitor (Maxtek TM-400, Inficon).

The $Al_2O_3$ ALE reactions in Example 1 were performed using sequential exposure of tin(II) acetylacetonate (Sn (acac)$_2$, 37-38% Sn, Gelest) and HF-pyridine (70 wt % HF, Sigma-Aldrich). These precursors are illustrated in FIG. 1. HF-pyridine is a liquid at room temperature and has an equilibrium with gaseous HF (Olah, et al., 1973, Synthesis-Stuttgart 779-780). Use of gaseous HF from HF-pyridine enables the safe handling of anhydrous HF.

Sn(acac)$_2$ and HF-pyridine were transferred to stainless steel bubblers in a dry $N_2$-filled glove bag. The stainless steel bubbler containing Sn(acac)$_2$ was held at 100° C. to produce a vapor pressure of 15-20 mTorr during dosing. The $Al_2O_3$ films were grown with $Al_2O_3$ ALD using TMA (97%, Sigma-Aldrich) and $H_2O$ (Chromasolv for HPLC, Sigma-Aldrich). The $HfO_2$ films were grown with $HfO_2$ ALD using tetrakisdimethylamido hafnium (TDMAH) (≥99.99%, Sigma-Aldrich) and $H_2O$. TDMAH was transferred to a stainless steel bubbler and maintained at 67° C. to produce a vapor pressure of 20 mTorr during dosing.

The GaN films were grown with GaN ALD using trisdimethylamido gallium (TDMAG) (98%, Sigma-Aldrich) and $NH_3$(Airgas 99.99+%). TDMAG was transferred to a stainless steel bubbler and maintained at 115° C. to produce a vapor pressure of 20 mTorr during dosing. TMA was also used for ALE reactant. Dimethylaluminum chloride (DMAC) (97%, Sigma-Aldrich) was also used for ALE reactant. TDMAG was also used for ALE reactant. The HF-pyridine, TMA, $H_2O$, and $NH_3$ precursors were maintained at room temperature.

The reactor was pumped using a mechanical pump (Pascal 2015SD, Alcatel). Three separate mass flow controllers (Type 1179A, MKS) delivered a constant total flow of 150 sccm of ultra-high purity (UHP) $N_2$ carrier gas into the reactor. Additional $N_2$ gas flow of 20 sccm using a metering bellows-sealed valve (SS-4BMG, Swagelok) prevented deposition on the backside of the QCM crystal (Elam, et al., 2002, Rev Sci Instrum 73:2981-2987). The total $N_2$ gas flow of 170 sccm produced a base pressure of ~1 Torr in the reactor.

Si Wafers, X-Ray Reflectivity and Spectroscopic Ellipsometry

Boron-doped Si (100) wafers (p-type, Silicon Valley Microelectronics) were cut into samples with dimensions of 2.5 cm by 2.5 cm. These substrates were used for $Al_2O_3$ ALD deposition. The Si wafers were first rinsed with acetone, isopropanol, and deionized water. Subsequently, the Si wafers were dried with UHP $N_2$ gas.

The ex situ x-ray reflectivity (XRR) scans were recorded by a high resolution x-ray diffractometer (Bede D1, Jordan Valley Semiconductors) using Cu Kα (λ=1.540 Å) radiation. The filament voltage and current in the x-ray tube were 40 kV and 35 mA, respectively. A 10 arcsec step size and a 5 s acquisition time were used for recording all XRR scans with a range of 300 to 6000 arcsec. The analysis software (Bede REFS, Jordan Valley Semiconductors) fitted the XRR scans to determine film thickness, film density and surface roughness.

Spectroscopic ellipsometry (SE) determined the film thicknesses and refractive index (Shannon, et al., 2002, J Phys Chem Ref Data 31:931-970). The measurement of Ψ and Δ were recorded using a spectroscopic ellipsometer (M-2000, J. A. Woollam) with a spectral range of 240 to 1700 nm and an incidence angle of 75°. The analysis software (CompleteEASE, J. A. Woollam) fitted Ψ and Δ based on a Sellmeier model to determine the thicknesses and refractive index of the film (Shannon, et al., 2002, J Phys Chem Ref Data 31:931-970).

Transmission Fourier Transform Infrared (FTIR) Spectroscopy

The FTIR spectrometer used was a Nicolet 6700 FTIR from Thermo Scientific, which was equipped with a high-sensitivity liquid-$N_2$-cooled mercury cadmium telluride (MCT-B) detector. The spectrometer, mirror, and detector setup were purged with dry, $CO_2$-free air. A total of 100 scans at 4 $cm^{-1}$ resolution from 400 to 4,000 $cm^{-1}$ were recorded for each collected spectrum.

The transmission FTIR measurements were conducted in a custom vacuum chamber. High surface area $ZrO_2$ nanoparticles with an average diameter of 20 nm were used to improve the signal-to-noise ratio. Some of the transmission FTIR measurements on $Al_2O_3$ ALE also utilized $SiO_2$ nanoparticles. The transmission FTIR measurements on $HfO_2$ ALE also utilized $SiO_2$ nanoparticles. Sample preparation involved pressing the $ZrO_2$ or $SiO_2$ nanoparticles into a tungsten grid support. The tungsten grids were 2×3 $cm^2$. Each grid was 50 μm thick with 100 grid lines per inch. The tungsten grid could be resistively heated using a DC power supply.

A consistent cleaning procedure of the $ZrO_2$ nanoparticles/grid support was used to produce a reproducible starting surface. Prior to film deposition, the temperature of the sample support was increased to 500° C. for about 2 minutes to clear adventitious carbon from the $ZrO_2$ nanoparticles. A $H_2O$ dose was then used to rehydroxylate the $ZrO_2$ surface. The $SiO_2$ nanoparticles were not subjected to the heating pretreatment because the $SiO_2$ nanoparticles are much more difficult to rehydroxylate after annealing.

Example 1

Figure 2:
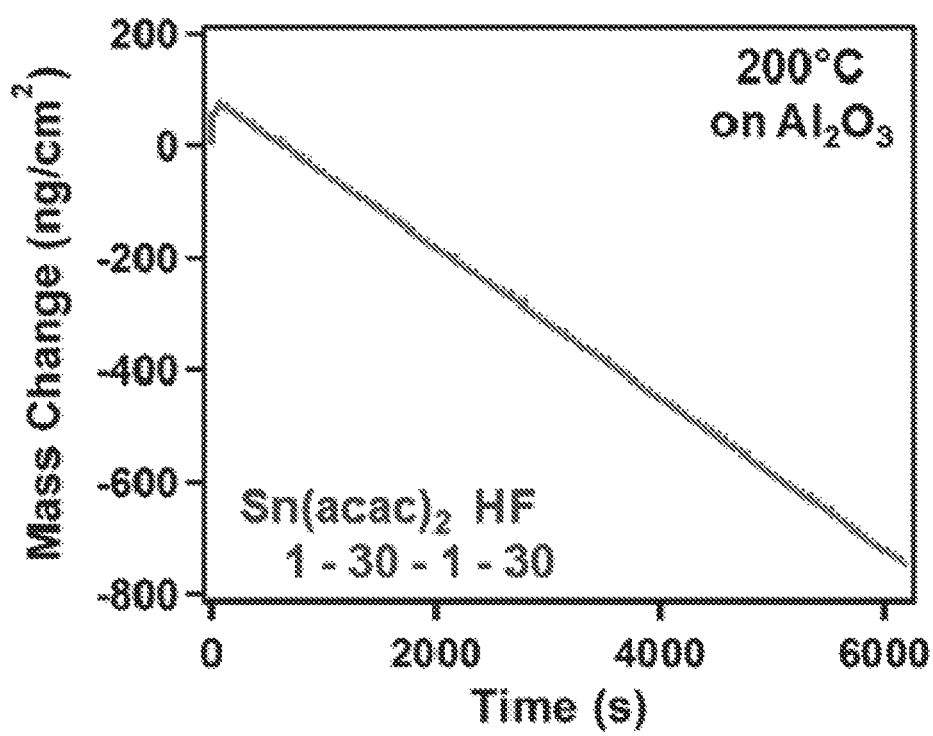
FIG. 2 is a graph illustrating mass change versus time for $Al_2O_3$ ALE using sequential $Sn(acac)_2$ and HF exposures at 200° C.

In certain aspects, this example illustrates $Al_2O_3$ ALE using $Sn(acac)_2$ and HF as the reactants. FIG. 2 illustrates the mass change during 100 ALE cycles of $Sn(acac)_2$ and HF reactions on an $Al_2O_3$ surface at 200° C. The initial $Al_2O_3$ ALD film on the QCM surface was prepared by 100 cycles of $Al_2O_3$ ALD using TMA and $H_2O$ at 200° C. One ALE cycle consisted of a $Sn(acac)_2$ dose of 1 s, an $N_2$ purge of 30 s, a HF dose of 1.0 s, and a second $N_2$ purge of 30 s. This reaction sequence is denoted as 1-30-1-30. Pressure transients during $Sn(acac)_2$ and HF doses were 20 mTorr and 80 mTorr, respectively.

The etching of the $Al_2O_3$ film in FIG. 2 is very linear and displays a mass change per cycle (MCPC) of −8.4 ng/($cm^2$ cycle). This MCPC corresponds to an etch rate of 0.28 Å/cycle based on the $Al_2O_3$ ALD film density of 3.0 g/$cm^3$ measured by XRR. All ALE cycles showed mass loss resulting from the etching of the $Al_2O_3$ film except during the first ALE cycle. The first cycle displays mass gains of $\Delta M_{Sn}$=57 ng/$cm^2$ and $\Delta M_{HF}$=13 ng/$cm^2$.

Without wishing to be limited by any theory, the mass gain for $\Delta M_{Sn}$ on the first cycle may be attributed to $Sn(acac)_2$ adsorption on the hydroxylated $Al_2O_3$ surface. $Sn(acac)_2$ could adsorb either associatively as $Sn(acac)_2$* or dissociatively as $Sn(acac)$* and $(acac)$*, where the asterisks designate a surface species. This adsorption would lead to a mass increase. In addition, the mass gain for $\Delta M_{HF}$ on the first cycle may be attributed to the formation of $AlF_3$ by the reaction of HF with the underlying $Al_2O_3$ surface. The reaction $Al_2O_3$+6HF→2$AlF_3$+3$H_2O$ is spontaneous with ΔG=−58 kcal at 200° C. This first cycle establishes the initial $Sn(acac)_2$ and $AlF_3$ species on the $Al_2O_3$ substrate.

Figure 3:
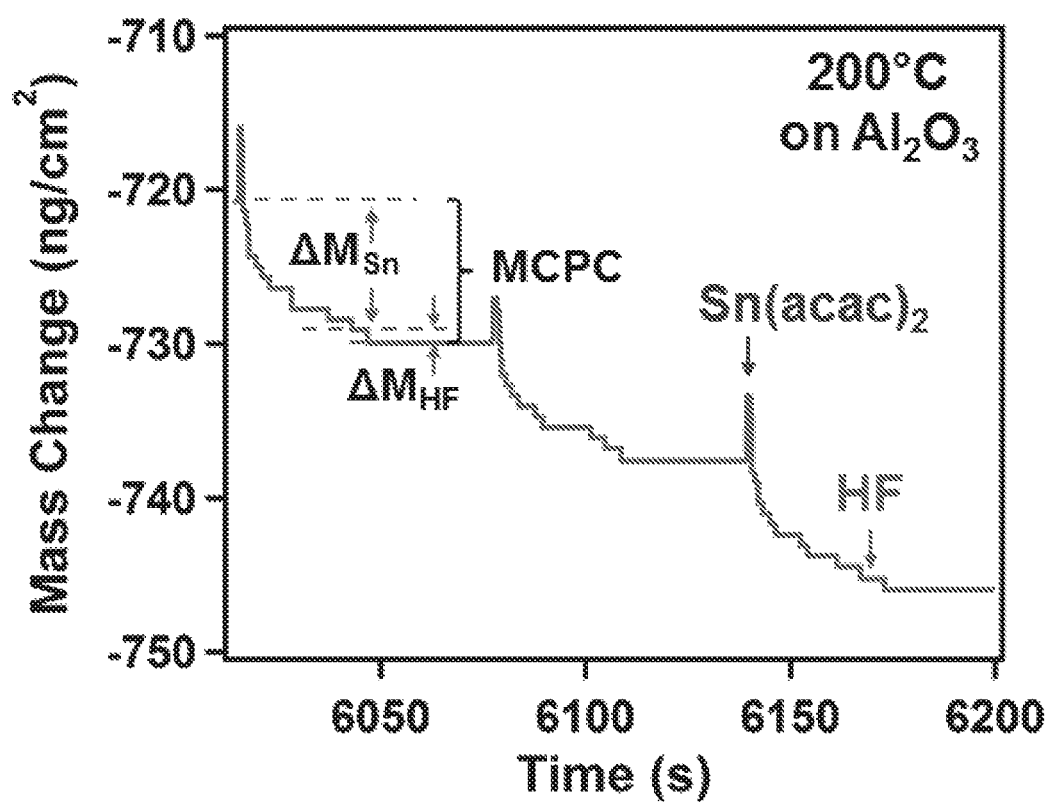
FIG. 3 is a graph illustrating an expansion of the linear region of FIG. 2 to illustrate the individual mass changes during the sequential $Sn(acac)_2$ and HF exposures at 200° C.

FIG. 3 corresponds to an enlargement of the mass losses versus time at 200° C. for three cycles in the steady state linear etching regime in FIG. 2. There was a gradual mass decrease after a short mass gain coinciding with the $Sn(acac)_2$ exposure. This behavior suggests $Sn(acac)_2$ adsorption, followed by either $Sn(acac)_2$ desorption and/or the removal of reaction products. A mass loss of $\Delta M_{Sa}$ of −8.1 ng/$cm^2$ was observed after 1.0 s of $Sn(acac)_2$ exposure. In contrast, the HF exposure led to little mass loss. A mass loss of $\Delta M_{HF}$ of −0.28 ng/$cm^2$ was observed after 1.0 s of HF exposure.

Figure 4A:
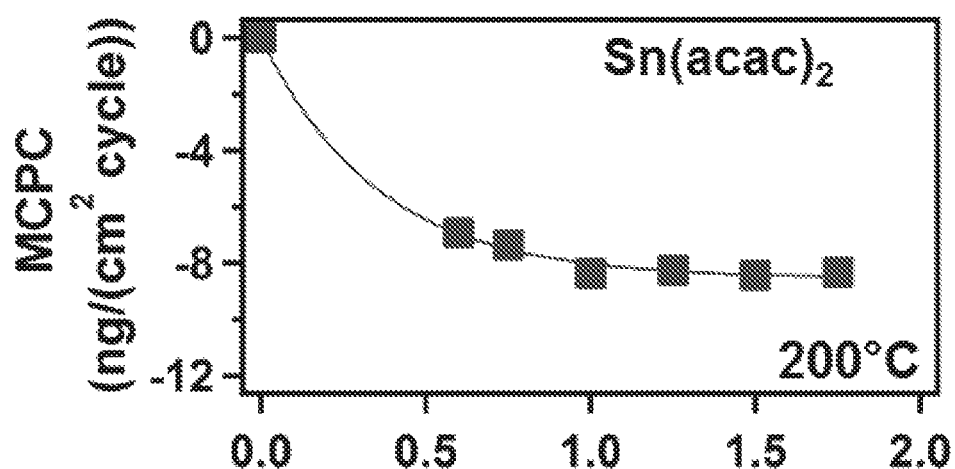
FIGS. 4A-4B are a set of graphs illustrating mass change per cycle (MCPC) versus precursor exposure time at 200° C. for (FIG. 4A) $Sn(acac)_2$ and (FIG. 4B) HF.
Figure 4B:
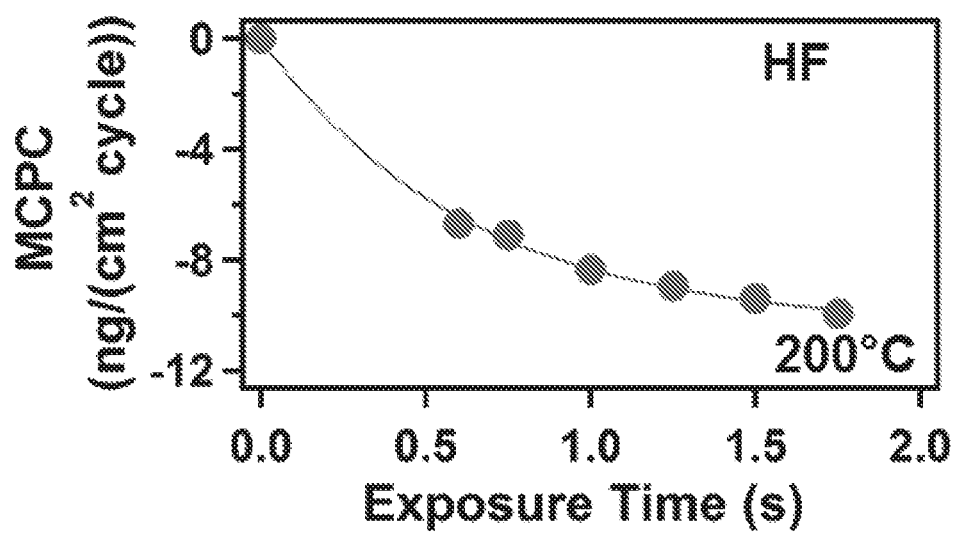

FIGS. 4A-4B illustrate the self-limiting nature of the $Al_2O_3$ ALE reactions at 200° C. These MCPCs were measured at different reactant exposure times.

FIG. 4A illustrates the self-limiting behavior of the $Sn(acac)_2$ reaction using different $Sn(acac)_2$ exposure times with a single 1.0 s exposure of HF. A constant $N_2$ purge of 30 s was used after each exposure. This reaction sequence can be denoted as x-30-1-30. The MCPC versus $Sn(acac)_2$ exposure time decreased quickly and leveled off at MCPC of −8 ng/($cm^2$ cycle).

FIG. 4B illustrates the self-limiting behavior of the HF reaction using different HF exposure times with a single 1.0 s exposure of $Sn(acac)_2$. This reaction sequence can be denoted as 1-30-x-30. The MCPC versus HF exposure time decreased and then leveled off at MCPC of −8 ng/($cm^2$ cycle). FIGS. 4A-4B together show that the $Sn(acac)_2$ and HF reactions display self-limiting behavior. The MCPC of −8 ng/($cm^2$ cycle) was independent of purge time for purge times between 20 s and 120 s.

Figure 5:
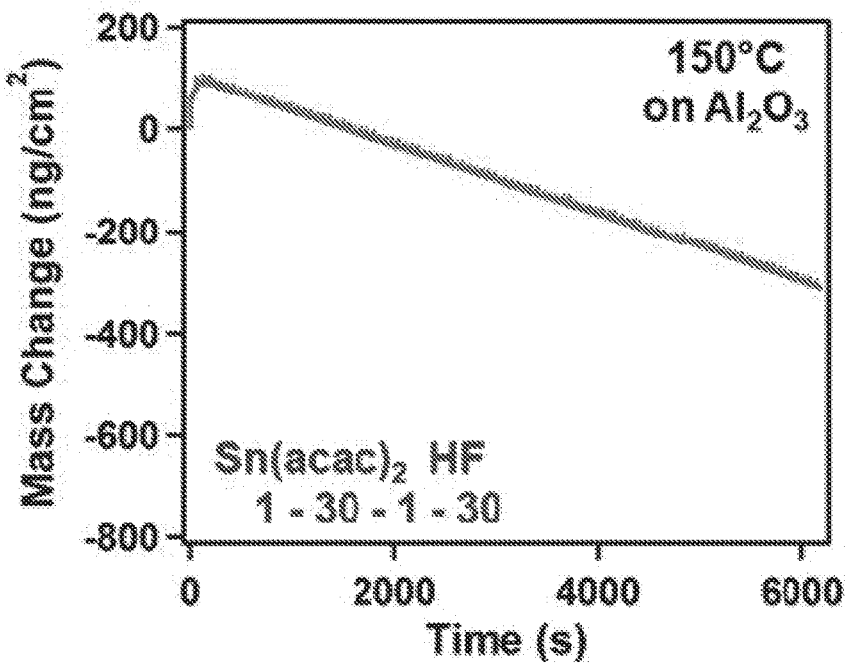
FIG. 5 is a graph illustrating mass change versus time for $Al_2O_3$ ALE using sequential $Sn(acac)_2$ and HF exposures at 150° C.

FIG. 5 illustrates the mass change during 100 ALE cycles of $Sn(acac)_2$ and HF reactions on an $Al_2O_3$ surface at 150° C. using a reaction sequence of 1-30-1-30. The initial $Al_2O_3$ film was prepared by 100 cycles of $Al_2O_3$ ALD using TMA and $H_2O$ at 150° C. The etching of the $Al_2O_3$ film was very linear and displayed a mass change per cycle (MCPC) of −4.1 ng/($cm^2$ cycle). This MCPC corresponds to an etch rate of 0.14 Å/cycle based on the $Al_2O_3$ ALD film density of 3.0 g/$cm^3$ measured by XRR.

Figure 6:
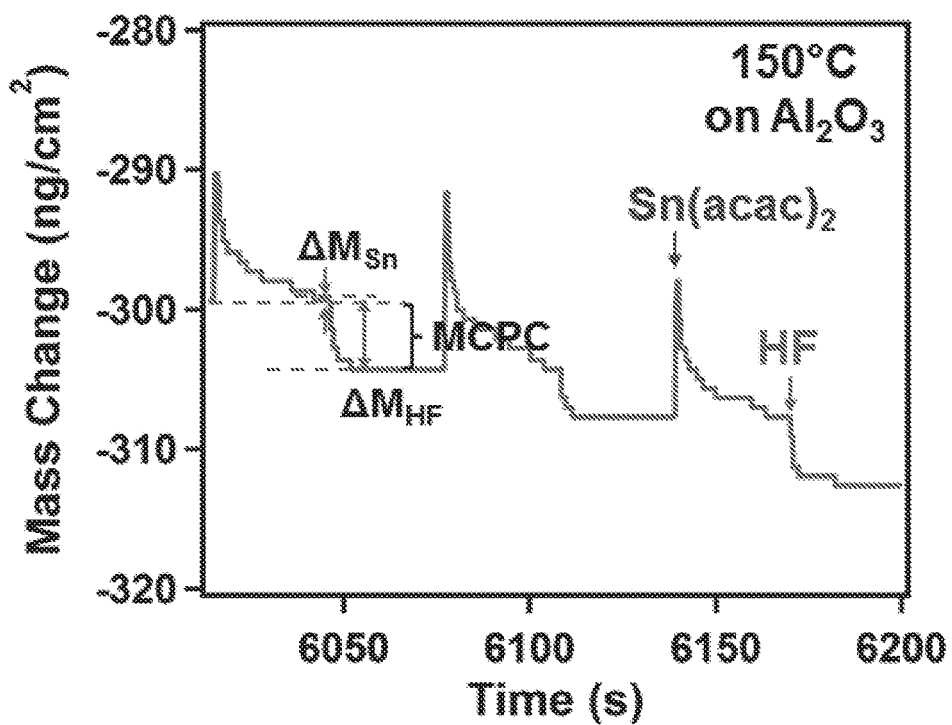
FIG. 6 is a graph illustrating an expansion of the linear region of FIG. 5 to illustrate the individual mass changes during the sequential $Sn(acac)_2$ and HF exposures at 150° C.

FIG. 6 illustrates an enlargement of the mass losses versus time at 150° C. for three cycles in the steady state linear etching regime in FIG. 5. There are distinct differences between the mass changes during the etching reactions at 200° C. and 150° C. A mass gain of $\Delta M_{Sn}$ of +0.19 ng/$cm^2$ was observed after the $Sn(acac)_2$ exposure for 1.0 s at 150° C. In contrast, a mass loss of $\Delta M_{Sn}$ of −8.1 ng/$cm^2$ was obtained at 200° C. This difference may be attributed to more stable $Sn(acac)_2$ reaction products on the surface at 150° C.

A mass decrease of $\Delta M_{HF}$ of −4.3 ng/$cm^2$ was observed after the HF exposure for 1.0 s at 150° C. This mass decrease was much larger than the mass decrease of $\Delta M_{HF}$ of −0.28 ng/cm² at 200° C. Without wishing to be limited by any theory, if more Sn(acac)$_2$ reaction products remain on the surface following the Sn(acac)$_2$ exposure at 150° C., then there are more Sn(acac)$_2$ reaction products that can be lost during the HF reaction. This behavior would explain the mass gain after the Sn(acac)$_2$ exposure and larger mass loss after the HF exposure at 150° C.

Figure 7A:
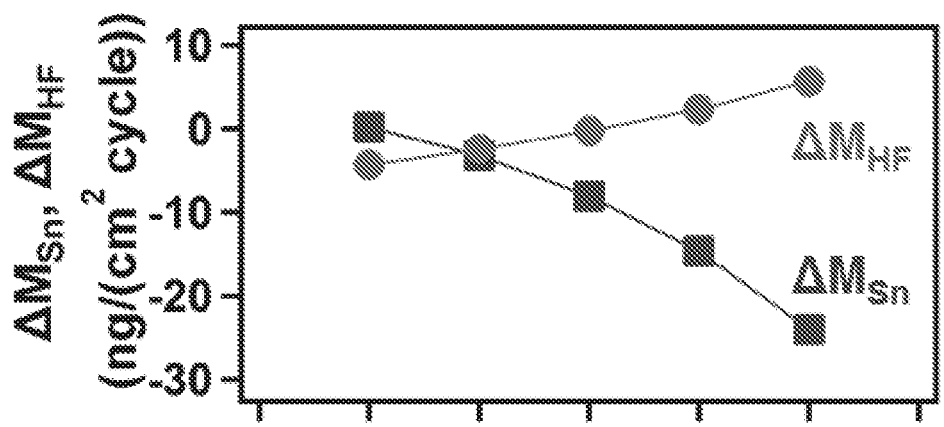
FIGS. 7A-7B are a set of graphs illustrating temperature dependence of (FIG. 7A) $\Delta M_{Sn}$ and $\Delta M_{HF}$ and (FIG. 7B) MCPC for $Al_2O_3$ ALE using $Sn(acac)_2$ and HF exposures.
Figure 7B:
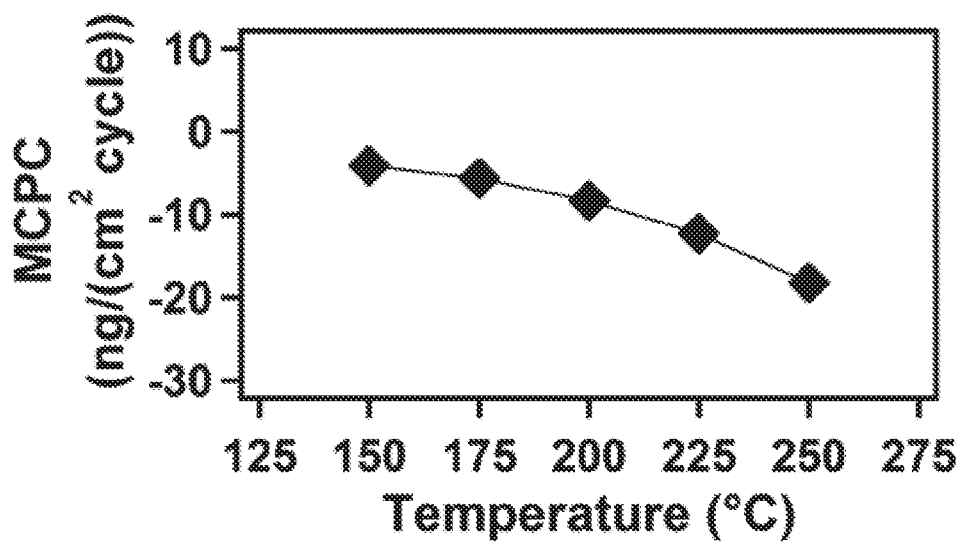

The $\Delta M_{Sn}$, $\Delta M_{HF}$, and MCPC values at all the reaction temperatures are illustrated in FIGS. 7A-7B. All ALE reactions were performed using a reaction sequence of 1-30-1-30 on initial Al$_2$O$_3$ surfaces. FIG. 7A illustrates the $\Delta M_{Sn}$ and $\Delta M_{HF}$ values obtained at different reaction temperatures. $\Delta M_{Sn}$ displayed a slight mass gain at 150° C. and progressively larger mass losses at higher temperatures. In contrast, $\Delta M_{HF}$ displayed a mass loss at temperatures between 150-200° C. and mass gains at higher temperatures.

FIG. 7B illustrates the MCPC where MCPC=$\Delta M_{Sn}$+$\Delta M_{HF}$. All the temperatures displayed a mass loss and the mass loss was larger at higher temperatures. The MCPC in FIG. 7B correlated with $\Delta M_{Sn}$ in FIG. 7A. This correspondence shows that the mass change during the Sn(acac)$_2$ reaction is primarily responsible for the temperature dependence of the mass loss during Al$_2$O$_3$ ALE. $\Delta M_{Sn}$, $\Delta M_{HF}$, and MCPC at the different reaction temperatures are summarized in Table 3.

TABLE 3

$\Delta M_{Sn}$, $\Delta M_{HF}$ and MCPC for Al$_2$O$_3$ ALE at different temperatures.

| Temperature (° C.) | $\Delta M_{Sn}$ ng/(cm² cycle) | $\Delta M_{HF}$ ng/(cm² cycle) | MCPC ng/(cm² cycle) |
|---|---|---|---|
| 150 | 0.19 | −4.3 | −4.1 |
| 175 | −3.2 | −2.4 | −5.6 |
| 200 | −8.1 | −0.28 | −8.4 |
| 225 | −14.6 | 2.3 | −12.3 |
| 250 | −24.0 | 5.7 | −18.3 |

Figure 8:
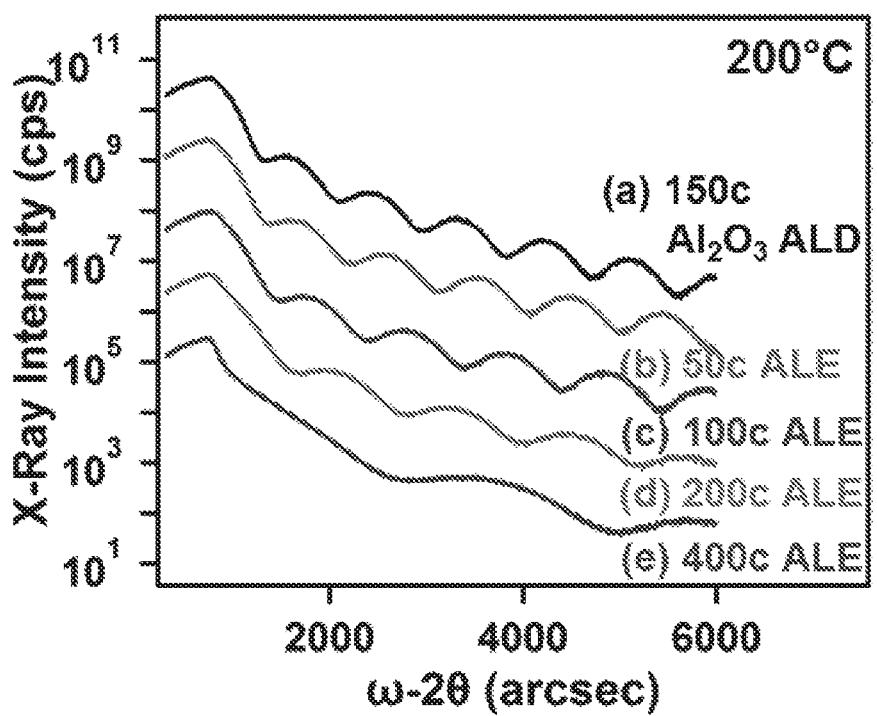
FIG. 8 is a graph illustrating X-ray reflectivity scans showing x-ray intensity versus incident angle for $Al_2O_3$ films on Si(100). (a) Initial $Al_2O_3$ film grown using 150 $Al_2O_3$ ALD cycles; and $Al_2O_3$ films after various numbers of $Al_2O_3$ ALE cycles using $Sn(acac)_2$ and HF exposures: (b) 50 cycles, (c) 100 cycles, (d) 200 cycles and (e) 400 cycles.

Al$_2$O$_3$ ALE was also examined using ex situ XRR studies. For these experiments, Al$_2$O$_3$ ALD films with a thickness of 172 Å were grown on Si(100) wafers at 200° C. These Al$_2$O$_3$ ALD films were deposited using 150 cycles of TMA and H$_2$O with a reaction sequence of 1-20-1-20. FIG. 8 illustrates XRR scans of the Al$_2$O$_3$ ALD films on the Si wafers versus number of Sn(acac)$_2$ and HF reaction cycles at 200° C. The XRR scans are consistent with very uniform and smooth Al$_2$O$_3$ films.

FIG. 8, curve (a) shows the XRR scan of the initial Al$_2$O$_3$ ALD film grown on Si(100). The Al$_2$O$_3$ ALD film thickness of 172 Å can be obtained by fitting the reflected x-ray intensity versus incident angle. FIG. 8, curves (b)-(e) illustrate XRR scans of the etched Al$_2$O$_3$ film after 50, 100, 200, and 400 ALE cycles at 200° C., respectively. The Al$_2$O$_3$ thicknesses decrease with increasing number of ALE cycles. This decreasing film thickness is in agreement with the decrease in the modulation of the x-ray intensity with higher numbers of ALE cycles.

The position of the critical angle of all the etched Al$_2$O$_3$ films is constant. This constant critical angle indicates that there was no change of the film density during the ALE reactions. The etched Al$_2$O$_3$ films were also very smooth and did not roughen versus Al$_2$O$_3$ ALE. The XRR measurements yielded a roughness of the initial Al$_2$O$_3$ ALD film of 5 Å. The surface roughness decreased slightly to 2-3 Å after 50, 100, 200, and 400 ALE cycles. The error in these XRR surface roughness measurements is ≤1 Å.

Figure 9:
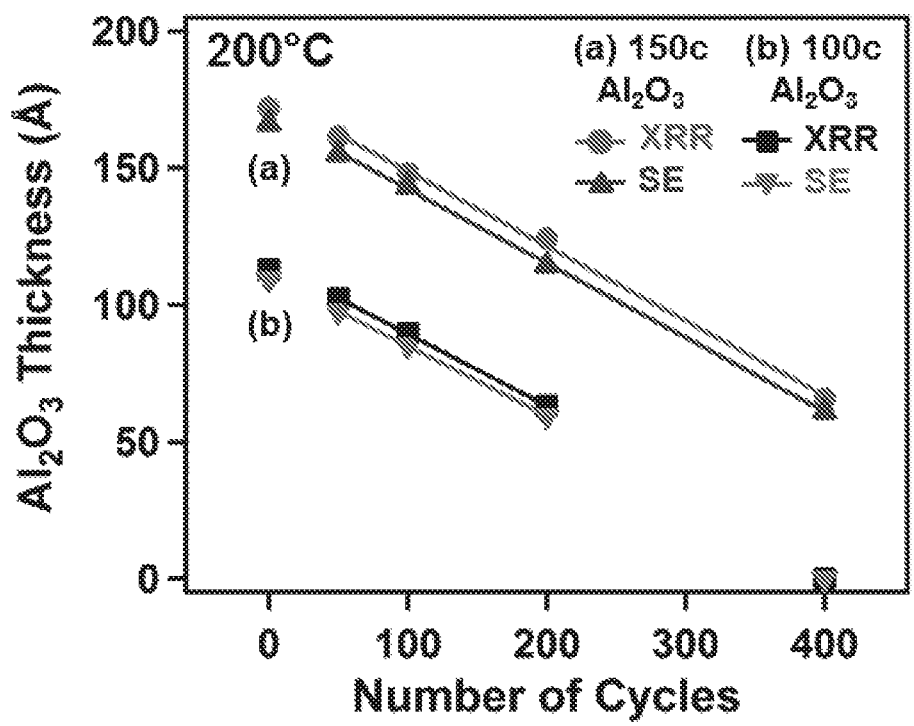
FIG. 9 is a graph illustrating X-ray reflectivity and spectroscopic ellipsometry measurements of $Al_2O_3$ film thickness versus number of $Al_2O_3$ ALE cycles using $Sn(acac)_2$ and HF for initial $Al_2O_3$ ALD films grown using (a) 150 $Al_2O_3$ ALD cycles and (b) 100 $Al_2O_3$ ALD cycles.

FIG. 9 illustrates the XRR measurements of the initial Al$_2$O$_3$ film thickness and the Al$_2$O$_3$ film thickness after 50, 100, 200, and 400 ALE cycles at 200° C. For the Al$_2$O$_3$ films with an initial thickness of 172 Å in FIG. 9, curve (a), the film thickness versus number of ALE cycles was very linear and yielded an etch rate of 0.27 Å/cycle. The spectroscopic ellipsometry (SE) measurements on these same samples yielded an etch rate of 0.27 Å/cycle with an initial Al$_2$O$_3$ ALD film thickness of 166 Å. The initial thickness of the Al$_2$O$_3$ film was not used to obtain the etch rate because of the mass gain that occurs on the first ALE cycle.

The y-intercepts for the linear least squares fitting in FIG. 9, curve (a), were 176 Å and 169 Å by XRR and SE, respectively. These thicknesses were slightly higher than initial thicknesses of 172 Å and 166 Å measured by XRR and SE, respectively. These larger thicknesses originate from the mass gain that occurs during nucleation of the ALE process on the first ALE cycle. The SE analysis also determined a refractive index of n=1.70 for the Al$_2$O$_3$ film at a wavelength of 589 nm. This refractive index for the Al$_2$O$_3$ film remained at n=1.69-1.70 after 50, 100 and 200 ALE cycles.

XRR measurements were also performed on Al$_2$O$_3$ ALD films with a thickness of 113 Å that were grown on Si(100) wafers. These Al$_2$O$_3$ ALD films were deposited at 200° C. using 100 cycles of TMA and H$_2$O with a reaction sequence of 1-20-1-20. FIG. 9, curve (b), displays the film thickness versus number of Sn(acac)$_2$ and HF reaction cycles at 200° C. The XRR measurements yielded an Al$_2$O$_3$ ALE etch rate of 0.26 Å/cycle. The SE measurements also yielded an etch rate of 0.25 Å/cycle with an initial Al$_2$O$_3$ ALD film thickness of 109 Å. The initial thickness of the Al$_2$O$_3$ film was again not employed to determine the etch rate because of the mass gain that occurs on the first ALE cycle.

The y-intercepts for the linear least squares fitting in FIG. 9, curve (b), were 116 Å and 110 Å by XRR and SE, respectively. These thicknesses were again slightly higher than the initial thicknesses of 113 Å and 109 Å measured by XRR and SE, respectively. These larger thicknesses originated from the mass gain that occurs on the first ALE cycle. After 400 ALE cycles for this thinner Al$_2$O$_3$ film, the XRR and SE measurements in FIG. 9, curve (b), indicate that the Al$_2$O$_3$ film is completely removed from the Si(100) wafer.

Figure 10:
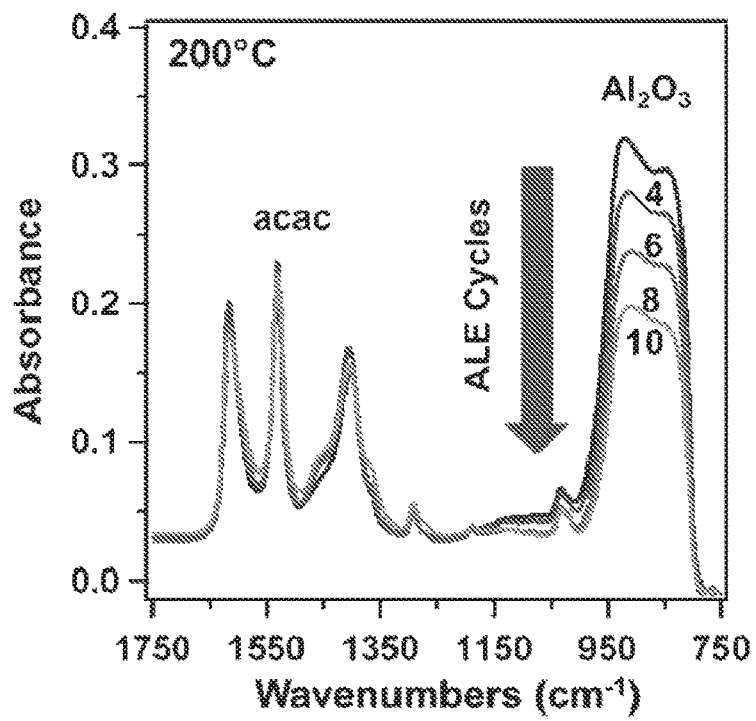
FIG. 10 is a graph illustrating the absolute infrared absorbance recorded using FTIR spectroscopy for the Al—O vibration in an $Al_2O_3$ film versus number of $Al_2O_3$ ALE cycles at 200° C. using $Sn(acac)_2$ and HF.

FIG. 10 illustrates the absolute infrared absorbance recorded using FTIR spectroscopy for the Al—O vibration in an Al$_2$O$_3$ film versus number of Al$_2$O$_3$ ALE cycles at 200° C. These spectra were referenced to the ZrO$_2$ particles that were used as a high surface area support to enhance the FTIR measurements. The initial Al$_2$O$_3$ film was grown using Al$_2$O$_3$ atomic layer deposition (ALD). During Al$_2$O$_3$ ALE, absorbance is progressively lost from the peak at 800-1000 cm$^{-1}$ corresponding to the Al—O vibration in Al$_2$O$_3$. In addition, the absorbance was observed from acac surface species at 1,350-1,650 cm$^{-1}$.

Figure 11:
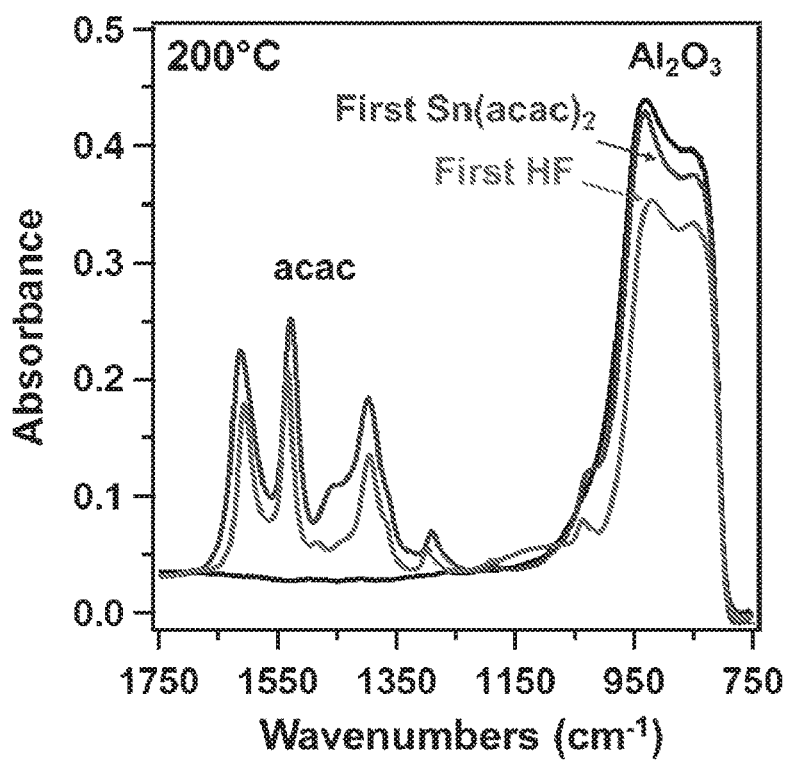
FIG. 11 is a graph illustrating the absolute infrared absorbance recorded using FTIR spectroscopy after the first $Sn(acac)_2$ exposure and first HF exposure on an $Al_2O_3$ film at 200° C.

FIG. 11 illustrates the absolute infrared absorbance recorded using FTIR spectroscopy after the first Sn(acac)$_2$ exposure and first HF exposure on an Al$_2$O$_3$ film at 200° C. These spectra were referenced to the ZrO$_2$ particles that were used as a high surface area support to enhance the FTIR measurements. The absorbance feature from acac surface species at 1,350-1,650 cm$^{-1}$ was present after the first Sn(acac)$_2$ and first HF exposures. The absorbance for the Al—O vibration in Al$_2$O$_3$ was reduced after the first Sn(acac)$_2$ exposure and the first HF exposure. This reduction occurs because of the acac species perturbing the Al$_2$O$_3$ and the HF exposure converting Al$_2$O$_3$ to AlF$_3$.

Figure 12:
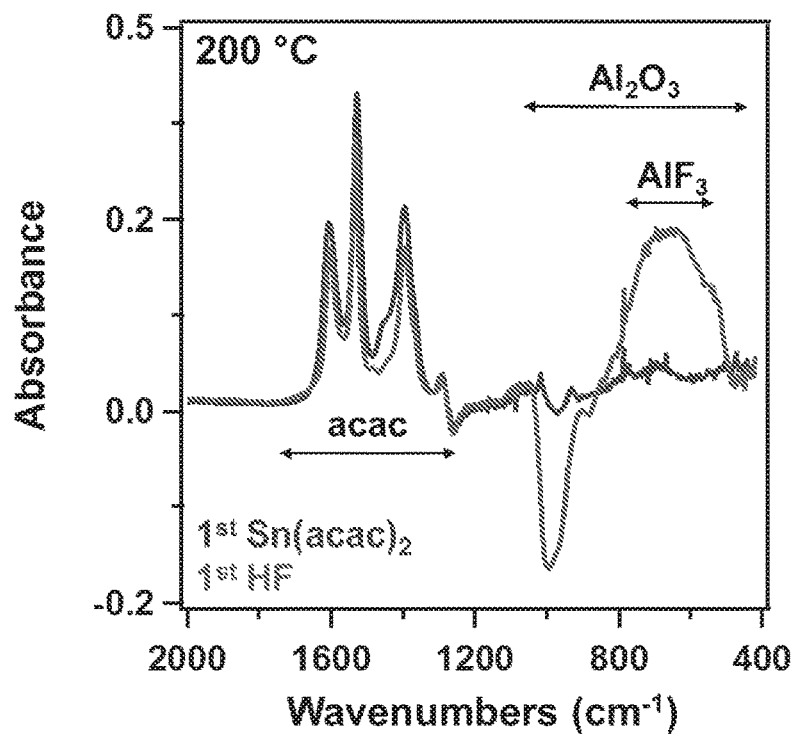
FIG. 12 is a graph illustrating the absolute infrared absorbance after the first $Sn(acac)_2$ exposure and first HF exposure on an $Al_2O_3$ film at 200° C.

FIG. 12 again illustrates the absolute infrared absorbance recorded using FTIR spectroscopy after the first Sn(acac)$_2$ exposure and first HF exposure on an Al$_2$O$_3$ film at 200° C. However, these spectra were referenced to the SiO$_2$ particles and the Al$_2$O$_3$ ALD film that coated the SiO$_2$ particles. The acac features were again observed at 1,350-1,650 cm$^{-1}$. In addition, an absorbance feature at 500-800 cm$^{-1}$ appeared after the 1$^{st}$ HF exposure. This feature originated from the Al—F vibration in the AlF$_3$ layer that forms from Al$_2$O$_3$ during the HF exposure. There was also an absorbance loss observed at ~1000 cm$^{-1}$ that corresponds with the removal of some absorbance from the Al—O vibration in Al$_2$O$_3$ upon AlF$_3$ formation.

Figure 13:
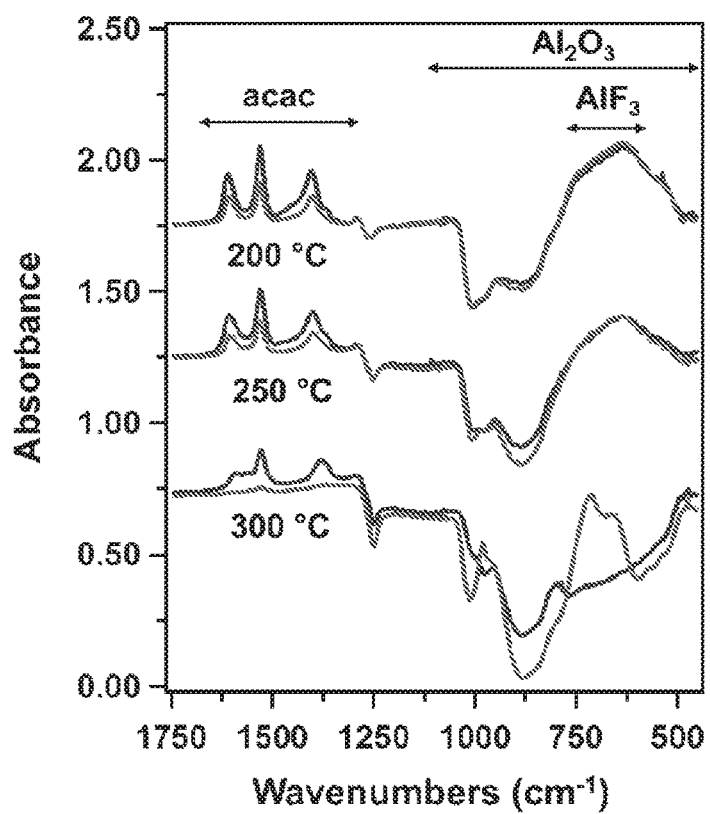
FIG. 13 is a graph illustrating the absolute infrared absorbance FTIR spectra during $Al_2O_3$ ALE using $Sn(acac)_2$ and HF at 200° C., 250° C. and 300° C.

FIG. 13 illustrates the absolute infrared absorbance FTIR spectra during Al$_2$O$_3$ ALE at 200° C., 250° C. and 300° C. These spectra were again referenced to the SiO$_2$ particles coated with the Al$_2$O$_3$ ALD film that were used as a high surface area support to enhance the FTIR measurements. The blue curves are after the Sn(acac)$_2$ exposures and the red curves were after the HF exposures. The absorbance feature from acac surface species at 1,350-1,650 cm$^{-1}$ were present after all the Sn(acac)$_2$ exposures. The acac surface species only decreased slightly at higher temperatures after the Sn(acac)$_2$ exposures. In contrast, the acac surface species were distinctly less following the HF exposures. The acac surface species were nearly completely removed from the surface by the HF exposure at 300° C.

FIG. 13 also indicates that the absorbance feature at 500-800 cm$^{-1}$ from the Al—F vibration in the AlF$_3$ adlayer was present at 200° C., 250° C. and 300° C. A loss was also observed from the broader absorbance feature assigned to the Al—O vibration in Al$_2$O$_3$. This loss appeared at 825-1,050 cm$^{-1}$ because the absorbance from the Al—F vibration from AlF$_3$ at 500-800 cm$^{-1}$ obscured the loss from the Al—O vibration in Al$_2$O$_3$ at lower frequencies. The spectra after the Sn(acac)$_2$ and HF exposures were similar at 200° C. and 250° C.

In contrast, the spectra were distinctly different at 300° C. where the absorbance from the Al—F vibration was nearly completely removed after the Sn(acac)$_2$ exposure and then reappeared after the HF exposure. The absorbance feature for the Al—F vibration was also narrower at 300° C. This narrow absorbance peak was attributed to the removal of absorbance from the Al—O vibration in Al$_2$O$_3$ that overlaps with the absorbance from the Al—F vibration in the AlF$_3$ molecules comprising the AlF$_3$ adlayer.

Figure 14:
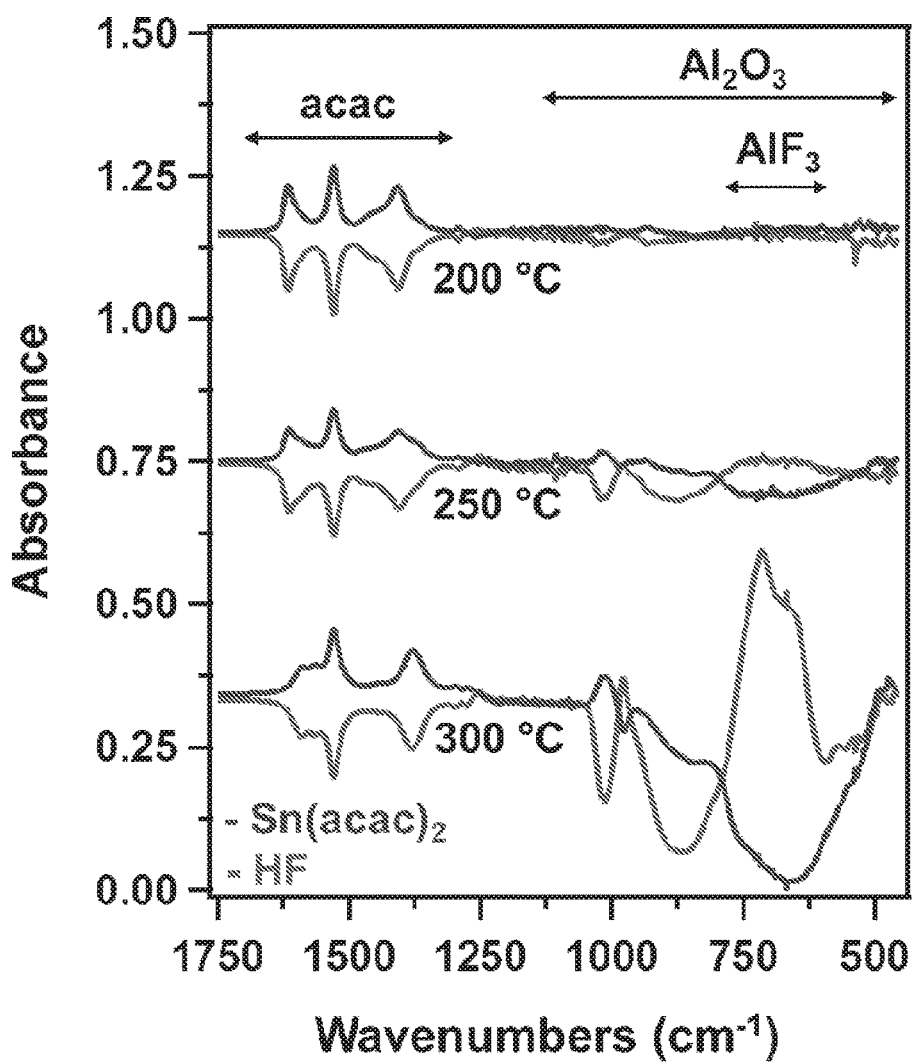
FIG. 14 is a graph illustrating the difference infrared absorbance FTIR spectra during $Al_2O_3$ ALE using $Sn(acac)_2$ and HF at 200° C., 250° C. and 300° C.

FIG. 14 illustrates the difference infrared absorbance FTIR spectra during Al$_2$O$_3$ ALE at 200° C., 250° C. and 300° C. The blue curves are after the Sn(acac)$_2$ exposures and the red curves are after the HF exposures. These difference FTIR spectra correspond to the absolute FTIR spectra shown in FIG. 13. These difference FTIR spectra are referenced with respect to the sample after the previous reactant exposure. The absolute FTIR spectra are referenced with respect to the initial sample prior to Al$_2$O$_3$ ALE.

The difference spectra in FIG. 14 highlight the absorbance changes that occur during the sequential ALE reactions. The absorbance changes for the acac surface species are nearly mirror images of each other after the Sn(acac)$_2$ and HF exposures at 200° C., 250° C. and 300° C. In contrast, the Al—F vibration from the AlF$_3$ molecules in the AlF$_3$ adlayer shows little change at 200° C. and nearly mirror image changes after the Sn(acac)$_2$ and HF exposures at 250° C. At 300° C., the absorbance for the Al—F vibration dramatically appears after the HF exposure and is lost after the Sn(acac)$_2$ exposure.

Figure 15:
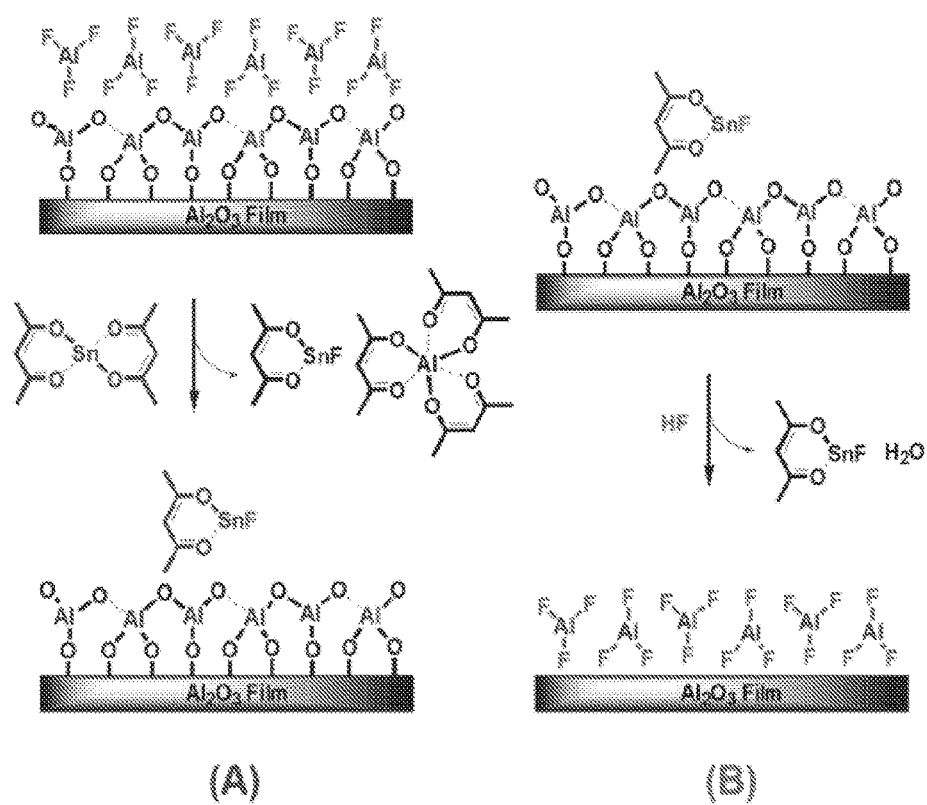
FIG. 15 is a schematic of a non-limiting proposed reaction mechanism for $Al_2O_3$ ALE showing (A) $Sn(acac)_2$ reaction and (B) HF reaction.

FIG. 15 shows the schematic for a non-limiting illustration of the ALE reaction mechanism. This mechanism is based on the mass changes during the Sn(acac)$_2$ and HF exposures as determined by the QCM measurements and the analysis of the surface species by the FTIR studies. During the Sn(acac)$_2$ reaction (A), the Sn(acac)$_2$ reacts with the AlF$_3$ layer on the Al$_2$O$_3$ substrate. This AlF$_3$ layer is formed from the reaction of Al$_2$O$_3$ with Sn(acac)$_2$ and HF after several ALE reactions on the initial Al$_2$O$_3$ surface. The Sn(acac)$_2$ reacts with the AlF$_3$ layer to form volatile SnF(acac) and Al(acac)$_3$ reaction products and SnF(acac)* surface species. After the AlF$_3$ layer is lost resulting from Al(acac)$_3$ and SnF(acac) product formation, there may be a strong interaction between SnF(acac)* surface species and the underlying Al$_2$O$_3$ substrate. This interaction may lead to SnF (acac)* species adsorbed to the Al$_2$O$_3$ substrate.

During the HF reaction (B), HF reacts with the underlying Al$_2$O$_3$ surface to form a new layer of AlF$_3$ molecules comprising the AlF$_3$ adlayer. The formation of the AlF$_3$ layer also leads to the removal of the SnF(acac)* species. In addition, HF also provides hydrogen to form H$_2$O as a reaction product. This reaction removes the oxygen in Al$_2$O$_3$.

The AlF$_3$ layer is then ready for the next Sn(acac)$_2$ reaction.

This overall proposed reaction can be expressed as:

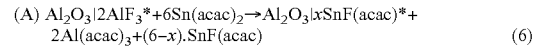

(A) Al$_2$O$_3$|2AlF$_3$*+6Sn(acac)$_2$→Al$_2$O$_3$|xSnF(acac)*+ 2Al(acac)$_3$+(6−x).SnF(acac)    (6)

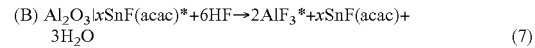

(B) Al$_2$O$_3$|xSnF(acac)*+6HF→2AlF$_3$*+xSnF(acac)+ 3H$_2$O    (7)

The Al$_2$O$_3$ shown in Equations 6 and 7 is the amount of Al$_2$O$_3$ that is etched during the ALE reactions. The asterisks indicate the surface species and the vertical lines are used to separate the various surface species. x is a parameter determined by the relative $\Delta M_{Sn}$ and $\Delta M_{HF}$ mass changes. To obtain agreement with the relative $\Delta M_{Sn}$ and $\Delta M_{HF}$ mass changes in Table 2, x=0.74, 0.46, 0.29, 0.19, and 0.15 at 150° C., 175° C., 200° C., 225° C. and 250° C., respectively. AlF$_3$ is an important reaction intermediate. The AlF$_3$ adlayer is formed during the HF exposure and then removed during the Sn(acac)$_2$ exposure.

Equations 6 and 7 show the species that change during Al$_2$O$_3$ ALE. Without wishing to be limited by any theory, there may be other surface species that reside on the surface and do not change during Al$_2$O$_3$ ALE; these species were not detected by the QCM measurements. However, these species were observed by FTIR spectroscopy. The production of all the Al(acac)$_3$ is assumed to occur during reaction (A). Al(acac)$_3$ is a stable metal β-diketonate with a vapor pressure of ~3-4 Torr at 150° C. (Eisentra & Sievers, 1967, J. Inorg. Nucl. Chem. 29:1931; Fahlman & Barron, 2000, Adv. Mater. Opt. Electr. 10:223-232; Berg & Truemper, 1965, Anal. Chim. Acta 32:245).

Without wishing to be limited by any theory, the temperature dependence of $\Delta M_{Sn}$ and $\Delta M_{HF}$ may be dependent on the amount of SnF(acac)* surface species remaining after the Sn(acac)$_2$ exposure. The mass gain after Sn(acac)$_2$ exposure and larger mass loss after HF exposure at 150° C. can be explained by the SnF(acac)* surface species. More SnF (acac)* surface species remain after reaction A at 150° C. Subsequently, more SnF(acac)* surface species are lost in reaction B at 150° C.

Example 2

Figure 16:
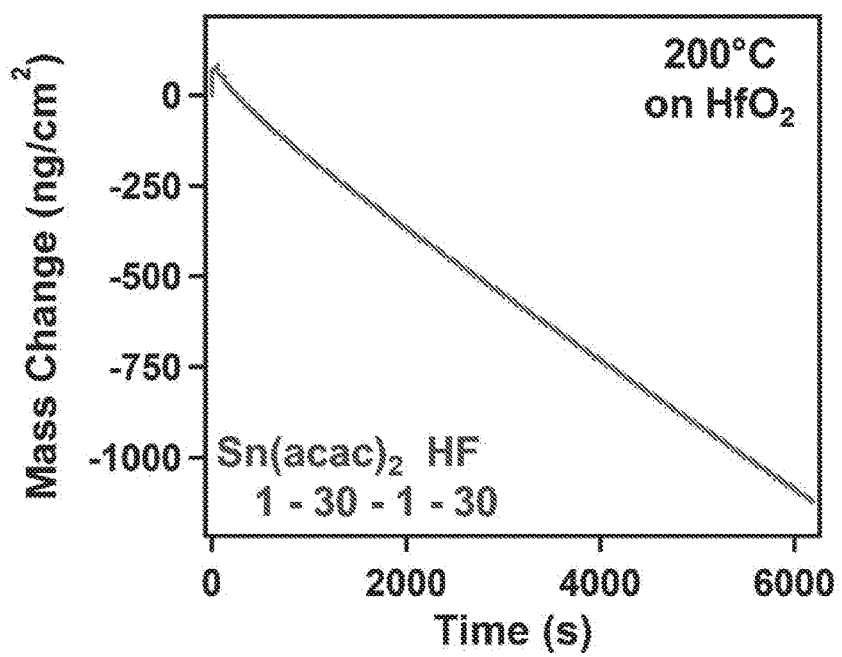
FIG. 16 is a graph illustrating the mass change versus time for $HfO_2$ ALE using sequential $Sn(acac)_2$ and HF exposures at 200° C.

In certain aspects, this example illustrates HfO$_2$ ALE using Sn(acac)$_2$ and HF as the reactants. FIG. 16 illustrates the mass change during 100 ALE cycles of Sn(acac)$_2$ and HF reactions on an HfO$_2$ surface at 200° C. The initial HfO$_2$ ALD film on the QCM surface was prepared by 100 cycles of HfO$_2$ ALD using TDMAH and H$_2$O at 200° C. One ALE cycle consisted of a Sn(acac)$_2$ dose of 1 s, an N$_2$ purge of 30 s, a HF dose of 1.0 s, and a second N$_2$ purge of 30 s. This reaction sequence is denoted as 1-30-1-30. Pressure transients during Sn(acac)$_2$ and HF doses were 20 mTorr and 80 mTorr, respectively.

The etching of the HfO$_2$ film in FIG. 16 was very linear and displayed a mass change per cycle (MCPC) of −11.1 ng/(cm$^2$ cycle). This MCPC corresponds to an etch rate of 0.11 Å/cycle based on the HfO$_2$ ALD film density of 9.7 g/cm$^3$ measured by XRR. All ALE cycles showed mass loss resulting from the etching of the HfO$_2$ film except during the first ALE cycle. The first cycle displays mass gains of $\Delta M_{Sn}$=71 ng/cm$^2$ and $\Delta M_{HF}$=6 ng/cm$^2$.

Without wishing to be limited by any theory, the mass gain for $\Delta M_{Sn}$ on the first cycle may be attributed to Sn(acac)$_2$ adsorption on the hydroxylated HfO$_2$ surface. Sn(acac)$_2$ could adsorb either associatively as Sn(acac)$_2$* or dissociatively as Sn(acac)* and (acac)*, where the asterisks designate a surface species. This adsorption would lead to a mass increase. In addition, the mass gain for $\Delta M_{HF}$ on the first cycle may be attributed to the formation of HfF$_4$ by the reaction of HF with the underlying HfO$_2$ surface. The reaction HfO$_2$+4HF→HfF$_4$+2H$_2$O is spontaneous with $\Delta G$=−19 kcal at 200° C. This first cycle establishes the initial Sn(acac)$_2$ and HfF$_4$ species on the HfO$_2$ substrate.

Figure 17:
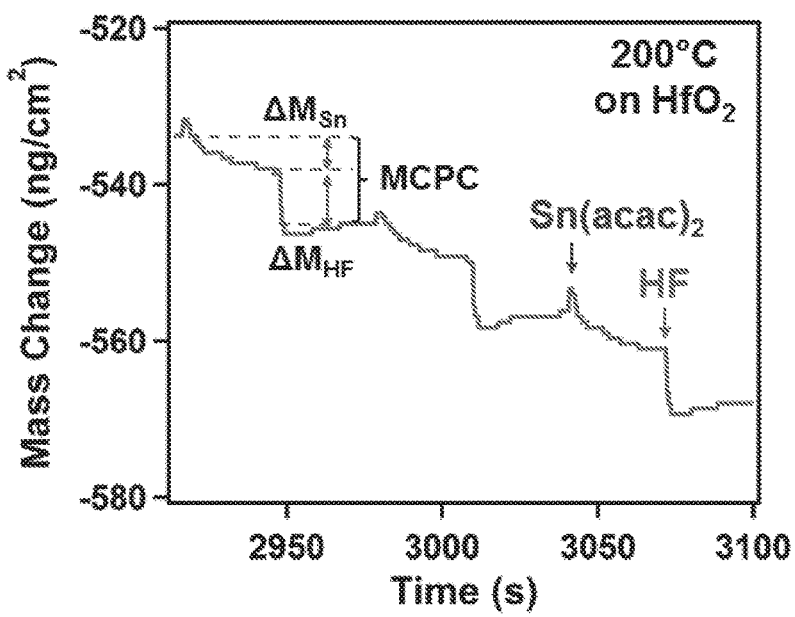
FIG. 17 is a graph illustrating an expansion of the linear region of FIG. 16. This expansion highlights the individual mass changes during the sequential Sn(acac)$_2$ and HF exposures at 200° C.

FIG. 17 corresponds to an enlargement of the mass losses versus time at 200° C. for three cycles in the steady state linear etching regime in FIG. 16. There was a gradual mass decrease after a little mass gain coinciding with the Sn(acac)$_2$ exposure. Without wishing to be limited by any theory, this behavior suggests Sn(acac)$_2$ adsorption, followed by either Sn(acac)$_2$ desorption and/or the removal of reaction products. A mass loss of $\Delta M_{Sn}$ of −4.8 ng/cm$^2$ was observed after 1.0 s of Sn(acac)$_2$ exposure. In contrast, the HF exposure led to a mass loss of $\Delta M_{HF}$ of −6.3 ng/cm$^2$ after 1.0 s of HF exposure.

Figure 18A:
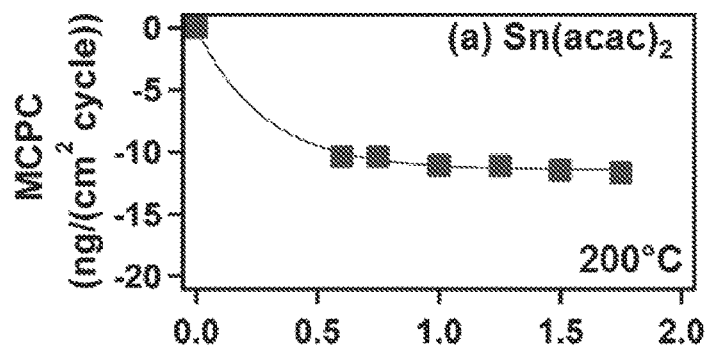
FIGS. 18A-18B are graphs illustrating the MCPC versus exposure time at 200° C. for (FIG. 18A) Sn(acac)$_2$ with the HF exposure fixed at 1.0 s, and (FIG. 18B) HF with the Sn(acac)$_2$ exposure fixed at 1.0 s.
Figure 18B:
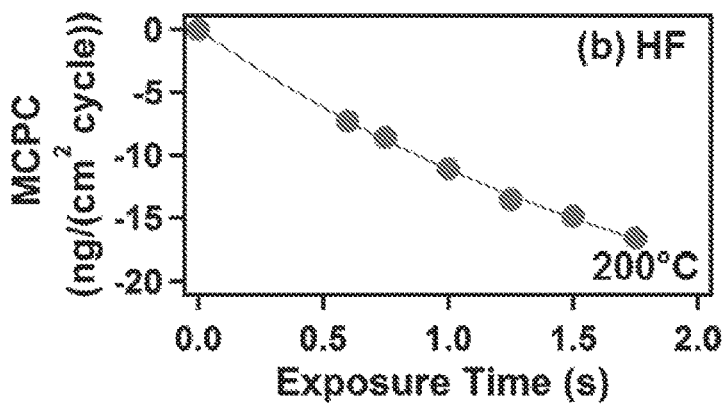

FIGS. 18A and 18B are graphs illustrating the MCPC versus exposure time for Sn(acac)$_2$ with the HF exposure fixed at 1.0 s (FIG. 18A) and HF with the Sn(acac)$_2$ exposure fixed at 1.0 s (FIG. 18B) at 200° C. FIG. 18A illustrates the self-limiting behavior of the Sn(acac)$_2$ reaction using different Sn(acac)$_2$ exposure times with a single 1.0 s exposure of HF. A constant N$_2$ purge of 30 s was used after each exposure. This reaction sequence can be denoted as x-30-1-30. The MCPC versus Sn(acac)$_2$ exposure time decreased quickly and leveled off at MCPC of −11 ng/(cm$^2$ cycle).

FIG. 18B illustrates behavior of the HF reaction using different HF exposure times with a single 1.0 s exposure of Sn(acac)$_2$. This reaction sequence can be denoted as 1-30-x-30. The MCPC decreased versus HF exposure time and showed only slight signs of reaching a limiting value. Without wishing to be limited by any theory, this behavior may be due to an inadequate HF purge time that allows HF to be present during the Sn(acac)$_2$ exposure and leads to chemical vapor etching (CVE).

Figure 19:
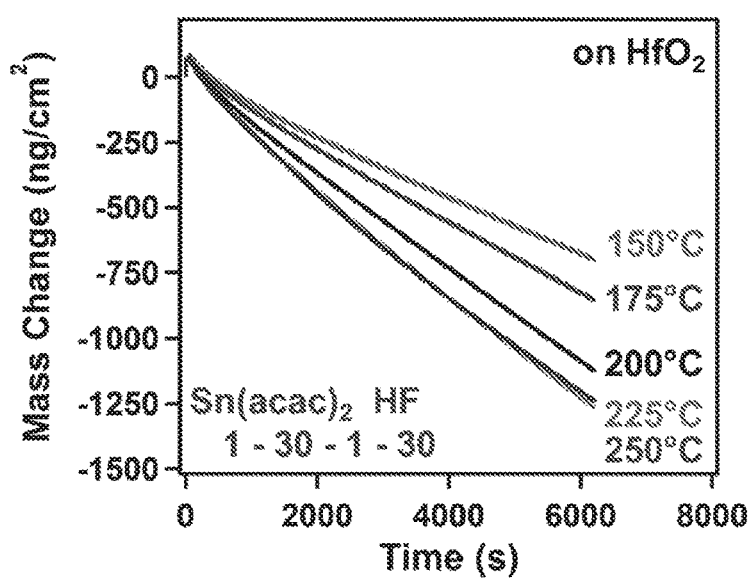
FIG. 19 is a graph illustrating mass change versus time for HfO$_2$ ALE using sequential Sn(acac)$_2$ and HF exposures at various temperatures from 150° C. to 250° C.

FIG. 19 is a graph illustrating mass change versus time for HfO$_2$ ALE using sequential Sn(acac)$_2$ and HF exposures at various temperatures from 150° C. to 250° C. The etchings of the HfO$_2$ films at various temperatures were very linear. The mass change per cycle (MCPC) was −6.7 ng/(cm$^2$ cycle) at 150° C. and increased to −11 ng/(cm$^2$ cycle) at 250° C. These MCPCs corresponds to etch rates of 0.07 Å/cycle at 150° C. and 0.11 Å/cycle at 250° C. based on the HfO$_2$ ALD film density of 9.7 g/cm$^3$ measured by XRR. All ALE cycles showed mass loss resulting from the etching of the HfO$_2$ film except during the first ALE cycle. The first cycle displayed mass gains that may be due to Sn(acac)$_2$ adsorption and the formation of an HfF$_4$ layer.

Figure 20A:
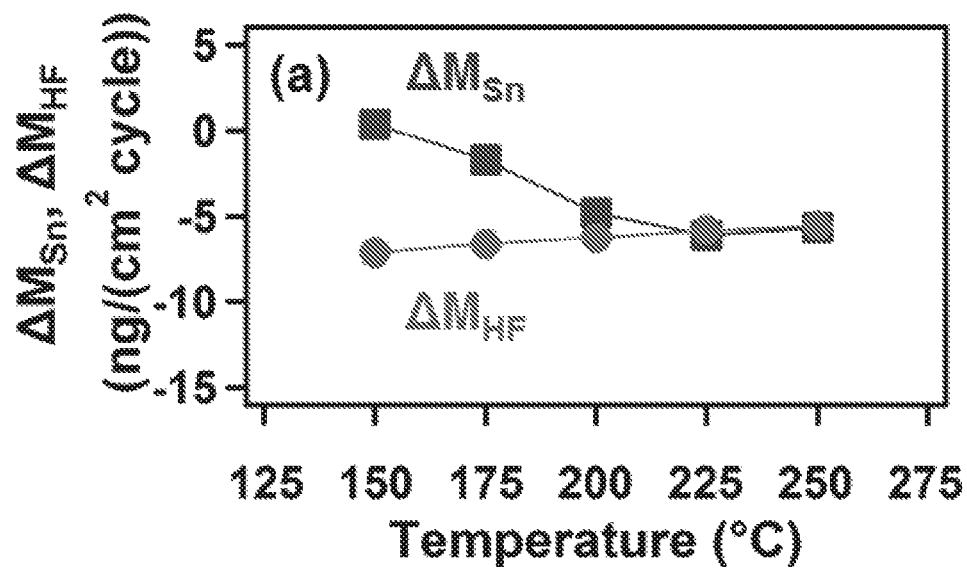
FIGS. 20A-20B are graphs illustrating (FIG. 20A) $\Delta M_{Sn}$ and $\Delta M_{HF}$ and (FIG. 20B) total mass change per cycle (MCPC) for HfO$_2$ ALE versus temperature using Sn(acac)$_2$ and HF exposures.
Figure 20B:
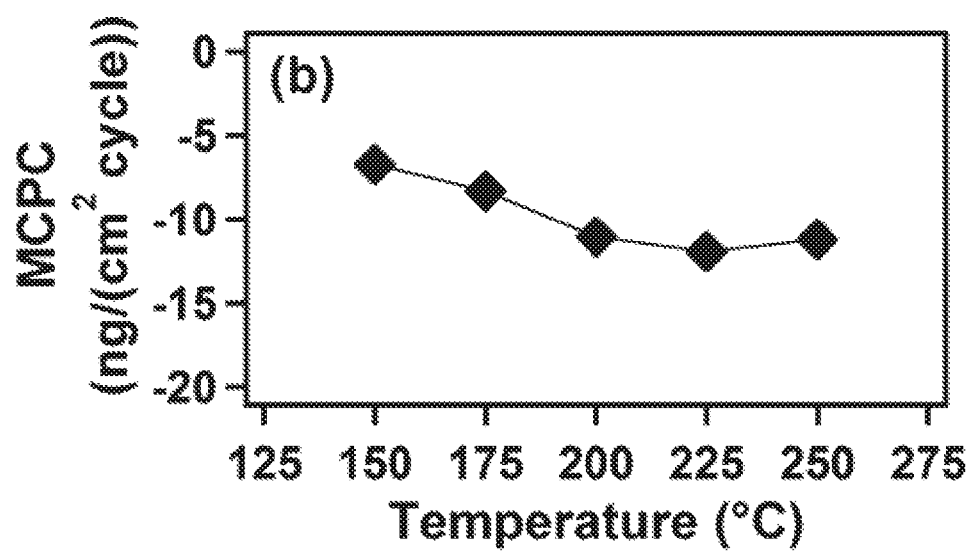

The $\Delta M_{Sn}$, $\Delta M_{HF}$, and MCPC values at all the reaction temperatures for HfO$_2$ ALE are illustrated in FIGS. 20A-20B. All ALE reactions were performed using a reaction sequence of 1-30-1-30 on initial HfO$_2$ surfaces. FIG. 20A illustrates the $\Delta M_{Sn}$ and $\Delta M_{HF}$ values obtained at different reaction temperatures. $\Delta M_{Sn}$ displayed a slight mass gain at 150° C. and progressively larger mass losses at higher temperatures. In contrast, $\Delta M_{HF}$ displayed a mass loss at temperatures between 150-200° C. and mass gains at higher temperatures.

FIG. 20B illustrates the MCPC where MCPC=$\Delta M_{Sn}$+$\Delta M_{HF}$. All the temperatures displayed a mass loss and the mass loss was larger at higher temperatures. The MCPC in FIG. 20B correlated with $\Delta M_{Sn}$ in FIG. 20A. This correspondence shows that the mass change during the Sn(acac)$_2$ reaction is primarily responsible for the temperature dependence of the mass loss during HfO$_2$ ALE. $\Delta M_{Sn}$, $\Delta M_{HF}$, and MCPC at the different reaction temperatures for HfO$_2$ ALE are summarized in Table 4.

TABLE 4

$\Delta M_{Sn}$, $\Delta M_{HF}$ and MCPC for HfO$_2$ ALE at different temperatures.

| Temperature (° C.) | $\Delta M_{Sn}$ ng/(cm$^2$ cycle) | $\Delta M_{HF}$ ng/(cm$^2$ cycle) | MCPC ng/(cm$^2$ cycle) |
|---|---|---|---|
| 150 | 0.37 | −7.1 | −6.7 |
| 175 | −1.7 | −6.6 | −8.3 |
| 200 | −4.8 | −6.3 | −11.1 |
| 225 | −6.1 | −5.8 | −11.9 |
| 250 | −5.6 | −5.6 | −11.2 |

Figure 21:
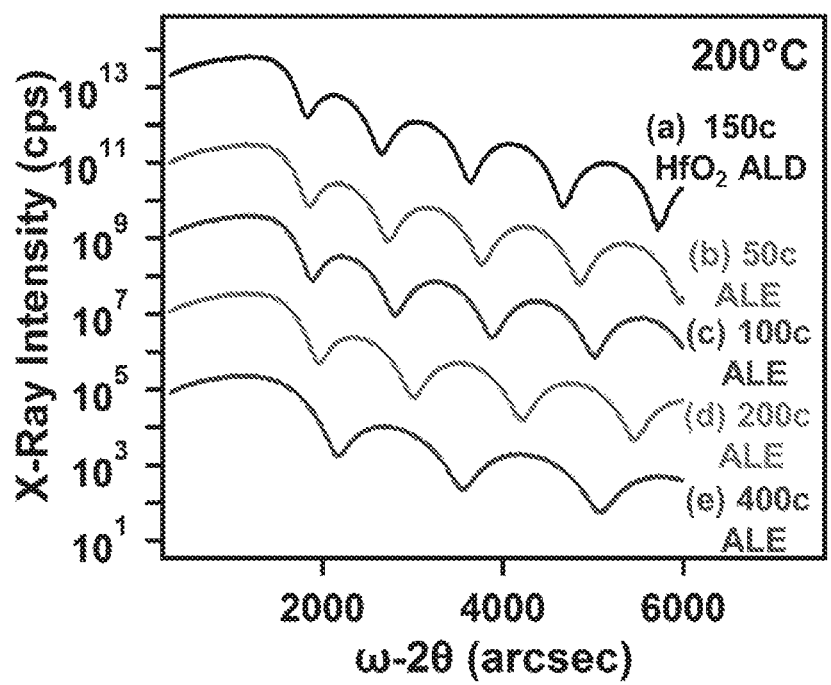
FIG. 21 is a graph illustrating X-ray reflectivity scans showing x-ray intensity versus incident angle for HfO$_2$ films on Si(100). (a) Initial HfO$_2$ film grown using 150 HfO$_2$ ALD cycles; and HfO$_2$ films after various numbers of HfO$_2$ ALE cycles using Sn(acac)$_2$ and HF: (b) 50 cycles, (c) 100 cycles, (d) 200 cycles and (e) 400 cycles.

FIG. 21 is a graph illustrating X-ray reflectivity scans showing x-ray intensity versus incident angle for HfO$_2$ films on Si(100). Initial HfO$_2$ films were grown using 150 HfO$_2$ ALD cycles. FIG. 21, curve (a), illustrates the XRR scan of the initial HfO$_2$ ALD film grown on Si(100). The HfO$_2$ ALD film thickness of 144 Å can be obtained by fitting the reflected x-ray intensity versus incident angle. FIG. 21, curves (b)-(e), illustrates XRR scans of the etched HfO$_2$ film after 50, 100, 200, and 400 ALE cycles at 200° C., respectively. The HfO$_2$ thicknesses decreased with increasing number of ALE cycles. This decreasing film thickness was in agreement with the decrease in the modulation of the x-ray intensity versus incident angle with higher numbers of ALE cycles.

The position of the critical angle of all the etched HfO$_2$ films was constant.

This constant critical angle indicates that there was no change of the film density during the ALE reactions. The etched HfO$_2$ films were also very smooth and did not roughen versus HfO$_2$ ALE. The XRR measurements yielded a roughness of the initial HfO$_2$ ALD film of 6 Å. The surface roughness decreased slightly to 3-4 Å after 50, 100, 200, and 400 ALE cycles. The error in these XRR surface roughness measurements is ≤1 Å.

Figure 22:
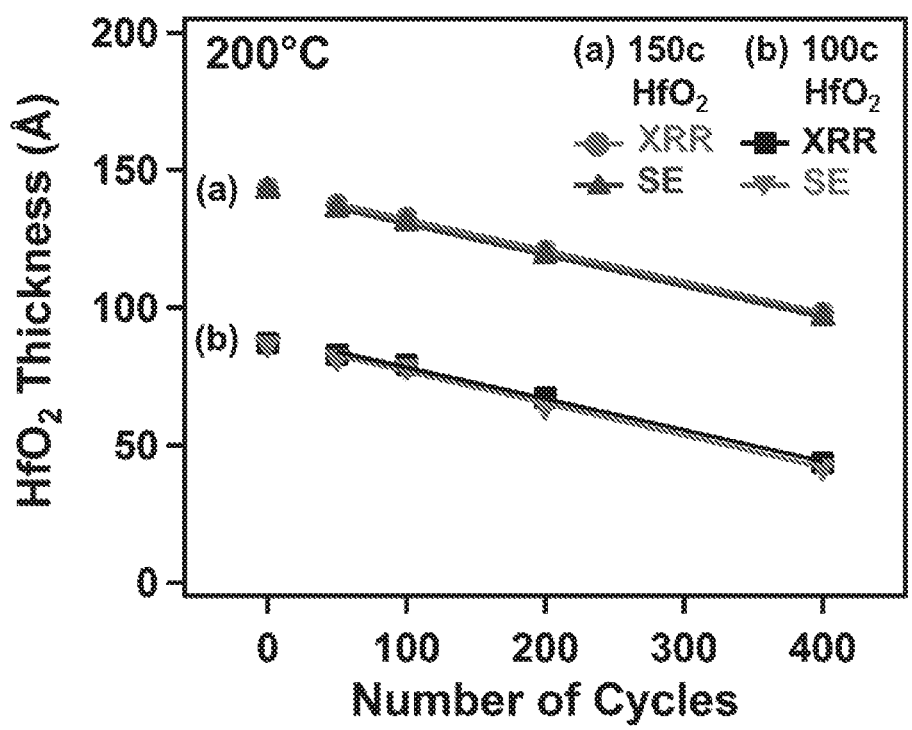
FIG. 22 is a graph illustrating X-ray reflectivity and spectroscopic ellipsometry measurements of HfO$_2$ film thickness versus number of HfO$_2$ ALE cycles using Sn(acac)$_2$ and HF for initial HfO$_2$ ALD films grown using (a) 150 HfO$_2$ ALD cycles and (b) 100 HfO$_2$ ALD cycles.

FIG. 22 is a graph illustrating X-ray reflectivity and spectroscopic ellipsometry measurements of HfO$_2$ film thickness versus number of HfO$_2$ ALE cycles for initial HfO$_2$ ALD films grown using (a) 150 HfO$_2$ ALD cycles and (b) 100 HfO$_2$ ALD cycles. For the HfO$_2$ films with an initial thickness of 144 Å grown using 150 HfO$_2$ ALD cycles in FIG. 22, curve (a), the film thickness versus number of ALE cycles was very linear and yielded an etch rate of 0.11 Å/cycle. The spectroscopic ellipsometry (SE) measurements on these same samples yielded an etch rate of 0.11 Å/cycle with an initial HfO$_2$ ALD film thickness of 143 Å. The initial thickness of the HfO$_2$ film was not used to obtain the etch rate because of the mass gain that occurs on the first ALE cycle.

XRR measurements were also performed on HfO$_2$ ALD films with a thickness of 87 Å that were grown on Si(100) wafers. These HfO$_2$ ALD films were deposited at 200° C. using 100 cycles of TDMAH and H$_2$O with a reaction sequence of 1-20-1-20. FIG. 20, curve (b), displays the film thickness versus number of Sn(acac)$_2$ and HF reaction cycles at 200° C. The XRR measurements yielded an HfO$_2$ ALE etch rate of 0.11 Å/cycle. The SE measurements also yielded an etch rate of 0.12 Å/cycle with an initial HfO$_2$ ALD film thickness of 87 Å. The initial thickness of the HfO$_2$ film was again not employed to determine the etch rate because of the mass gain that occurs on the first ALE cycle.

Figure 23:
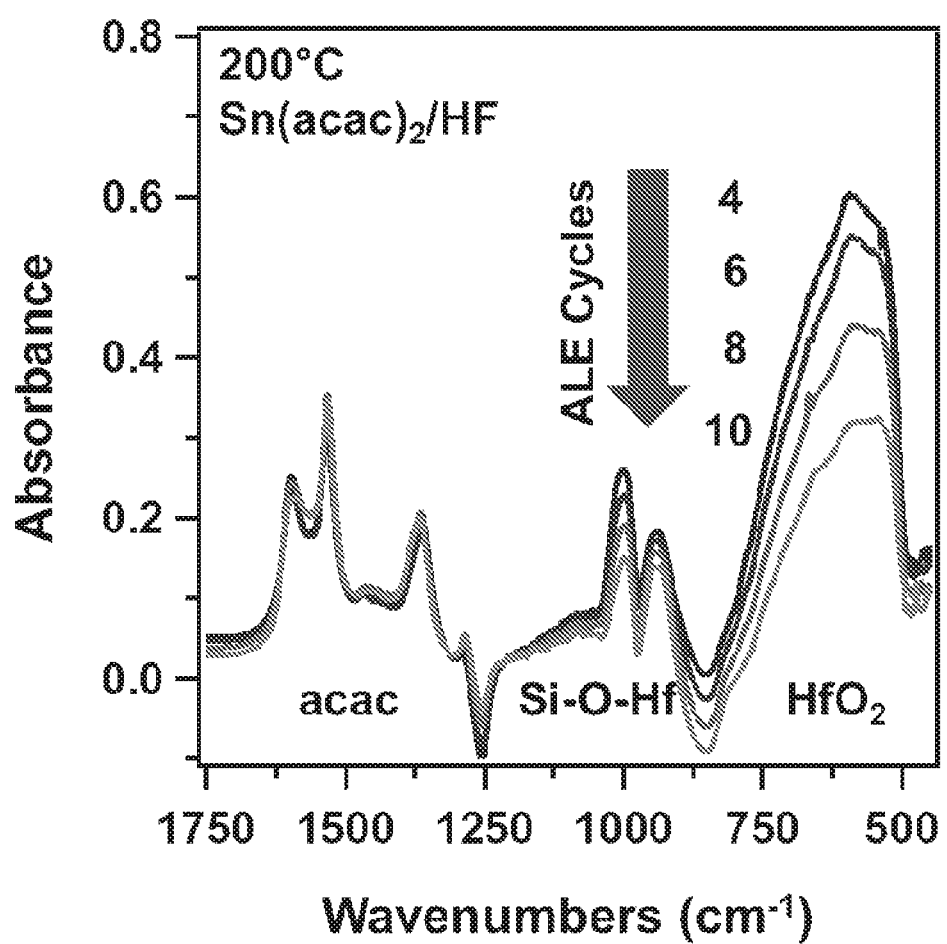
FIG. 23 is a graph illustrating the absolute infrared absorbance recorded using FTIR spectroscopy for the Hf—O vibration in an HfO$_2$ film on SiO$_2$ particles versus number of HfO$_2$ ALE cycles using Sn(acac)$_2$ and HF at 200° C.

FIG. 23 is a graph illustrating the absolute infrared absorbance recorded using FTIR spectroscopy for the Hf—O vibration at ~625 cm$^{-1}$ in an HfO$_2$ film on SiO$_2$ particles versus number of HfO$_2$ ALE cycles at 200° C. Vibrational features for hafnium silicate (Si—O—Hf) also appeared at ~1000 cm$^{-1}$. The initial HfO$_2$ film was grown using HfO$_2$ atomic layer deposition (ALD). These spectra are referenced to the SiO$_2$ particles used as the substrate. During HfO$_2$ ALE, absorbance is progressively lost from the peak at ~625 cm$^{-1}$ corresponding to the Hf—O vibration in HfO$_2$. In addition, the absorbance was observed from acac surface species at 1,350-1,650 cm$^{-1}$. This absorbance decrease was consistent with the progressive loss of HfO$_2$ resulting from HfO$_2$ ALE.

Figure 24:
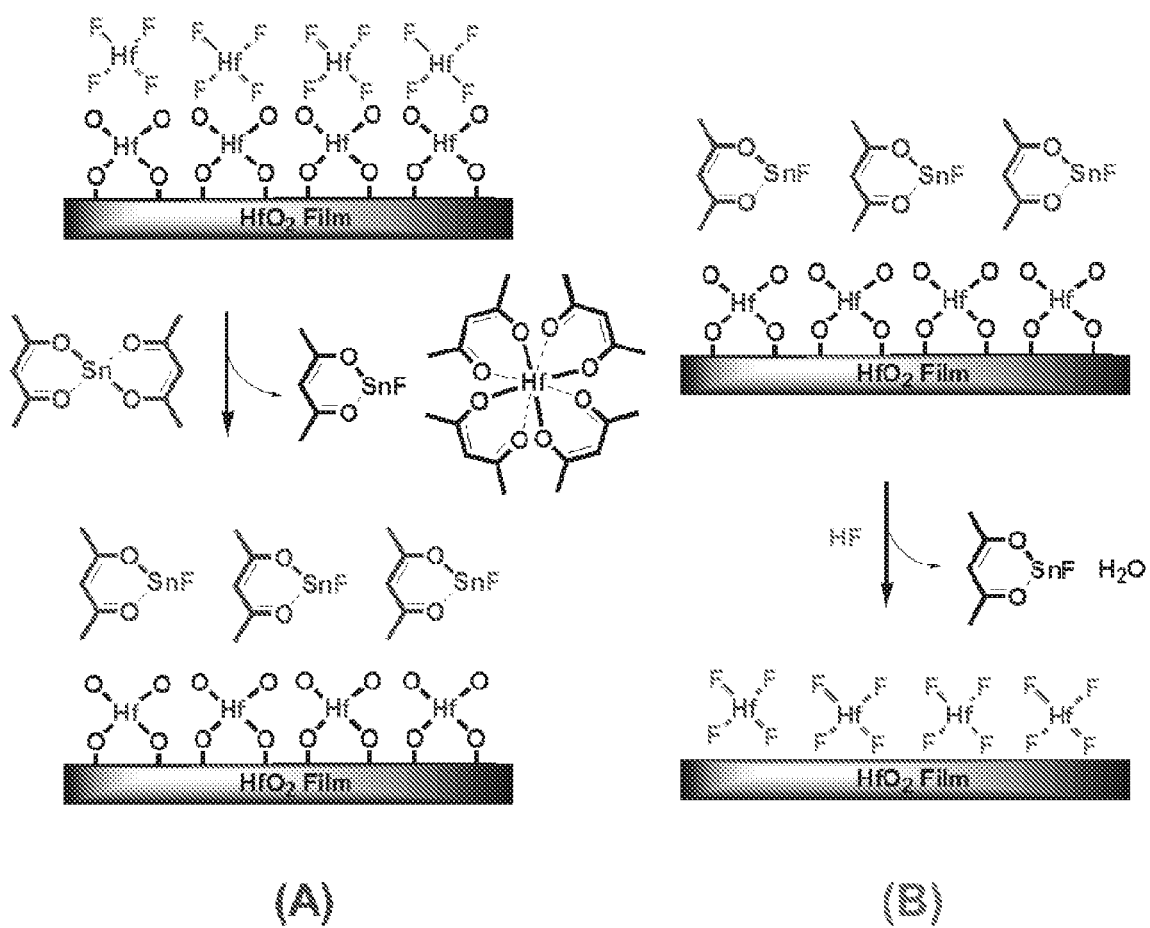
FIG. 24 is a schematic of the proposed reaction mechanism for HfO$_2$ ALE showing (A) Sn(acac)$_2$ reaction and (B) HF reaction.

FIG. 24 is a schematic of the non-limiting proposed reaction mechanism for HfO$_2$ ALE showing (A) Sn(acac)$_2$ reaction and (B) HF reaction. This mechanism is based on the mass changes during the Sn(acac)$_2$ and HF exposures as determined by the QCM measurements and the analysis of the surface species by the FTIR studies. During the Sn(acac)$_2$ reaction (A), the Sn(acac)$_2$ reacts with the HfF$_4$ layer on the HfO$_2$ substrate. This HfF$_4$ layer is formed from the reaction of HfF$_4$ with Sn(acac)$_2$ and HF after several ALE reactions on the initial HfF$_4$ surface. The Sn(acac)$_2$ reacts with the HfF$_4$ layer to form volatile SnF(acac) and Hf(acac)$_4$ reaction products and SnF(acac)* surface species. After the HfF$_4$ layer is lost resulting from Hf(acac)$_4$ and SnF(acac) product formation, there may be a strong interaction between SnF(acac)* surface species and the underlying HfO$_2$ substrate. This interaction may lead to SnF(acac)* species adsorbed to the HfO$_2$ substrate.

During the HF reaction (B), HF reacts with the underlying HfO$_2$ surface to form a new layer of HfF$_4$ molecules comprising the HfF$_4$ adlayer. The formation of the HfF$_4$ layer also leads to the removal of the SnF(acac)* species. In addition, HF also provides hydrogen to form H$_2$O as a reaction product. This reaction removes the oxygen in HfO$_2$. The HfF$_4$ layer is then ready for the next Sn(acac)$_2$ reaction.

This overall proposed reaction can be expressed as:

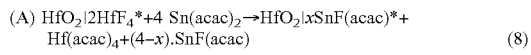
(A) HfO$_2$|2HfF$_4$*+4 Sn(acac)$_2$→HfO$_2$|xSnF(acac)*+ Hf(acac)$_4$+(4−x).SnF(acac)  (8)

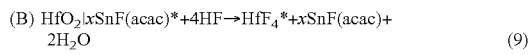
(B) HfO$_2$|xSnF(acac)*+4HF→HfF$_4$*+xSnF(acac)+ 2H$_2$O  (9)

The HfO$_2$ shown in Equations 8 and 9 is the amount of HfO$_2$ that is etched during the ALE reactions. The asterisks indicate the surface species and the vertical lines are used to separate the various surface species. x is a parameter determined by the relative $\Delta M_{Sn}$ and $\Delta M_{HF}$ mass changes. To obtain agreement with the relative $\Delta M_{Sn}$ and $\Delta M_{HF}$ mass changes in Table 3, x=1.3, 1.0, 0.69, 0.70, and 0.71 at 150° C., 175° C., 200° C., 225° C. and 250° C., respectively.

Without wishing to be limited by any theory, the temperature dependence of $\Delta M_{Sn}$ and $\Delta M_{HF}$ may be dependent on the amount of SnF(acac)* surface species remaining after the Sn(acac)$_2$ exposure. The mass gain after Sn(acac)$_2$ exposure and larger mass loss after HF exposure at 150° C. can be explained by the SnF(acac)* surface species. More SnF(acac)* surface species remain after reaction A at 150° C. Subsequently, more SnF(acac)* surface species are lost in reaction B at 150° C.

Example 3

Figure 25:
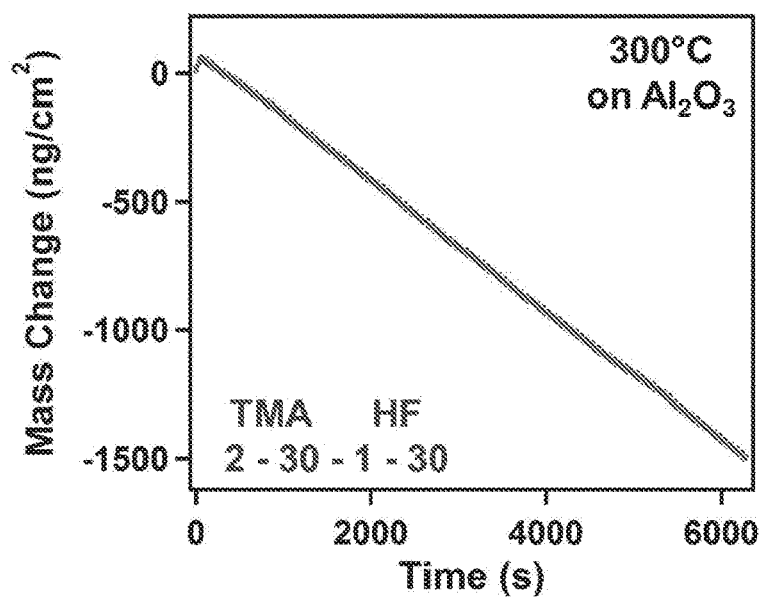
FIG. 25 is a graph illustrating the quartz crystal microbalance results of 100 cycles of Al$_2$O$_3$ ALE using TMA and HF as the reactants at 300° C. The mass change per cycle (MCPC) was −15.9 ng/(cm$^2$ cycle)

In certain aspects, this example illustrates Al$_2$O$_3$ ALE using Al(CH$_3$)$_3$ and HF as the reactants. FIG. 25 illustrates the mass change during 100 ALE cycles of Al(CH$_3$)$_3$ and HF reactions on an Al$_2$O$_3$ surface at 300° C. The initial Al$_2$O$_3$ ALD film on the QCM surface was prepared by 200 cycles of Al$_2$O$_3$ ALD using Al(CH$_3$)$_3$ and H$_2$O at 300° C. One ALE cycle consisted of a Al(CH$_3$)$_3$ dose of 2 s, a N$_2$ purge of 30 s, a HF dose of 1.0 s, and a second N$_2$ purge of 30 s. This reaction sequence is denoted as 2-30-1-30. Pressure transients during Al(CH$_3$)$_3$ and HF doses were 40 mTorr and 80 mTorr, respectively.

The etching of the Al$_2$O$_3$ film in FIG. 25 was linear and displayed a mass change per cycle (MCPC) of −15.9 ng/(cm$^2$ cycle). This MCPC corresponds to an etch rate of 0.51 Å/cycle based on the Al$_2$O$_3$ ALD film density of 3.1 g/cm$^3$ grown at 300° C. measured by XRR. All ALE cycles showed mass loss resulting from the etching of the Al$_2$O$_3$ film except during the first ALE cycle. The first cycle displays mass gains of $\Delta M_{Al(CH3)3}$=+32 ng/cm$^2$ and $\Delta M_{HF}$=+33 ng/cm$^2$.

Without wishing to be limited by any theory, the mass gain for $\Delta M_{TMA}$ on the first cycle may be attributed to Al(CH$_3$)$_3$ adsorption on the hydroxylated Al$_2$O$_3$ surface. Al(CH$_3$)$_3$ could adsorb by reacting with a hydroxyl group according to Al(CH$_3$)$_3$+Al-OH*→AlO—Al(CH$_3$)$_2$*+CH$_4$, where the asterisks designate a surface species. This adsorption would lead to a mass increase. In addition, the mass gain for $\Delta M_{HF}$ on the first cycle may be attributed to the fluorination of the Al(CH$_3$)$_2$* surface species and the underlying Al$_2$O$_3$ surface. The reaction Al$_2$O$_3$+6HF→2AlF$_3$+3H$_2$O is spontaneous with $\Delta G$=−49 kcal at 300° C. This first cycle establishes the initial AlF$_3$ species on the Al$_2$O$_3$ substrate.

Figure 26:
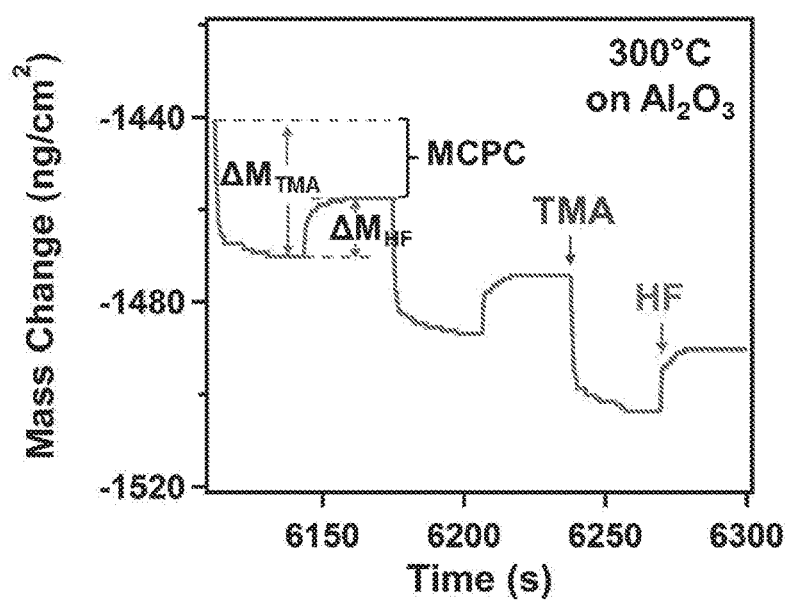
FIG. 26 is a graph illustrating an expansion of FIG. 25 in the steady state region showing three Al$_2$O$_3$ ALE cycles. The mass change after the TMA exposure was −29.0 ng/(cm$^2$ cycle). The mass change after the HF exposure was +13.1 ng/(cm$^2$ cycle).

FIG. 26 corresponds to an enlargement of the mass losses versus time at 300° C. for three cycles in the steady state linear etching regime in FIG. 25. There was a pronounced mass decrease of $\Delta M_{TMA}$=−29.0 ng/cm$^2$ coinciding with the Al(CH$_3$)$_3$ exposure. Without wishing to be limited by any theory, this behavior suggests Al(CH$_3$)$_3$ leads to significant mass loss from removal of reaction products. A possible etching reaction is AlF$_3$+2Al(CH$_3$)$_3$→3AlF(CH$_3$)$_2$ where AlF(CH$_3$)$_2$ is a volatile reaction product. FIG. 26 also shows that a mass gain of $\Delta M_{HF}$=+13.1 ng/cm$^2$ was observed after 1.0 s of HF exposure. This HF exposure reforms the AlF$_3$ surface layer on the Al$_2$O$_3$ substrate through the reaction Al$_2$O$_3$+6HF→2AlF$_3$+3H$_2$O.

Figure 27:
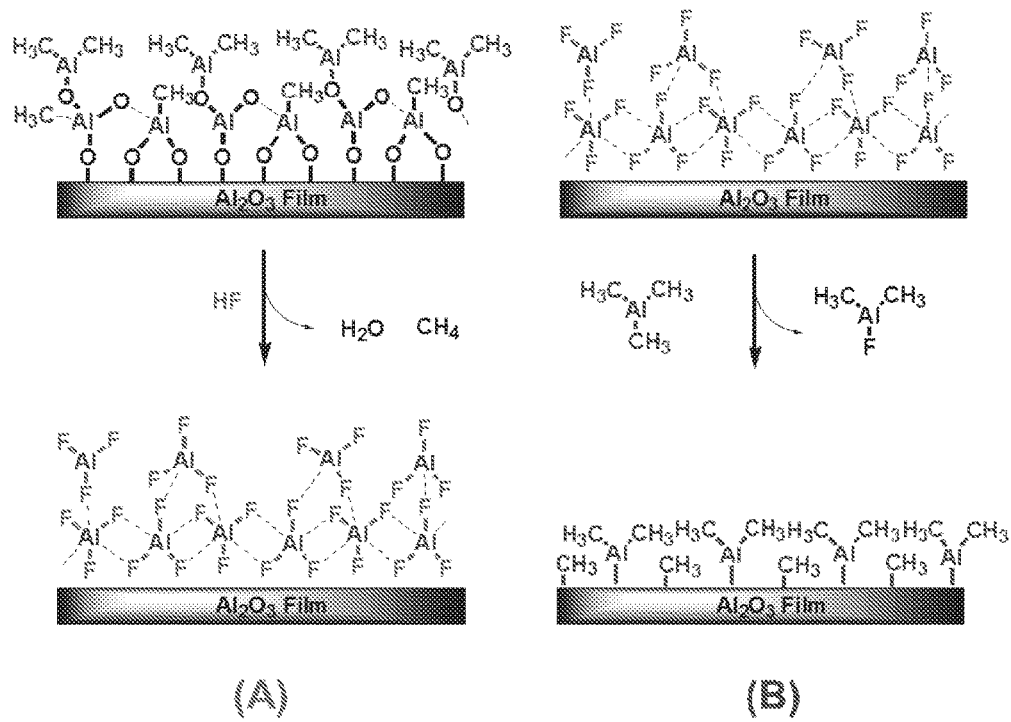
FIG. 27 is a schematic illustration of Al$_2$O$_3$ ALE using TMA and HF.

FIG. 27 displays a schematic of the non-limiting proposed reaction mechanism for Al$_2$O$_3$ ALE showing (A) HF reaction and (B) Al(CH$_3$)$_3$ reaction. During the HF reaction (A), HF reacts with the underlying Al$_2$O$_3$ surface to form a new layer of AlF$_3$ molecules comprising the AlF$_3$ adlayer. HF also reacts with the AlCH$_3$* surface species to form additional AlF$_3$ and the CH$_4$ reaction product. In addition, HF also provides hydrogen to form H$_2$O as a reaction product. This reaction removes the oxygen in Al$_2$O$_3$. The AlF$_3$ layer is then ready for the next Al(CH$_3$)$_3$ reaction.

During the Al(CH$_3$)$_3$ reaction (B), the Al(CH$_3$)$_3$ reacts with the AlF$_3$ layer on the Al$_2$O$_3$ substrate to form volatile AlF(CH$_3$)$_2$ reaction products and AlCH$_3$* surface species. AlF(CH$_3$)$_2$ has a vapor pressure of 80 Torr at 100° C. After the AlF$_3$ layer is removed by AlF(CH$_3$)$_2$ product formation, there may be a strong interaction between AlF$_2$(CH$_3$) and the underlying Al$_2$O$_3$ substrate. This interaction may lead to AlF$_2$(CH$_3$)* species adsorbed to the underlying Al$_2$O$_3$ substrate. Additional Al(CH$_3$)$_3$ exposure can lead to removal of the AlF$_2$(CH$_3$)* species by the reaction of Al(CH$_3$)$_3$+AlF$_2$(CH$_3$)*2AlF(CH$_3$)$_2$. Al(CH$_3$)$_3$ can also react with the underlying Al$_2$O$_3$ surface to form Al(CH$_3$)*.

The simplest overall proposed reaction for Al$_2$O$_3$ ALE using TMA and HF is:

$$Al_2O_3 + 6HF + 4Al(CH_3)_3 \rightarrow 6AlF(CH_3)_2 + 3H_2O \quad (10)$$

This overall reaction can be divided into the HF and TMA reactions:

(A) Al$_2$O$_3$|Al$_2$O$_3$*+6HF→Al$_2$O$_3$|2AlF$_3$*+3H$_2$O (11)

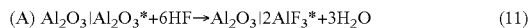

(B) Al$_2$O$_3$|2AlF$_3$*+4Al(CH$_3$)$_3$→Al$_2$O$_3$*+6AlF(CH$_3$)$_2$ (12)

The asterisks indicate the surface species and the vertical lines are used to separate the various surface species. The Al$_2$O$_3$ shown in Equations 11 and 12 is the amount of Al$_2$O$_3$ that is etched during the ALE reactions.

The reaction described by Equations 10-12 is incomplete because Al$_2$O$_3$ is also reactive to Al(CH$_3$)$_3$. The reaction of TMA with Al$_2$O$_3$ is known to form AlCH$_3$* surface species. This reaction of Al(CH$_3$)$_3$ with Al—O—Al bonds on the Al$_2$O$_3$ surface can be expressed as:

Al—O—Al*+Al(CH$_3$)$_3$→Al—O—Al(CH$_3$)$_2$*+Al(CH$_3$)* (13)

The formation of Al(CH$_3$)$_2$* and Al(CH$_3$)* can simply be regarded as Al(CH$_3$)$_3$* surface species.

To incorporate the formation of AlCH$_3$* surface species during TMA exposure and additional AlF$_3$ formation as well as CH$_4$ formation, the HF and TMA reactions need be modified:

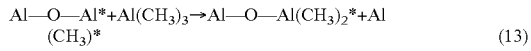

(A) Al$_2$O$_3$|xAl(CH$_3$)$_3$*+(6+3x)HF→2AlF$_3$|xAlF$_3$*+ 3H$_2$O+$_3$xCH$_4$ (14)

(B) 2AlF$_3$|xAlF$_3$*+(4+3x)Al(CH$_3$)$_3$→xAl(CH$_3$)$_3$*+ (6+3x)AlF(CH$_3$)$_2$ (15)

The overall proposed reaction can then be expressed as:

Al$_2$O$_3$+(6+3x)HF+(4+3x)Al(CH$_3$)$_3$→(6+3x)AlF(CH$_3$)$_2$+ 3H$_2$O+$_3$xCH$_4$ (16)

The asterisks indicate the surface species and the vertical lines are used to separate the various surface species.

FIG. 28 shows the general fluorination and ligand exchange processes occurring during metal oxide ALE. In one step, fluorination of a metal oxide surface is performed using fluorine precursors, such as HF, to form a metal fluoride layer and H$_2$O. In the second step, a metal precursor, such as Sn(acac)$_2$ or Al(CH$_3$)$_3$, accepts fluorine and donates a ligand to the metal in the metal fluoride. This ligand exchange process forms volatile reaction products that remove the metal fluoride layer.

Example 4

Figure 29:
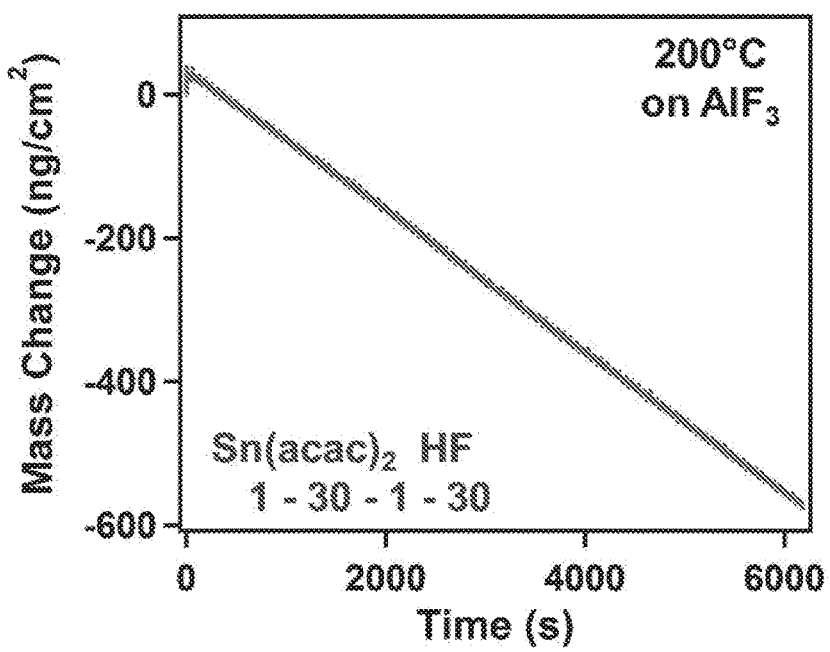
FIG. 29 is a graph showing the mass change versus time for AlF$_3$ ALE using sequential Sn(acac)$_2$ and HF exposures at 200° C. The mass change per cycle (MCPC) was −6.1 ng/(cm$^2$ cycle).

In certain aspects, this example illustrates AlF$_3$ ALE using Sn(acac)$_2$ and HF as the reactants. FIG. 29 illustrates the mass change during 100 ALE cycles of Sn(acac)$_2$ and HF reactions on an AlF$_3$ surface at 200° C. The initial AlF$_3$ ALD film on the QCM surface was prepared by 100 cycles of AlF$_3$ ALD using Al(CH$_3$)$_3$ and HF. One ALE cycle consisted of a Sn(acac)$_2$ dose of 1 s, a N$_2$ purge of 30 s, a HF dose of 1.0 s, and a second N$_2$ purge of 30 s. This reaction sequence is denoted as 1-30-1-30. Pressure transients during Sn(acac)$_2$ and HF doses were 20 mTorr and 80 mTorr, respectively.

The etching of the AlF$_3$ film in FIG. 29 was linear and displayed a mass change per cycle (MCPC) of −6.1 ng/(cm$^2$ cycle). This MCPC corresponds to an etch rate of 0.21 Å/cycle based on the AlF$_3$ ALD film density of 2.9 g/cm$^3$ measured by XRR. All ALE cycles showed mass loss resulting from the etching of the AlF$_3$ film except during the first ALE cycle. The first cycle displays a mass gain of $\Delta M_{Sn}$=+28 ng/cm$^2$ and a mass loss of $\Delta M_{HF}$=−8 ng/cm$^2$.

Figure 30:
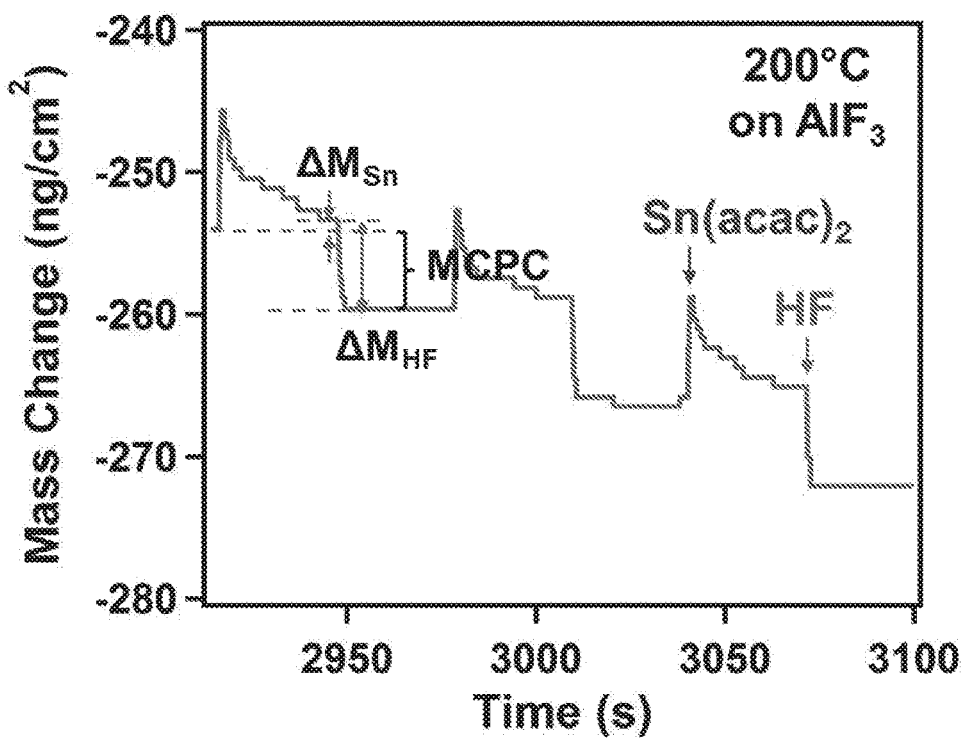
FIG. 30 is a graph illustrating an expansion of the linear region of FIG. 29. This expansion highlights the individual mass changes during the sequential Sn(acac)$_2$ and HF exposures at 200° C.

FIG. 30 corresponds to an enlargement of the mass losses versus time at 200° C. for three cycles in the steady state linear etching regime in FIG. 29. There was a slight mass increase of $\Delta M_{Sn}$=+0.8 ng/cm$^2$ coinciding with the Sn(acac)$_2$ exposure. FIG. 30 also shows that a mass loss of $\Delta M_{HF}$=−6.9 ng/cm$^2$ was observed after 1.0 s of HF exposure. Because the AlF$_3$ film is already a metal fluoride, HF is not needed to form a metal fluoride. However, HF does lead to the mass loss during the Sn(acac)$_2$ and HF exposures. This behavior can be explained by the buildup of heavy acac-containing species on the AlF$_3$ surface during the Sn(acac)$_2$ exposure. The HF then is able to remove these acac-containing species and produce an overall mass loss.

Figure 31:
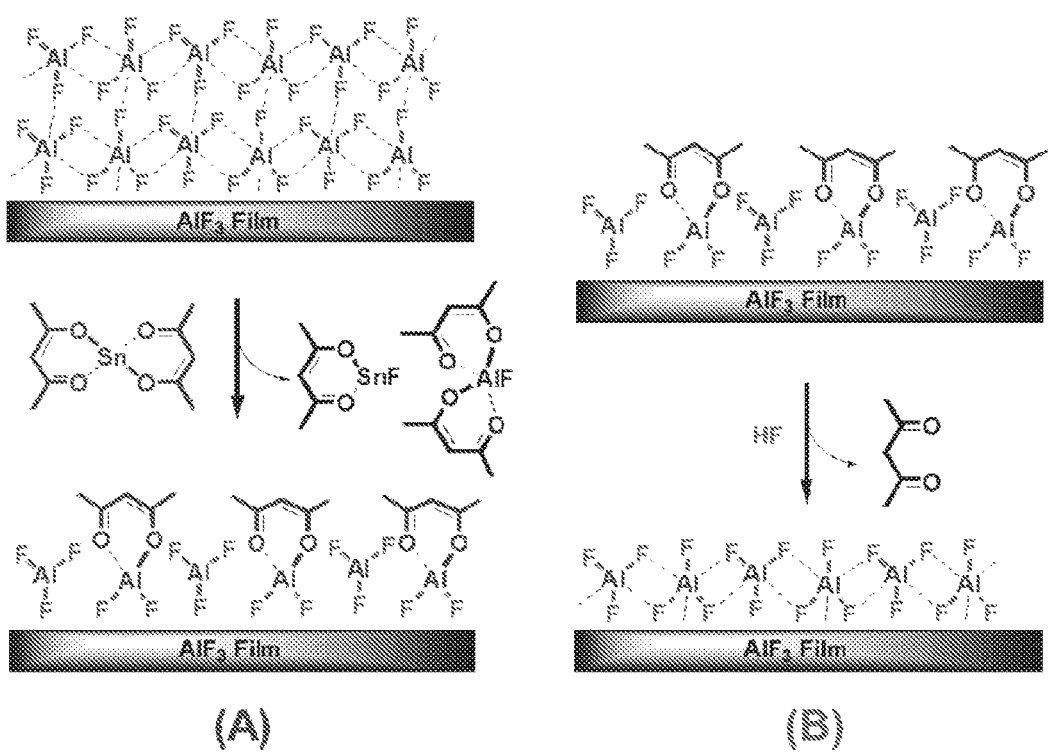
FIG. 31 is a schematic of proposed reaction mechanism for AlF$_3$ ALE showing the (A) Sn(acac)$_2$ reaction and (B) HF reaction.

To illustrate the proposed mechanism for AlF$_3$ ALE, FIG. 31 displays a schematic of the non-limiting proposed reaction mechanism for AlF$_3$ ALE showing (A) Sn(acac)$_2$ reaction and (B) HF reaction. During the Sn(acac)$_2$ reaction (A), the Sn(acac)$_2$ reacts with an AlF$_3$ layer on the AlF$_3$ substrate to form volatile SnF(acac) and AlF(acac)$_2$ reaction products and AlF(acac)$_2$* surface species. During the HF reaction (B), HF reacts with the AlF(acac)$_2$* species on the AlF$_3$ substrate to remove the acac-containing species. The AlF$_3$ layer is then ready for the next Sn(acac)$_2$ reaction.

Additional comparative experiments were performed using TMA and HF exposures on the AlF$_3$ film at temperatures >250° C. These experiments revealed that TMA continuously etched the AlF$_3$ film. The etching of the AlF$_3$ film by TMA was not self-limiting.

Example 5

Thermal ALE consists of (A) fluorination and (B) ligand-exchange reactions with metal precursors. In certain aspects, this example illustrates the selectivity of ALE using different metal precursors for the ligand-exchange reaction. Hydrogen fluoride (HF) was used for fluorination source. The metal precursors for the ligand-exchange reaction were tin(II) acetylacetonate (Sn(acac)$_2$), trimethylaluminum (TMA), and dimethylaluminum chloride (DMAC). Various thin films including Al$_2$O$_3$, HfO$_2$, ZrO$_2$, SiO$_2$, Si$_3$N$_4$, and TiN on Si wafers were tested to observe the selectivity of the ALE.

Figure 32A:
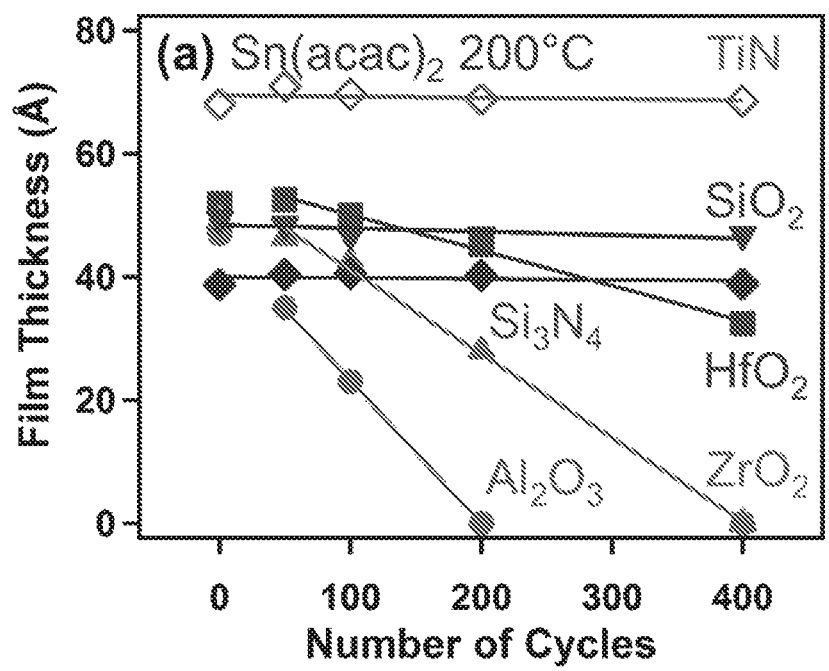
FIG. 32A-32B are a set of graphs showing (FIG. 32A) the film thickness versus number of Sn(acac)$_2$ and HF exposures at 200° C. for a variety of materials including TiN, SiO$_2$, Si$_3$N$_4$, HfO$_2$, ZrO$_2$ and Al$_2$O$_3$ and (FIG. 32B) the etch rates for HfO$_2$, ZrO$_2$ and Al$_2$O$_3$.
Figure 32B:
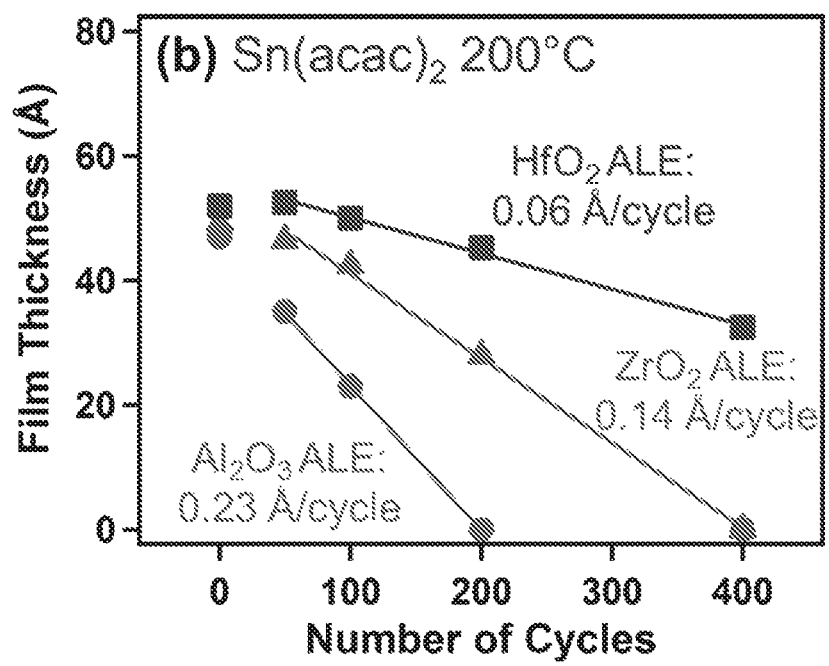

The thermal ALE was examined using ex situ spectroscopic ellipsometry (SE) studies. The initial films had a thickness of ~50 Å (39-68 Å). FIG. 32A illustrates the SE measurements after 50, 100, 200 and 400 ALE cycles using Sn(acac)$_2$ and HF at 200° C. There were negligible thickness changes for the SiO$_2$, Si$_3$N$_4$, and TiN films. In contrast, the Al$_2$O$_3$, HfO$_2$, and ZrO$_2$ films were etched linearly versus number of ALE cycles. FIG. 32B illustrates the film thickness versus number of ALE cycles for the Al$_2$O$_3$, HfO$_2$, and $ZrO_2$ films. The slopes of linear least squares fittings in FIG. 32B yield the etch rates of 0.23 Å/cycle, 0.06 Å/cycle, and 0.14 Å/cycle for $Al_2O_3$ and $HfO_2$, and $ZrO_2$ films, respectively.

Figure 33A:
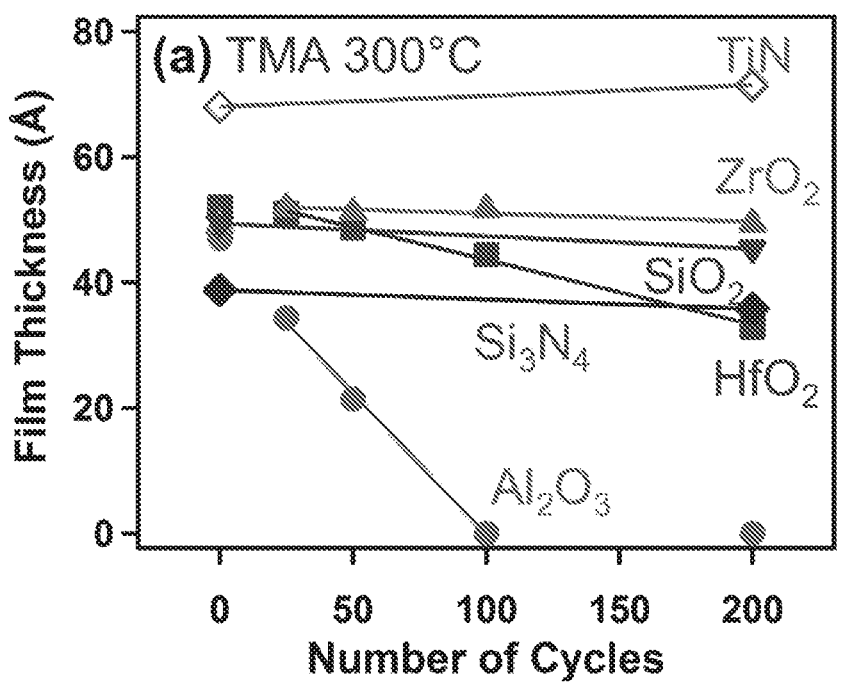
FIG. 33A-33B are a set of graphs showing (FIG. 33A) the film thickness versus number of Al(CH$_3$)$_3$ (trimethylaluminum or TMA) and HF exposures at 300° C. for a variety of materials including TiN, SiO$_2$, Si$_3$N$_4$, HfO$_2$, ZrO$_2$ and Al$_2$O$_3$ and (FIG. 33B) the etch rates for HfO$_2$, ZrO$_2$ and Al$_2$O$_3$.
Figure 33B:
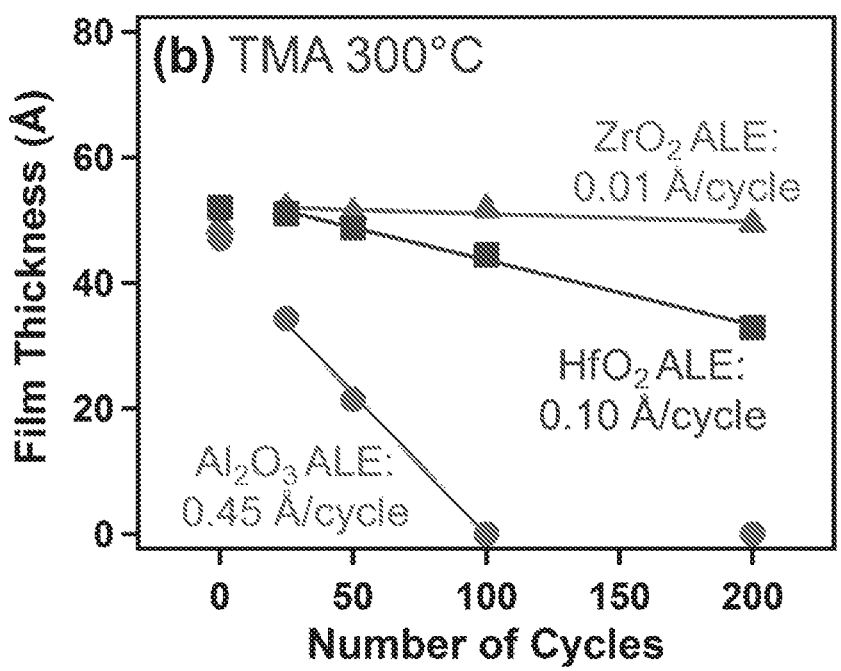

FIG. 33A illustrates the SE measurements after 25, 50, 100, and 200 ALE cycles using TMA and HF at 300° C. There are negligible thickness changes during 200 ALE cycles for the $ZrO_2$, $SiO_2$, $Si_3N_4$, and TiN films. In contrast, the $Al_2O_3$ and $HfO_2$ films were etched linearly versus number of ALE cycles. FIG. 33B illustrates the film thickness versus number of ALE cycles for $Al_2O_3$, $HfO_2$, and $ZrO_2$ films. The slopes of linear least squares fittings in FIG. 33B yield etch rates of 0.45 Å/cycle and 0.10 Å/cycle for $Al_2O_3$ and $HfO_2$ films respectively. A negligible etch rate of 0.01 Å/cycle was determined for $ZrO_2$ film.

Figure 34A:
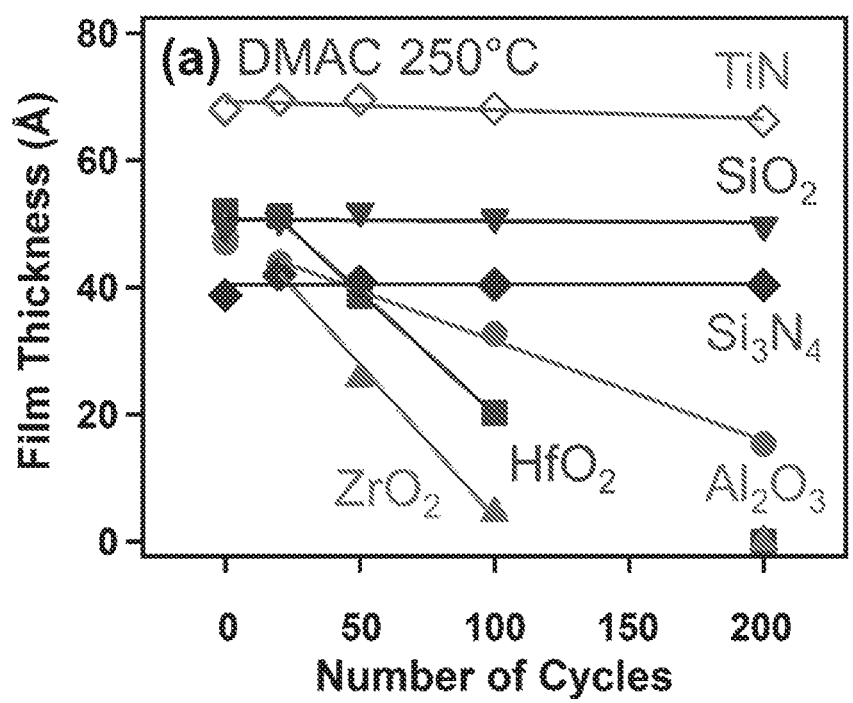
FIG. 34A-34B are a set of graphs showing (FIG. 34A) the film thickness versus number of AlCl(CH$_3$)$_2$ (dimethylaluminum chloride or DMAC) and HF exposures at 250° C. for a variety of materials including TiN, SiO$_2$, Si$_3$N$_4$, HfO$_2$, ZrO$_2$ and Al$_2$O$_3$ and (FIG. 34B) the etch rates for HfO$_2$, ZrO$_2$ and Al$_2$O$_3$.
Figure 34B:
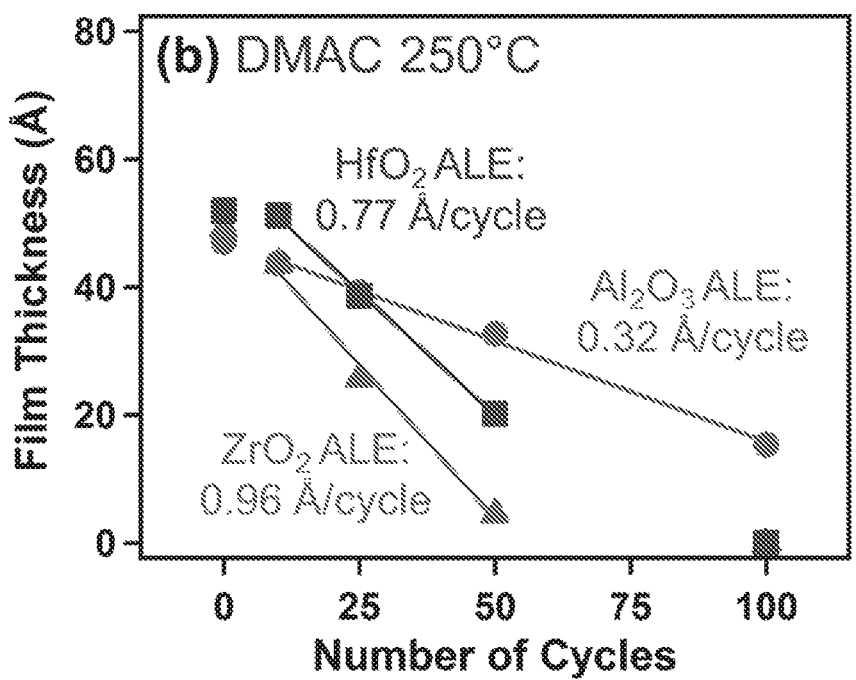

FIG. 34A illustrates the SE measurements after 10, 25, 50, and 100 ALE cycles using DMAC and HF at 250° C. There are negligible thickness changes during 100 ALE cycles for the $SiO_2$, $Si_3N_4$, and TiN films. $Al_2O_3$, $HfO_2$, and $ZrO_2$ films were etched linearly versus the number of ALE cycles. FIG. 34B illustrates the film thickness versus number of ALE cycles for $Al_2O_3$, $HfO_2$, and $ZrO_2$. The slopes of linear least squares fittings in FIG. 34B yield the etch rates of 0.32 Å/cycle, 0.77 Å/cycle, and 0.96 Å/cycle for $Al_2O_3$ and $HfO_2$, and $ZrO_2$ films, respectively.

Additional control experiments on $Al_2O_3$, $HfO_2$, and $ZrO_2$ films were performed to determine if both the fluorination and metal precursors are necessary for the thermal ALE. Experiments using 200 cycles of HF exposures observed negligible thickness changes for $Al_2O_3$, $HfO_2$, and $ZrO_2$ films. In addition, sequential exposures of HF and acetylacetone (acacH, Sigma Aldrich >99%) did not lead to the etching of $Al_2O_3$ at 200° C. Acac-containing species alone without the metal are not sufficient for thermal ALE.

Example 6

Figure 35:
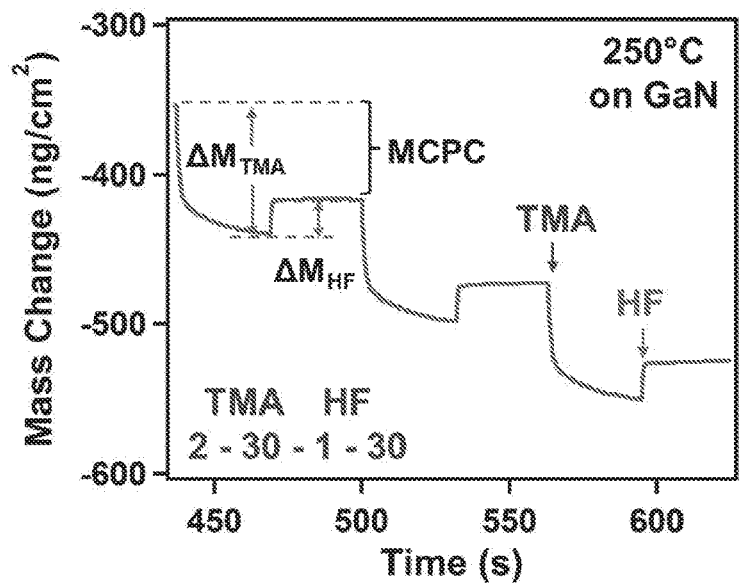
FIG. 35 is a graph illustrating quartz crystal microbalance results for three cycles of GaN ALE using TMA and HF as the reactants at 250° C. The mass change per cycle (MCPC) was −35 ng/(cm$^2$ cycle). The mass change after the TMA exposure was −60 ng/(cm$^2$ cycle). The mass change after the HF exposure was +25 ng/(cm$^2$ cycle).

In certain aspects, this example illustrates GaN ALE using TMA and HF as the reactants. FIG. 35 illustrates the mass change during three ALE cycles using TMA and HF exposures on GaN at 250° C. The initial GaN ALD film on the QCM surface was prepared using 200 cycles of GaN ALD with TDMAG and $NH_3$ as the reactants at 200° C. One ALE cycle consisted of a TMA dose of 2 s, a $N_2$ purge of 30 s, a HF dose of 1.0 s, and a second $N_2$ purge of 30 s. This reaction sequence is denoted as 2-30-1-30. Pressure transients during the TMA and HF doses were 40 mTorr and 80 mTorr, respectively.

The etching of the GaN film in FIG. 35 displays a MCPC=−35 ng/($cm^2$ cycle). This MCPC corresponds to an etch rate of 0.9 Å/cycle based on the GaN ALD film density of 3.9 g/$cm^3$ grown at 200° C. measured by XRR. The HF exposure led to a mass gain of +25 ng/$cm^2$. There was a pronounced mass decrease of $\Delta M_{TMA}$=−60 ng/$cm^2$ coinciding with the $Al(CH_3)_3$ exposure.

Without wishing to be limited by any theory, this behavior suggests the HF exposure fluorinates the GaN substrate by $GaN+3HF \rightarrow GaF_3+NH_3$. The $Al(CH_3)_3$ exposure then leads to significant mass loss from removal of reaction products. A possible etching reaction is $GaF_3+2Al(CH_3)_3 \rightarrow GaF(CH_3)_2+2AlF(CH_3)_2$ where $GaF(CH_3)_2$ and $AlF(CH_3)_2$ are volatile reaction products.

Figure 36:
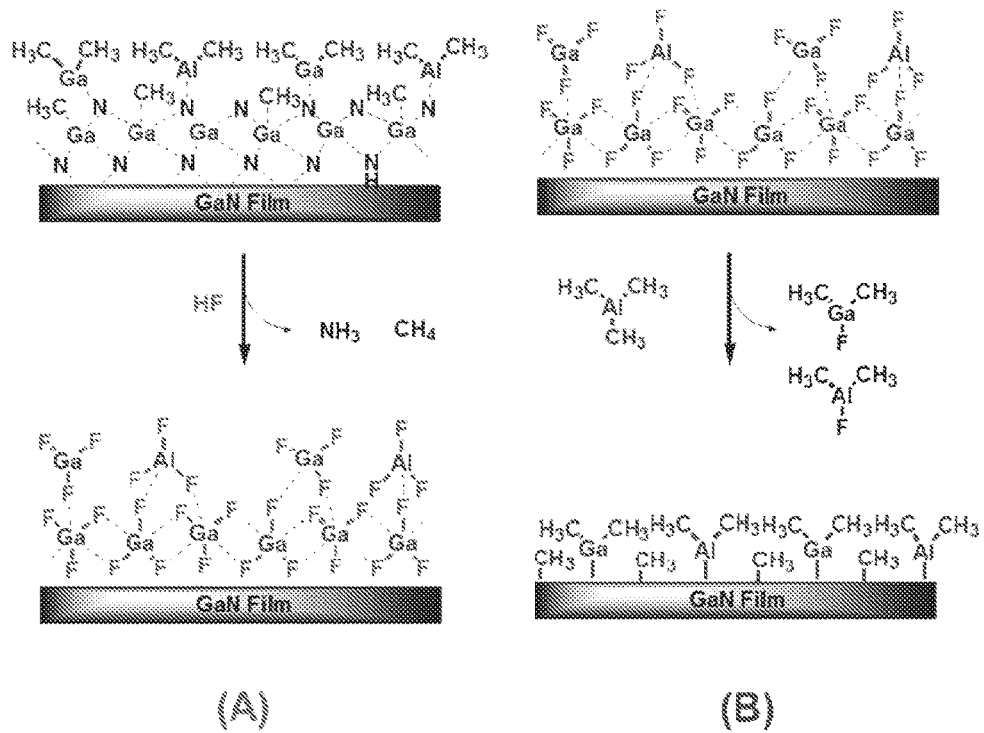
FIG. 36 is a schematic illustration of GaN ALE using TMA and HF.

FIG. 36 illustrates a schematic of the non-limiting proposed reaction mechanism for GaN ALE showing (A) HF reaction and (B) $Al(CH_3)_3$ reaction. During the HF reaction (A), HF reacts with the underlying GaN surface to form a $GaF_3$ adlayer. HF also reacts with the $GaCH_3$* and/or $AlCH_3$* surface species to form additional $GaF_3$* and/or $AlF_3$* and the $CH_4$ reaction product. In addition, HF also provides hydrogen to form $NH_3$ as a reaction product. This reaction removes the nitrogen in GaN. The $GaF_3$ layer and possibly some additional $AlF_3$ species are then ready for the next $Al(CH_3)_3$ reaction.

During the $Al(CH_3)_3$ reaction (B), the $Al(CH_3)_3$ reacts with the $GaF_3$ layer and possibly some additional $AlF_3$ species on the GaN substrate to form volatile $GaF(CH_3)_2$ and $AlF(CH_3)_2$ reaction products and $GaCH_3$* and/or $AlCH_3$* surface species. $AlF(CH_3)_2$ has a vapor pressure of 80 Torr at 100° C. $GaF(CH_3)_2$ is believed to have a similar vapor pressure as $AlF(CH_3)_2$. After the $GaF_3$ layer and the possibly some additional $AlF_3$ layer are removed by GaF$(CH_3)_2$ and $AlF(CH_3)_2$ products formation, there may be a strong interaction between the $GaF_2(CH_3)$* and $AlF_2(CH_3)$* products and the underlying GaN substrate. This interaction may lead to $GaF_2(CH_3)$* and $AlF_2(CH_3)$* species adsorbed to the underlying GaN substrate.

Additional $Al(CH_3)_3$ exposure can lead to removal of the $GaF_2(CH_3)$* and $AlF_2(CH_3)$* surface species. $GaF_2(CH_3)$* can be removed by the reaction of $Al(CH_3)_3$+$GaF_2(CH_3)$*→$AlF(CH_3)_2$+$GaF(CH_3)_2$. $AlF_2(CH_3)$* can be also removed by the reaction of $Al(CH_3)_3$+$AlF_2(CH_3)$*→*$2AlF(CH_3)_3$. $Al(CH_3)_3$ can also react with the underlying GaN surface to form $Ga(CH_3)$* and/or $Al(CH_3)$*.

Example 7

In certain aspects, this example illustrates ZnS ALE using DMAC and HF as the reactants. ZnS ALE was examined using ex situ spectroscopic ellipsometry (SE) studies. These SE experiments revealed that the thickness of a ZnS film was reduced from 505 Å to 477 Å after 50 ALE using DMAC and HF at 250° C. These results are consistent with a ZnS etch rate of 0.56 Å/cycle.

Without wishing to be limited by any theory, these results suggest that fluorination of ZnS occurs through the reaction $ZnS+2HF \rightarrow ZnF_2+H_2S$. This reaction has a favorable reaction enthalpy of $\Delta H$=−8.5 kcal at 250° C. However, the Gibbs free energy is slightly positive at $\Delta G$=+7.4 kcal. After the formation of the $ZnF_2$ layer, $AlCl(CH_3)_2$ then may etch the $ZnF_2$ layer by the reaction $ZnF_2+2AlCl(CH_3)_2 \rightarrow Zn(CH_3)_2+2AlFCl(CH_3)$. $ZnF(CH_3)$ or $ZnCl(CH_3)$ can be an additional possible etch product depending on the volatility of $ZnF(CH_3)$ or $ZnCl(CH_3)$.

Additional comparative experiments were performed using 50 cycles of TMA and HF exposures on the ZnS film at 250° C. The SE measurements monitored an initial ZnS film thickness of 505 Å. However, with the TMA metal precursor, there was a negligible change of the ZnS film thicknesses after 50 ALE cycles. These results reveal selective ALE because DMAC can etch ZnS, but TMA cannot etch ZnS.

Example 8

In certain aspects, this example illustrates ZnO ALE using either DMAC and HF or TMA and HF as the reactants. ZnO ALE was examined using ex situ SE studies. The SE measurements monitored the initial thickness and the change of thicknesses after 50 and 100 ALE cycles using DMAC and HF at 250° C. These experiments employed ZnO films with initial thicknesses of 207 Å and 408 Å. The ZnO thickness of 207 Å was reduced to 128 Å after 50 ALE using DMAC and HF at 250° C. The ZnO thickness of 408 Å was reduced to 345 Å after 50 ALE using DMAC and HF at 250° C. These results are consistent with an etch rate of 1.3-1.6 Å/cycle. In addition, the roughness of the ZnO film was increased slightly after ALE using DMAC and HF.

As a comparative study, ZnO ALE was also examined by SE studies using TMA and HF as the reactants at 250° C. In this case, the thickness of the ZnO film was reduced from 207 Å to 150 Å after 50 ALE cycles. The thickness of the ZnO film was also reduced from 408 Å to 360 Å after 50 ALE using TMA and HF at 250° C. These results are consistent with an etching rate of 1.0-1.1 Å/cycle. The roughness of ZnO film was decreased after ZnO ALE using TMA and HF.

Without wishing to be limited by any theory, these results suggest that ZnO can be fluorinated by the reaction $ZnO+2HF \rightarrow ZnF_2+H_2O$. This reaction has favorable thermochemistry with $\Delta G=-10.1$ kcal at 250° C. DMAC can then etch $ZnF_2$ by the reaction $ZnF_2+AlCl(CH_3)_2 \rightarrow Zn(CH_3)_2+AlClF_2$. $ZnF(CH_3)$ can be an additional possible etch product if $ZnF(CH_3)$ is volatile enough. Likewise, $Al(CH_3)_3$ can also etch $ZnF_2$ by the reaction $ZnF_2+Al(CH_3)_3 \rightarrow Zn(CH_3)_2+AlF_2(CH_3)$. $ZnF(CH_3)$ can be an additional possible etch product if $ZnF(CH_3)$ has high enough volatility. These results indicate that both DMAC and TMA are effective metal precursors for ZnO ALE.

Example 9

In certain aspects, this example illustrates $Ga_2O_3$ ALE and ZnO ALE using TDMAG and HF as the reactants. $Ga_2O_3$ ALE was examined using in situ QCM and ex situ spectroscopic ellipsometry (SE) studies. The QCM studies measured a MCPC=−10 ng/(cm² cycle) at 250° C. This MCPC corresponds to an etch rate of 0.2 Å/cycle based on the $Ga_2O_3$ ALD film density of 4.8 g/cm³ grown at 200° C. measured by XRR. The SE measurements monitored the initial film thickness and the change of film thicknesses after 100 ALE cycles using TDMAG and HF at 250° C. The thickness of the $Ga_2O_3$ film was reduced from 185 Å to 165 Å after 100 ALE using TDMAG & HF at 250° C. In agreement with the QCM results, the $Ga_2O_3$ ALE etch rate was 0.2 Å/cycle.

Without wishing to be limited by any theory, this behavior suggests that the $Ga_2O_3$ substrate is fluorinated through the reaction $Ga_2O_3+6HF \rightarrow 2GaF_3+3H_2O$. This reaction has favorable thermochemistry with $\Delta G=-36.4$ kcal at 250° C. The $Ga[N(CH_3)_2]_3$ metal precursor then may etch the $GaF_3$ layer by the reaction: $GaF_3+2Ga[N(CH_3)_2]_3 \rightarrow 3GaF[N(CH_3)_2]_2$ where $GaF[N(CH_3)_2]_2$ is the volatile reaction product.

Additional comparative experiments using 100 cycles of TDMAG and HF exposures observed negligible thickness changes for $Al_2O_3$, $HfO_2$, $ZrO_2$, $SiO_2$, $Si_3N_4$, and TiN films. These results illustrate the selectivity of $Ga[N(CH_3)_2]_3$ (TDMAG) for the etching of $Ga_2O_3$. Another experiment used 100 cycles of TDMAG and HF exposures and demonstrated the etching of two ZnO films at 250° C. The thickness of one of the ZnO films was reduced from 1231 Å to 1213 Å. The thickness of the other ZnO film was reduced from 207 Å to 189 Å. The etch rate was determined as 0.2-0.3 Å/cycle. These results indicate that the TDMAG metal precursor could selectively etch either $Ga_2O_3$ or ZnO in the presence of $Al_2O_3$, $HfO_2$, $ZrO_2$, $SiO_2$, $Si_3N_4$, or TiN.

The disclosures of each and every patent, patent application, and publication cited herein are hereby incorporated herein by reference in their entirety.

While the invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A method of etching a solid substrate comprising a first metal compound using atomic layer etching (ALE), the method comprising the sequential steps of:
    (a) contacting the solid substrate, wherein the substrate comprises a first metal compound comprising at least one first ligand, with a gaseous second metal precursor, wherein the second metal precursor comprises at least one second ligand selected from the group consisting of monodentate ligands, chelates, and any combinations thereof;
        wherein the at least one second ligand from the second metal precursor is transferred to the first metal, and wherein the at least one first ligand from the first metal compound is transferred to the second metal, whereby a first metal precursor is formed on the substrate;
    (b) contacting the solid substrate formed in step (a) with a halogen-containing gas, whereby a first metal halide is formed; and
    (c) optionally repeating steps (a) and (b) one or more times;
        wherein the monodentate ligand comprises at least one selected from the group consisting of alkyl, hydride, carbonyl, halide, alkoxide, alkylamide, silylamide, and any combinations thereof; and,
    wherein the chelate comprises at least one selected from the group consisting of β-diketonate, amidinate, acetamidinate, β-diketiminate, diamino alkoxide, metallocene and any combinations thereof;
whereby the solid substrate is etched.

2. The method of claim 1, wherein the solid substrate is contained in a single system and is sequentially contacted with the gaseous compound of the second metal in step (a) and the halogen-containing gas in step (b), wherein the solid substrate is purged with an inert gas after at least one of step (a) and step (b).

3. The method of claim 1, wherein at least one selected from the group consisting of step (a) and step (b) is run at a temperature that is equal to or greater than a value ranging from about 100° C. to about 450° C.

4. The method of claim 1, wherein the first metal compound comprises at least one selected from the group consisting of metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and any combinations thereof, wherein before step (a) takes place the elemental metal is converted to the corresponding metal halide.

5. The method of claim 1, wherein the solid substrate is first submitted to a chemical treatment that results in the formation, on at least a portion of the surface of the solid substrate, of a metal compound selected from the group consisting of a metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and any combinations thereof, wherein before step (a) takes place the elemental metal is converted to the corresponding metal halide.

6. The method of claim 1, wherein the first metal comprises at least one selected from the group consisting of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, Sn and any combinations thereof.

7. The method of claim 1, wherein the second metal comprises at least one selected from the group consisting of Sn, Ge, Al, B, Ga, In, Zn, Ni, Pb, Si, Hf, Zr, Ti and any combinations thereof.

8. The method of claim 1, wherein the β-diketonate comprises at least one selected from the group consisting of acac (acetylacetonate), hfac (hexafluoroacetylacetonate), tfac (trifluroacetylacetonate), ttmhd (tetramethylheptanedionate) and any combinations thereof.

9. The method of claim 1, wherein the halogen-containing gas comprises a hydrogen halide.

10. The method of claim 1, wherein the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$ and any combinations thereof.

11. The method of claim 1, wherein the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$, $CF_4$, $CF_2Cl_2$, $CCl_4$, $CF_3Cl$, $C_2F_6$, $CHF_3$ and any combinations thereof, and wherein the halogen-containing gas is ionized in a plasma to produce at least one halogen radical and/or ion.

12. The method of claim 1, wherein the solid substrate is pretreated by sequential contacting with a gaseous second metal precursor, and a halogen-containing gas.

13. The method of claim 1, wherein the solid substrate comprises at least one additional metal compound, and ALE of the first metal compound is selective over ALE of the at least one additional metal compound.

14. The method of claim 1, wherein, before step (a) takes place, the first metal compound is converted to the corresponding metal halide by contacting the first metal compound with a halogen-containing gas.

15. The method of claim 1, wherein step (c) is carried out.

16. The method of claim 1, wherein step (a) and step (b) are carried out at spatially distinct locations.

17. A method of modifying a porous substrate, wherein the porous substrate comprises a first metal compound, the method comprising the sequential steps of:
(a) contacting the porous substrate, wherein the substrate comprises a first metal compound comprising at least one first ligand, with a gaseous second metal precursor, wherein the second metal precursor comprises at least one second ligand selected from the group consisting of monodentate ligands, chelates and any combinations thereof,
wherein the at least one second ligand from the second metal precursor is transferred to the first metal, and wherein the at least one first ligand from the first metal compound is transferred to the second metal, whereby a first metal precursor is formed on the substrate;
(b) contacting the porous substrate formed in step (a) with a halogen-containing gas, whereby a first metal halide is formed; and
(c) optionally repeating steps (a) and (b) one or more times;
wherein the modifying comprises at least one activity selected from the group consisting of:
forming or enlarging pores in the porous substrate;
patterning the solid substrate;
selectively removing a portion of the solid substrate;
smoothing the surface of the solid substrate;
removing at least a fraction of an impurity from the solid substrate, wherein a portion of a surface of the solid substrate has an exposed first metal compound; and
reducing the size of at least one 3D architecture feature on a surface of the solid substrate.

18. The method of claim 17, wherein the modifying comprises patterning the solid substrate, and wherein the surface of the starting solid substrate is at least partially masked, whereby only a portion of the surface of the solid substrate is exposed.

19. The method of claim 17, wherein, before step (a) takes place, the first metal compound is converted to the corresponding metal halide by contacting the first metal compound with a halogen-containing gas.

20. The method of claim 17, wherein step (c) is carried out.

21. The method of claim 17, wherein step (a) and step (b) are carried out at spatially distinct locations.

22. The method of claim 17, wherein the solid substrate is contained in a single system and is sequentially contacted with the gaseous compound of the second metal in step (a) and the halogen-containing gas in step (b), wherein the solid substrate is purged with an inert gas after at least one of step (a) and step (b).

* * * * *